(12) United States Patent
Or-Bach et al.

(10) Patent No.: US 11,158,674 B2
(45) Date of Patent: Oct. 26, 2021

(54) METHOD TO PRODUCE A 3D SEMICONDUCTOR DEVICE AND STRUCTURE

(71) Applicant: Monolithic 3D Inc., Klamath Falls, OR (US)

(72) Inventors: Zvi Or-Bach, Haifa (IL); Deepak C. Sekar, Sunnyvale, CA (US); Brian Cronquist, Klamath Falls, OR (US)

(73) Assignee: MONOLITHIC 3D INC., Klamath Falls, OR (US)

( * ) Notice: Subject to any disclaimer, the term of this patent is extended or adjusted under 35 U.S.C. 154(b) by 0 days.

(21) Appl. No.: 17/121,731

(22) Filed: Dec. 14, 2020

(65) Prior Publication Data

US 2021/0167131 A1 Jun. 3, 2021

Related U.S. Application Data

(63) Continuation-in-part of application No. 17/114,155, filed on Dec. 7, 2020, now Pat. No. 11,018,191,
(Continued)

(51) Int. Cl.
*H01L 21/762* (2006.01)
*H01L 27/24* (2006.01)
(Continued)

(52) U.S. Cl.
CPC ........ *H01L 27/2481* (2013.01); *H01L 21/268* (2013.01); *H01L 21/6835* (2013.01);
(Continued)

(58) Field of Classification Search
CPC ........... H01L 27/2481; H01L 21/76254; H01L 21/268; H01L 27/11551; H01L 27/10802;
(Continued)

(56) References Cited

U.S. PATENT DOCUMENTS 3,007,090 A 10/1961 Rutz
3,819,959 A 6/1974 Chang et al.
(Continued)

FOREIGN PATENT DOCUMENTS

EP 1267594 A2 12/2002
WO PCT/US2008/063483 5/2008

OTHER PUBLICATIONS

Colinge, J. P., et al., "Nanowire transistors without Junctions", Nature Nanotechnology, Feb. 21, 2010, pp. 1-5.
(Continued)

*Primary Examiner* — Selim U Ahmed
(74) *Attorney, Agent, or Firm* — PowerPatent; Bao Tran

(57) ABSTRACT

A method for producing a 3D memory device, the method comprising: providing a first level comprising a single crystal layer; forming at least one second level above said first level; performing a first etch step comprising etching holes within said second level; forming at least one third level above said at least one second level; performing a second etch step comprising etching holes within said third level; performing additional processing steps to form a plurality of first memory cells within said second level and a plurality of second memory cells within said third level, wherein each of said first memory cells comprise one first transistor, wherein each of said second memory cells comprise one second transistor, wherein at least one of said first or second transistors has a channel, a source and a drain having the same doping type, and wherein said forming at least one third level comprises forming a window within said third level to allow lithography alignment through said third level to an alignment mark underneath.

20 Claims, 80 Drawing Sheets

Related U.S. Application Data which is a continuation-in-part of application No. 17/013,823, filed on Sep. 7, 2020, now Pat. No. 10,896,931, which is a continuation-in-part of application No. 16/409,813, filed on May 11, 2019, now Pat. No. 10,825,864, which is a continuation-in-part of application No. 15/803,732, filed on Nov. 3, 2017, now Pat. No. 10,290,682, which is a continuation-in-part of application No. 14/555,494, filed on Nov. 26, 2014, now Pat. No. 9,818,800, which is a continuation of application No. 13/246,157, filed on Sep. 27, 2011, now Pat. No. 8,956,959, which is a continuation of application No. 13/173,999, filed on Jun. 30, 2011, now Pat. No. 8,203,148, which is a continuation of application No. 12/901,890, filed on Oct. 11, 2010, now Pat. No. 8,026,521.

(51) Int. Cl.

| | | |
|---|---|---|
| *H01L 21/683* | (2006.01) | |
| *H01L 21/822* | (2006.01) | |
| *H01L 21/84* | (2006.01) | |
| *H01L 27/06* | (2006.01) | |
| *H01L 27/108* | (2006.01) | |
| *H01L 27/11* | (2006.01) | |
| *H01L 27/11529* | (2017.01) | |
| *H01L 27/11551* | (2017.01) | |
| *H01L 27/11578* | (2017.01) | |
| *H01L 27/12* | (2006.01) | |
| *H01L 29/78* | (2006.01) | |
| *H01L 29/423* | (2006.01) | |
| *H01L 27/22* | (2006.01) | |
| *H01L 21/268* | (2006.01) | |
| *H01L 27/105* | (2006.01) | |
| *H01L 27/11526* | (2017.01) | |
| *H01L 27/11573* | (2017.01) | |
| *H01L 45/00* | (2006.01) | |

(52) U.S. Cl.
CPC .... *H01L 21/76254* (2013.01); *H01L 21/8221* (2013.01); *H01L 21/84* (2013.01); *H01L 21/845* (2013.01); *H01L 27/0688* (2013.01); *H01L 27/10802* (2013.01); *H01L 27/10897* (2013.01); *H01L 27/11* (2013.01); *H01L 27/11529* (2013.01); *H01L 27/11551* (2013.01); *H01L 27/11578* (2013.01); *H01L 27/1203* (2013.01); *H01L 27/1211* (2013.01); *H01L 27/228* (2013.01); *H01L 27/249* (2013.01); *H01L 27/2436* (2013.01); *H01L 29/42392* (2013.01); *H01L 29/785* (2013.01); *H01L 29/7841* (2013.01); *H01L 27/105* (2013.01); *H01L 27/10826* (2013.01); *H01L 27/10879* (2013.01); *H01L 27/11526* (2013.01); *H01L 27/11573* (2013.01); *H01L 45/04* (2013.01); *H01L 45/1226* (2013.01); *H01L 45/146* (2013.01); *H01L 2029/7857* (2013.01); *H01L 2221/6835* (2013.01)

(58) Field of Classification Search
CPC ... H01L 27/11; H01L 29/7841; H01L 27/228; H01L 27/2436; H01L 21/84; H01L 27/0688; H01L 21/8221; H01L 21/6835; H01L 27/1211; H01L 27/249; H01L 27/11529; H01L 29/42392; H01L 27/1203; H01L 21/845; H01L 29/785; H01L 27/10897; H01L 27/11578; H01L 45/04; H01L 27/10826; H01L 27/11526; H01L 27/105; H01L 2029/7857; H01L 27/11573; H01L 2221/6835; H01L 27/10879; H01L 45/1226; H01L 45/146
See application file for complete search history.

(56) References Cited

U.S. PATENT DOCUMENTS

| | | | |
|---|---|---|---|
| 4,009,483 | A | 2/1977 | Clark |
| 4,197,555 | A | 4/1980 | Uehara et al. |
| 4,213,139 | A | 7/1980 | Rao et al. |
| 4,400,715 | A | 8/1983 | Barbee et al. |
| 4,487,635 | A | 12/1984 | Kugimiya et al. |
| 4,510,670 | A | 4/1985 | Schwabe |
| 4,522,657 | A | 6/1985 | Rohatgi et al. |
| 4,612,083 | A | 9/1986 | Yasumoto et al. |
| 4,643,950 | A | 2/1987 | Ogura et al. |
| 4,704,785 | A | 11/1987 | Curran |
| 4,711,858 | A | 12/1987 | Harder et al. |
| 4,721,885 | A | 1/1988 | Brodie |
| 4,732,312 | A | 3/1988 | Kennedy et al. |
| 4,733,288 | A | 3/1988 | Sato |
| 4,829,018 | A | 5/1989 | Wahlstrom |
| 4,854,986 | A | 8/1989 | Raby |
| 4,866,304 | A | 9/1989 | Yu |
| 4,939,568 | A | 7/1990 | Kato et al. |
| 4,956,307 | A | 9/1990 | Pollack et al. |
| 5,012,153 | A | 4/1991 | Atkinson et al. |
| 5,032,007 | A | 7/1991 | Silverstein et al. |
| 5,047,979 | A | 9/1991 | Leung |
| 5,087,585 | A | 2/1992 | Hayashi |
| 5,093,704 | A | 3/1992 | Sato et al. |
| 5,106,775 | A | 4/1992 | Kaga et al. |
| 5,152,857 | A | 10/1992 | Ito et al. |
| 5,162,879 | A | 11/1992 | Gill |
| 5,189,500 | A | 2/1993 | Kusunoki |
| 5,217,916 | A | 6/1993 | Anderson et al. |
| 5,250,460 | A | 10/1993 | Yamagata et al. |
| 5,258,643 | A | 11/1993 | Cohen |
| 5,265,047 | A | 11/1993 | Leung et al. |
| 5,266,511 | A | 11/1993 | Takao |
| 5,277,748 | A | 1/1994 | Sakaguchi et al. |
| 5,286,670 | A | 2/1994 | Kang et al. |
| 5,294,556 | A | 3/1994 | Kawamura |
| 5,308,782 | A | 5/1994 | Mazure et al. |
| 5,312,771 | A | 5/1994 | Yonehara |
| 5,317,236 | A | 5/1994 | Zavracky et al. |
| 5,324,980 | A | 6/1994 | Kusunoki |
| 5,355,022 | A | 10/1994 | Sugahara et al. |
| 5,371,037 | A | 12/1994 | Yonehara |
| 5,374,564 | A | 12/1994 | Bruel |
| 5,374,581 | A | 12/1994 | Ichikawa et al. |
| 5,424,560 | A | 6/1995 | Norman et al. |
| 5,475,280 | A | 12/1995 | Jones et al. |
| 5,478,762 | A | 12/1995 | Chao |
| 5,485,031 | A | 1/1996 | Zhang et al. |
| 5,498,978 | A | 3/1996 | Takahashi et al. |
| 5,527,423 | A | 6/1996 | Neville et al. |
| 5,535,342 | A | 7/1996 | Taylor |
| 5,554,870 | A | 9/1996 | Fitch et al. |
| 5,563,084 | A | 10/1996 | Ramm et al. |
| 5,583,349 | A | 12/1996 | Norman et al. |
| 5,583,350 | A | 12/1996 | Norman et al. |
| 5,586,291 | A | 12/1996 | Lasker |
| 5,594,563 | A | 1/1997 | Larson |
| 5,604,137 | A | 2/1997 | Yamazaki et al. |
| 5,617,991 | A | 4/1997 | Pramanick et al. |
| 5,627,106 | A | 5/1997 | Hsu |
| 5,656,548 | A | 8/1997 | Zavracky et al. |
| 5,656,553 | A | 8/1997 | Leas et al. |
| 5,659,194 | A | 8/1997 | Iwamatsu |
| 5,670,411 | A | 9/1997 | Yonehara |
| 5,681,756 | A | 10/1997 | Norman et al. |
| 5,695,557 | A | 12/1997 | Yamagata et al. |
| 5,701,027 | A | 12/1997 | Gordon et al. |
| 5,707,745 | A | 1/1998 | Forrest et al. |
| 5,714,395 | A | 2/1998 | Bruel |
| 5,721,160 | A | 2/1998 | Forrest et al. |

(56) References Cited

U.S. PATENT DOCUMENTS

| | | |
|---|---|---|
| 5,737,748 A | 4/1998 | Shigeeda |
| 5,739,552 A | 4/1998 | Kimura et al. |
| 5,744,979 A | 4/1998 | Goetting |
| 5,748,161 A | 5/1998 | Lebby et al. |
| 5,757,026 A | 5/1998 | Forrest et al. |
| 5,770,483 A | 6/1998 | Kadosh |
| 5,770,881 A | 6/1998 | Pelella et al. |
| 5,781,031 A | 7/1998 | Bertin et al. |
| 5,817,574 A | 10/1998 | Gardner |
| 5,829,026 A | 10/1998 | Leung et al. |
| 5,835,396 A | 11/1998 | Zhang |
| 5,854,123 A | 12/1998 | Sato et al. |
| 5,861,929 A | 1/1999 | Spitzer |
| 5,877,034 A | 3/1999 | Ramm |
| 5,877,070 A | 3/1999 | Goesele et al. |
| 5,882,987 A | 3/1999 | Srikrishnan |
| 5,883,525 A | 3/1999 | Tavana et al. |
| 5,889,903 A | 3/1999 | Rao |
| 5,893,721 A | 4/1999 | Huang et al. |
| 5,915,167 A | 6/1999 | Leedy |
| 5,920,788 A | 7/1999 | Reinberg |
| 5,937,312 A | 8/1999 | Iyer et al. |
| 5,943,574 A | 8/1999 | Tehrani et al. |
| 5,952,680 A | 9/1999 | Strite |
| 5,952,681 A | 9/1999 | Chen |
| 5,965,875 A | 10/1999 | Merrill |
| 5,977,579 A | 11/1999 | Noble |
| 5,977,961 A | 11/1999 | Rindal |
| 5,980,633 A | 11/1999 | Yamagata et al. |
| 5,985,742 A | 11/1999 | Henley et al. |
| 5,994,746 A | 11/1999 | Reisinger |
| 5,998,808 A | 12/1999 | Matsushita |
| 6,001,693 A | 12/1999 | Yeouchung et al. |
| 6,009,496 A | 12/1999 | Tsai |
| 6,020,252 A | 2/2000 | Aspar et al. |
| 6,020,263 A | 2/2000 | Shih et al. |
| 6,027,958 A | 2/2000 | Vu et al. |
| 6,030,700 A | 2/2000 | Forrest et al. |
| 6,052,498 A | 4/2000 | Paniccia |
| 6,054,370 A | 4/2000 | Doyle |
| 6,057,212 A | 5/2000 | Chan et al. |
| 6,071,795 A | 6/2000 | Cheung et al. |
| 6,075,268 A | 6/2000 | Gardner et al. |
| 6,103,597 A | 8/2000 | Aspar et al. |
| 6,111,260 A | 8/2000 | Dawson et al. |
| 6,125,217 A | 9/2000 | Paniccia et al. |
| 6,153,495 A | 11/2000 | Kub et al. |
| 6,191,007 B1 | 2/2001 | Matsui et al. |
| 6,200,878 B1 | 3/2001 | Yamagata |
| 6,222,203 B1 | 4/2001 | Ishibashi et al. |
| 6,226,197 B1 | 5/2001 | Nishimura |
| 6,229,161 B1 | 5/2001 | Nemati et al. |
| 6,242,324 B1 | 6/2001 | Kub et al. |
| 6,242,778 B1 | 6/2001 | Marmillion et al. |
| 6,252,465 B1 | 6/2001 | Katoh |
| 6,259,623 B1 | 7/2001 | Takahashi |
| 6,261,935 B1 | 7/2001 | See et al. |
| 6,264,805 B1 | 7/2001 | Forrest et al. |
| 6,281,102 B1 | 8/2001 | Cao et al. |
| 6,294,018 B1 | 9/2001 | Hamm et al. |
| 6,306,705 B1 | 10/2001 | Parekh et al. |
| 6,321,134 B1 | 11/2001 | Henley et al. |
| 6,322,903 B1 | 11/2001 | Siniaguine et al. |
| 6,331,468 B1 | 12/2001 | Aronowitz et al. |
| 6,331,790 B1 | 12/2001 | Or-Bach et al. |
| 6,331,943 B1 | 12/2001 | Naji et al. |
| 6,353,492 B2 | 3/2002 | McClelland et al. |
| 6,355,501 B1 | 3/2002 | Fung et al. |
| 6,355,976 B1 | 3/2002 | Faris |
| 6,358,631 B1 | 3/2002 | Forrest et al. |
| 6,365,270 B2 | 4/2002 | Forrest et al. |
| 6,376,337 B1 | 4/2002 | Wang et al. |
| 6,377,504 B1 | 4/2002 | Hilbert |
| 6,380,046 B1 | 4/2002 | Yamazaki |
| 6,392,253 B1 | 5/2002 | Saxena |
| 6,404,043 B1 | 6/2002 | Isaak |
| 6,417,108 B1 | 7/2002 | Akino et al. |
| 6,420,215 B1 | 7/2002 | Knall et al. |
| 6,423,614 B1 | 7/2002 | Doyle |
| 6,429,481 B1 | 8/2002 | Mo et al. |
| 6,429,484 B1 | 8/2002 | Yu |
| 6,430,734 B1 | 8/2002 | Zahar |
| 6,448,615 B1 | 9/2002 | Forbes |
| 6,475,869 B1 | 11/2002 | Yu |
| 6,476,493 B2 | 11/2002 | Or-Bach et al. |
| 6,479,821 B1 | 11/2002 | Hawryluk et al. |
| 6,483,707 B1 | 11/2002 | Freuler et al. |
| 6,507,115 B1 | 1/2003 | Hofstee |
| 6,515,334 B2 | 2/2003 | Yamazaki et al. |
| 6,515,511 B2 | 2/2003 | Sugibayashi et al. |
| 6,526,559 B2 | 2/2003 | Schiefele et al. |
| 6,528,391 B1 | 3/2003 | Henley et al. |
| 6,534,352 B1 | 3/2003 | Kim |
| 6,534,382 B1 | 3/2003 | Sakaguchi et al. |
| 6,544,837 B1 | 4/2003 | Divakauni et al. |
| 6,545,314 B2 | 4/2003 | Forbes et al. |
| 6,555,901 B1 | 4/2003 | Yoshihara et al. |
| 6,563,139 B2 | 5/2003 | Hen |
| 6,580,124 B1 | 6/2003 | Cleeves |
| 6,580,289 B2 | 6/2003 | Cox |
| 6,600,173 B2 | 7/2003 | Tiwari |
| 6,617,694 B2 | 9/2003 | Kodaira et al. |
| 6,620,659 B2 | 9/2003 | Emmma et al. |
| 6,624,046 B1 | 9/2003 | Zavracky et al. |
| 6,627,518 B1 | 9/2003 | Inoue et al. |
| 6,627,985 B2 | 9/2003 | Huppenthal et al. |
| 6,630,713 B2 | 10/2003 | Geusic |
| 6,635,552 B1 | 10/2003 | Gonzalez |
| 6,635,588 B1 | 10/2003 | Hawryluk et al. |
| 6,638,834 B2 | 10/2003 | Gonzalez |
| 6,642,744 B2 | 11/2003 | Or-Bach et al. |
| 6,653,209 B1 | 11/2003 | Yamagata |
| 6,653,712 B2 | 11/2003 | Knall et al. |
| 6,661,085 B2 | 12/2003 | Kellar et al. |
| 6,677,204 B2 | 1/2004 | Cleeves et al. |
| 6,686,253 B2 | 2/2004 | Or-Bach |
| 6,689,660 B1 | 2/2004 | Noble |
| 6,701,071 B2 | 3/2004 | Wada et al. |
| 6,703,328 B2 | 3/2004 | Tanaka et al. |
| 6,756,633 B2 | 6/2004 | Wang et al. |
| 6,756,811 B2 | 6/2004 | Or-Bach |
| 6,759,282 B2 | 7/2004 | Campbell et al. |
| 6,762,076 B2 | 7/2004 | Kim et al. |
| 6,774,010 B2 | 8/2004 | Chu et al. |
| 6,805,979 B2 | 10/2004 | Ogura et al. |
| 6,806,171 B1 | 10/2004 | Ulyashin et al. |
| 6,809,009 B2 | 10/2004 | Aspar et al. |
| 6,815,781 B2 | 11/2004 | Vyvoda et al. |
| 6,819,136 B2 | 11/2004 | Or-Bach |
| 6,821,826 B1 | 11/2004 | Chan et al. |
| 6,841,813 B2 | 1/2005 | Walker et al. |
| 6,844,243 B1 | 1/2005 | Gonzalez |
| 6,864,534 B2 | 3/2005 | Ipposhi et al. |
| 6,875,671 B2 | 4/2005 | Faris |
| 6,882,572 B2 | 4/2005 | Wang et al. |
| 6,888,375 B2 | 5/2005 | Feng et al. |
| 6,917,219 B2 | 7/2005 | New |
| 6,927,431 B2 | 8/2005 | Gonzalez |
| 6,930,511 B2 | 8/2005 | Or-Bach |
| 6,943,067 B2 | 9/2005 | Greenlaw |
| 6,943,407 B2 | 9/2005 | Ouyang et al. |
| 6,949,421 B1 | 9/2005 | Padmanabhan et al. |
| 6,953,956 B2 | 10/2005 | Or-Bach et al. |
| 6,967,149 B2 | 11/2005 | Meyer et al. |
| 6,985,012 B2 | 1/2006 | Or-Bach |
| 6,989,687 B2 | 1/2006 | Or-Bach |
| 6,995,430 B2 | 2/2006 | Langdo et al. |
| 6,995,456 B2 | 2/2006 | Nowak |
| 7,015,719 B1 | 3/2006 | Feng et al. |
| 7,016,569 B2 | 3/2006 | Mule et al. |
| 7,018,875 B2 | 3/2006 | Madurawe |
| 7,019,557 B2 | 3/2006 | Madurawe |
| 7,043,106 B2 | 5/2006 | West et al. |
| 7,052,941 B2 | 5/2006 | Lee |

(56) References Cited

U.S. PATENT DOCUMENTS

| | | | |
|---|---|---|---|
| 7,064,579 B2 | 6/2006 | Madurawe |
| 7,067,396 B2 | 6/2006 | Aspar et al. |
| 7,067,909 B2 | 6/2006 | Reif et al. |
| 7,068,070 B2 | 6/2006 | Or-Bach |
| 7,068,072 B2 | 6/2006 | New et al. |
| 7,078,739 B1 | 7/2006 | Nemati et al. |
| 7,094,667 B1 | 8/2006 | Bower |
| 7,098,691 B2 | 8/2006 | Or-Bach et al. |
| 7,105,390 B2 | 9/2006 | Brask et al. |
| 7,105,871 B2 | 9/2006 | Or-Bach et al. |
| 7,109,092 B2 | 9/2006 | Tong |
| 7,110,629 B2 | 9/2006 | Bjorkman et al. |
| 7,111,149 B2 | 9/2006 | Eilert |
| 7,112,815 B2 | 9/2006 | Prall |
| 7,115,945 B2 | 10/2006 | Lee et al. |
| 7,115,966 B2 | 10/2006 | Ido et al. |
| 7,141,853 B2 | 11/2006 | Campbell et al. |
| 7,148,119 B1 | 12/2006 | Sakaguchi et al. |
| 7,157,787 B2 | 1/2007 | Kim et al. |
| 7,157,937 B2 | 1/2007 | Apostol et al. |
| 7,166,520 B1 | 1/2007 | Henley |
| 7,170,807 B2 | 1/2007 | Fazan et al. |
| 7,173,369 B2 | 2/2007 | Forrest et al. |
| 7,180,091 B2 | 2/2007 | Yamazaki et al. |
| 7,180,379 B1 | 2/2007 | Hopper et al. |
| 7,183,611 B2 | 2/2007 | Bhattacharyya |
| 7,189,489 B2 | 3/2007 | Kunimoto et al. |
| 7,205,204 B2 | 4/2007 | Ogawa et al. |
| 7,209,384 B1 | 4/2007 | Kim |
| 7,217,636 B1 | 5/2007 | Atanackovic |
| 7,223,612 B2 | 5/2007 | Sarma |
| 7,242,012 B2 | 7/2007 | Leedy |
| 7,245,002 B2 | 7/2007 | Akino et al. |
| 7,256,104 B2 | 8/2007 | Ito et al. |
| 7,259,091 B2 | 8/2007 | Schuehrer et al. |
| 7,265,421 B2 | 9/2007 | Madurawe |
| 7,271,420 B2 | 9/2007 | Cao |
| 7,274,207 B2 | 9/2007 | Sugawara et al. |
| 7,282,951 B2 | 10/2007 | Huppenthal et al. |
| 7,284,226 B1 | 10/2007 | Kondapalli |
| 7,296,201 B2 | 11/2007 | Abramovici |
| 7,304,355 B2 | 12/2007 | Zhang |
| 7,312,109 B2 | 12/2007 | Madurawe |
| 7,312,487 B2 | 12/2007 | Alam et al. |
| 7,314,788 B2 | 1/2008 | Shaw |
| 7,335,573 B2 | 2/2008 | Takayama et al. |
| 7,337,425 B2 | 2/2008 | Kirk |
| 7,338,884 B2 | 3/2008 | Shimoto et al. |
| 7,342,415 B2 | 3/2008 | Teig et al. |
| 7,351,644 B2 | 4/2008 | Henley |
| 7,358,601 B1 | 4/2008 | Plants et al. |
| 7,362,133 B2 | 4/2008 | Madurawe |
| 7,369,435 B2 | 5/2008 | Forbes |
| 7,371,660 B2 | 5/2008 | Henley et al. |
| 7,378,702 B2 | 5/2008 | Lee |
| 7,381,989 B2 | 6/2008 | Kim |
| 7,385,283 B2 | 6/2008 | Wu |
| 7,393,722 B1 | 7/2008 | Issaq et al. |
| 7,402,483 B2 | 7/2008 | Yu et al. |
| 7,402,897 B2 | 7/2008 | Leedy |
| 7,419,844 B2 | 9/2008 | Lee et al. |
| 7,432,185 B2 | 10/2008 | Kim |
| 7,436,027 B2 | 10/2008 | Ogawa et al. |
| 7,439,773 B2 | 10/2008 | Or-Bach et al. |
| 7,446,563 B2 | 11/2008 | Madurawe |
| 7,459,752 B2 | 12/2008 | Doris et al. |
| 7,459,763 B1 | 12/2008 | Issaq et al. |
| 7,459,772 B2 | 12/2008 | Speers |
| 7,463,062 B2 | 12/2008 | Or-Bach et al. |
| 7,463,502 B2 | 12/2008 | Stipe |
| 7,470,142 B2 | 12/2008 | Lee |
| 7,470,598 B2 | 12/2008 | Lee |
| 7,476,939 B2 | 1/2009 | Okhonin et al. |
| 7,477,540 B2 | 1/2009 | Okhonin et al. |
| 7,485,968 B2 | 2/2009 | Enquist et al. |
| 7,486,563 B2 | 2/2009 | Waller et al. |
| 7,488,980 B2 | 2/2009 | Takafuji et al. |
| 7,492,632 B2 | 2/2009 | Carman |
| 7,495,473 B2 | 2/2009 | McCollum et al. |
| 7,498,675 B2 | 3/2009 | Farnworth et al. |
| 7,499,352 B2 | 3/2009 | Singh |
| 7,499,358 B2 | 3/2009 | Bauser |
| 7,508,034 B2 | 3/2009 | Takafuji et al. |
| 7,514,748 B2 | 4/2009 | Fazan et al. |
| 7,521,806 B2 | 4/2009 | Trezza |
| 7,525,186 B2 | 4/2009 | Kim et al. |
| 7,535,089 B2 | 5/2009 | Fitzgerald |
| 7,541,616 B2 | 6/2009 | Fazan et al. |
| 7,547,589 B2 | 6/2009 | Iriguchi |
| 7,553,745 B2 | 6/2009 | Lim |
| 7,557,367 B2 | 7/2009 | Rogers et al. |
| 7,558,141 B2 | 7/2009 | Katsumata et al. |
| 7,563,659 B2 | 7/2009 | Kwon et al. |
| 7,566,855 B2 | 7/2009 | Olsen et al. |
| 7,566,974 B2 | 7/2009 | Konevecki |
| 7,586,778 B2 | 9/2009 | Ho et al. |
| 7,589,375 B2 | 9/2009 | Jang et al. |
| 7,608,848 B2 | 10/2009 | Ho et al. |
| 7,612,411 B2 | 11/2009 | Walker |
| 7,615,462 B2 | 11/2009 | Kim et al. |
| 7,622,367 B1 | 11/2009 | Nuzzo et al. |
| 7,632,738 B2 | 12/2009 | Lee |
| 7,633,162 B2 | 12/2009 | Lee |
| 7,666,723 B2 | 2/2010 | Frank et al. |
| 7,670,912 B2 | 3/2010 | Yeo |
| 7,671,371 B2 | 3/2010 | Lee |
| 7,671,460 B2 | 3/2010 | Lauxtermann et al. |
| 7,674,687 B2 | 3/2010 | Henley |
| 7,687,372 B2 | 3/2010 | Jain |
| 7,687,872 B2 | 3/2010 | Cazaux |
| 7,688,619 B2 | 3/2010 | Lung et al. |
| 7,692,202 B2 | 4/2010 | Bensch |
| 7,692,448 B2 | 4/2010 | Solomon |
| 7,692,944 B2 | 4/2010 | Bernstein et al. |
| 7,697,316 B2 | 4/2010 | Lai et al. |
| 7,709,932 B2 | 5/2010 | Nemoto et al. |
| 7,718,508 B2 | 5/2010 | Lee |
| 7,719,876 B2 | 5/2010 | Chevallier |
| 7,723,207 B2 | 5/2010 | Alam et al. |
| 7,728,326 B2 | 6/2010 | Yamazaki et al. |
| 7,732,301 B1 | 6/2010 | Pinnington et al. |
| 7,741,673 B2 | 6/2010 | Tak et al. |
| 7,742,331 B2 | 6/2010 | Watanabe |
| 7,745,250 B2 | 6/2010 | Han |
| 7,749,884 B2 | 7/2010 | Mathew et al. |
| 7,750,669 B2 | 7/2010 | Spangaro |
| 7,755,622 B2 | 7/2010 | Yvon |
| 7,759,043 B2 | 7/2010 | Tanabe et al. |
| 7,768,115 B2 | 8/2010 | Lee et al. |
| 7,772,039 B2 | 8/2010 | Kerber |
| 7,772,096 B2 | 8/2010 | DeSouza et al. |
| 7,774,735 B1 | 8/2010 | Sood |
| 7,776,715 B2 | 8/2010 | Wells et al. |
| 7,777,330 B2 | 8/2010 | Pelley et al. |
| 7,786,460 B2 | 8/2010 | Lung et al. |
| 7,786,535 B2 | 8/2010 | Abou-Khalil et al. |
| 7,790,524 B2 | 9/2010 | Abadeer et al. |
| 7,795,619 B2 | 9/2010 | Hara |
| 7,799,675 B2 | 9/2010 | Lee |
| 7,800,099 B2 | 9/2010 | Yamazaki et al. |
| 7,800,148 B2 | 9/2010 | Lee et al. |
| 7,800,163 B2 | 9/2010 | Izumi et al. |
| 7,800,199 B2 | 9/2010 | Oh et al. |
| 7,816,721 B2 | 10/2010 | Yamazaki |
| 7,843,718 B2 | 11/2010 | Koh et al. |
| 7,846,814 B2 | 12/2010 | Lee |
| 7,863,095 B2 | 1/2011 | Sasaki et al. |
| 7,864,568 B2 | 1/2011 | Fujisaki et al. |
| 7,867,822 B2 | 1/2011 | Lee |
| 7,888,764 B2 | 2/2011 | Lee |
| 7,910,432 B2 | 3/2011 | Tanaka et al. |
| 7,915,164 B2 | 3/2011 | Konevecki et al. |
| 7,919,845 B2 | 4/2011 | Karp |
| 7,965,102 B1 | 6/2011 | Bauer et al. |

(56) References Cited

U.S. PATENT DOCUMENTS

| | | |
|---|---|---|
| 7,968,965 B2 | 6/2011 | Kim |
| 7,969,193 B1 | 6/2011 | Wu et al. |
| 7,973,314 B2 | 7/2011 | Yang |
| 7,982,250 B2 | 7/2011 | Yamazaki et al. |
| 7,983,065 B2 | 7/2011 | Samachisa |
| 8,008,732 B2 | 8/2011 | Kiyotoshi |
| 8,013,399 B2 | 9/2011 | Thomas et al. |
| 8,014,166 B2 | 9/2011 | Yazdani |
| 8,014,195 B2 | 9/2011 | Okhonin et al. |
| 8,022,493 B2 | 9/2011 | Bang |
| 8,030,780 B2 | 10/2011 | Kirby et al. |
| 8,031,544 B2 | 10/2011 | Kim et al. |
| 8,032,857 B2 | 10/2011 | McIlrath |
| 8,044,448 B2 | 10/2011 | Kamigaichi et al. |
| 8,044,464 B2 | 10/2011 | Yamazaki et al. |
| 8,068,364 B2 | 11/2011 | Maejima |
| 8,106,520 B2 | 1/2012 | Keeth et al. |
| 8,107,276 B2 | 1/2012 | Breitwisch et al. |
| 8,129,256 B2 | 3/2012 | Farooq et al. |
| 8,129,258 B2 | 3/2012 | Hosier et al. |
| 8,130,547 B2 | 3/2012 | Widjaja et al. |
| 8,136,071 B2 | 3/2012 | Solomon |
| 8,138,502 B2 | 3/2012 | Nakamura et al. |
| 8,153,520 B1 | 4/2012 | Chandrashekar |
| 8,158,515 B2 | 4/2012 | Farooq et al. |
| 8,178,919 B2 | 5/2012 | Fujiwara et al. |
| 8,183,630 B2 | 5/2012 | Batude et al. |
| 8,184,463 B2 | 5/2012 | Saen et al. |
| 8,185,685 B2 | 5/2012 | Selinger |
| 8,203,187 B2 | 6/2012 | Lung et al. |
| 8,208,279 B2 | 6/2012 | Lue |
| 8,209,649 B2 | 6/2012 | McIlrath |
| 8,228,684 B2 | 7/2012 | Losavio et al. |
| 8,266,560 B2 | 8/2012 | McIlrath |
| 8,264,065 B2 | 9/2012 | Su et al. |
| 8,288,816 B2 | 10/2012 | Komori et al. |
| 8,294,199 B2 | 10/2012 | Yahashi et al. |
| 8,324,680 B2 | 12/2012 | Izumi et al. |
| 8,338,882 B2 | 12/2012 | Tanaka et al. |
| 8,343,851 B2 | 1/2013 | Kim et al. |
| 8,354,308 B2 | 1/2013 | Kang et al. |
| 8,355,273 B2 | 1/2013 | Liu |
| 8,374,033 B2 | 2/2013 | Kito et al. |
| 8,426,294 B2 | 4/2013 | Lung et al. |
| 8,432,719 B2 | 4/2013 | Lue |
| 8,432,751 B2 | 4/2013 | Hafez |
| 8,455,941 B2 | 6/2013 | Ishihara et al. |
| 8,470,689 B2 | 6/2013 | Desplobain et al. |
| 8,497,512 B2 | 7/2013 | Nakamura et al. |
| 8,501,564 B2 | 8/2013 | Suzawa |
| 8,507,972 B2 | 8/2013 | Oota et al. |
| 8,508,994 B2 | 8/2013 | Okhonin |
| 8,513,725 B2 | 8/2013 | Sakuma et al. |
| 8,514,623 B2 | 8/2013 | Widjaja et al. |
| 8,516,408 B2 | 8/2013 | Dell |
| 8,566,762 B2 | 8/2013 | Morimoto et al. |
| 8,525,342 B2 | 10/2013 | Chandrasekaran |
| 8,546,956 B2 | 10/2013 | Nguyen |
| 8,603,888 B2 | 12/2013 | Liu |
| 8,611,388 B2 | 12/2013 | Krasulick et al. |
| 8,619,490 B2 | 12/2013 | Yu |
| 8,630,326 B2 | 1/2014 | Krasulick et al. |
| 8,643,162 B2 | 2/2014 | Madurawe |
| 8,650,516 B2 | 2/2014 | McIlrath |
| 8,654,584 B2 | 2/2014 | Kim et al. |
| 8,679,861 B2 | 3/2014 | Bose |
| 8,736,068 B2 | 5/2014 | Bartley et al. |
| 8,773,562 B1 | 7/2014 | Fan |
| 8,775,998 B2 | 7/2014 | Morimoto |
| 8,824,183 B2 | 9/2014 | Samachisa et al. |
| 8,841,777 B2 | 9/2014 | Farooq |
| 8,853,785 B2 | 10/2014 | Augendre |
| 8,896,054 B2 | 11/2014 | Sakuma et al. |
| 8,928,119 B2 | 1/2015 | Leedy |
| 8,971,114 B2 | 3/2015 | Kang |
| 9,105,689 B1 | 8/2015 | Fanelli |
| 9,172,008 B2 | 10/2015 | Hwang |
| 9,227,456 B2 | 1/2016 | Chien |
| 9,230,973 B2 | 1/2016 | Pachamuthu et al. |
| 9,269,608 B2 | 2/2016 | Fanelli |
| 9,334,582 B2 | 5/2016 | See |
| 9,391,090 B2 | 7/2016 | Manorotkul et al. |
| 9,472,568 B2 | 10/2016 | Shin et al. |
| 9,564,450 B2 | 2/2017 | Sakuma et al. |
| 9,570,683 B1 | 2/2017 | Jo |
| 9,589,982 B1 | 3/2017 | Cheng et al. |
| 9,595,530 B1 | 3/2017 | Zhou |
| 9,627,287 B2 | 4/2017 | Engelhardt et al. |
| 9,673,257 B1 | 6/2017 | Takaki |
| 9,997,530 B2 | 6/2018 | Yon et al. |
| 10,199,354 B2 | 2/2019 | Modi et al. |
| 2001/0000005 A1 | 3/2001 | Forrest et al. |
| 2001/0014391 A1 | 8/2001 | Forrest et al. |
| 2001/0028059 A1 | 10/2001 | Emma et al. |
| 2002/0024140 A1 | 2/2002 | Nakajima et al. |
| 2002/0025604 A1 | 2/2002 | Tiwari |
| 2002/0074668 A1 | 6/2002 | Hofstee et al. |
| 2002/0081823 A1 | 6/2002 | Cheung et al. |
| 2002/0090758 A1 | 7/2002 | Henley et al. |
| 2002/0096681 A1 | 7/2002 | Yamazaki et al. |
| 2002/0113289 A1 | 8/2002 | Cordes et al. |
| 2002/0132465 A1 | 9/2002 | Leedy |
| 2002/0140091 A1 | 10/2002 | Callahan |
| 2002/0141233 A1 | 10/2002 | Hosotani et al. |
| 2002/0153243 A1 | 10/2002 | Forrest et al. |
| 2002/0153569 A1 | 10/2002 | Katayama |
| 2002/0175401 A1 | 11/2002 | Huang et al. |
| 2002/0180069 A1 | 12/2002 | Houston |
| 2002/0190232 A1 | 12/2002 | Chason |
| 2002/0199110 A1 | 12/2002 | Kean |
| 2003/0015713 A1 | 1/2003 | Yoo |
| 2003/0032262 A1 | 2/2003 | Dennison et al. |
| 2003/0059999 A1 | 3/2003 | Gonzalez |
| 2003/0060034 A1 | 3/2003 | Beyne et al. |
| 2003/0061555 A1 | 3/2003 | Kamei |
| 2003/0067043 A1 | 4/2003 | Zhang |
| 2003/0076706 A1 | 4/2003 | Andoh |
| 2003/0102079 A1 | 6/2003 | Kalvesten et al. |
| 2003/0107117 A1 | 6/2003 | Antonelli et al. |
| 2003/0113963 A1 | 6/2003 | Wurzer |
| 2003/0119279 A1 | 6/2003 | Enquist |
| 2003/0139011 A1 | 7/2003 | Cleeves et al. |
| 2003/0153163 A1 | 8/2003 | Letertre |
| 2003/0157748 A1 | 8/2003 | Kim et al. |
| 2003/0160888 A1 | 8/2003 | Yoshikawa |
| 2003/0173631 A1 | 9/2003 | Murakami |
| 2003/0206036 A1 | 11/2003 | Or-Bach |
| 2003/0213967 A1 | 11/2003 | Forrest et al. |
| 2003/0224582 A1 | 12/2003 | Shimoda et al. |
| 2003/0224596 A1 | 12/2003 | Marxsen et al. |
| 2004/0007376 A1 | 1/2004 | Urdahl et al. |
| 2004/0014299 A1 | 1/2004 | Moriceau et al. |
| 2004/0033676 A1 | 2/2004 | Coronel et al. |
| 2004/0036126 A1 | 2/2004 | Chau et al. |
| 2004/0047539 A1 | 3/2004 | Okubora et al. |
| 2004/0061176 A1 | 4/2004 | Takafuji et al. |
| 2004/0113207 A1 | 6/2004 | Hsu et al. |
| 2004/0143797 A1 | 7/2004 | Nguyen |
| 2004/0150068 A1 | 8/2004 | Leedy |
| 2004/0150070 A1 | 8/2004 | Okada |
| 2004/0152272 A1 | 8/2004 | Fladre et al. |
| 2004/0155301 A1 | 8/2004 | Zhang |
| 2004/0156172 A1 | 8/2004 | Lin et al. |
| 2004/0156233 A1 | 8/2004 | Bhattacharyya |
| 2004/0164425 A1 | 8/2004 | Urakawa |
| 2004/0166649 A1 | 8/2004 | Bressot et al. |
| 2004/0174732 A1 | 9/2004 | Morimoto |
| 2004/0175902 A1 | 9/2004 | Rayssac et al. |
| 2004/0178819 A1 | 9/2004 | New |
| 2004/0195572 A1 | 10/2004 | Kato et al. |
| 2004/0219765 A1 | 11/2004 | Reif et al. |
| 2004/0229444 A1 | 11/2004 | Couillard |
| 2004/0259312 A1 | 12/2004 | Schlosser et al. |
| 2004/0262635 A1 | 12/2004 | Lee |

(56) References Cited

U.S. PATENT DOCUMENTS

| | | |
|---|---|---|
| 2004/0262772 A1 | 12/2004 | Ramanathan et al. |
| 2005/0003592 A1 | 1/2005 | Jones |
| 2005/0010725 A1 | 1/2005 | Eilert |
| 2005/0023656 A1 | 2/2005 | Leedy |
| 2005/0045919 A1 | 3/2005 | Kaeriyama et al. |
| 2005/0067620 A1 | 3/2005 | Chan et al. |
| 2005/0067625 A1 | 3/2005 | Hata |
| 2005/0073060 A1 | 4/2005 | Datta et al. |
| 2005/0082526 A1 | 4/2005 | Bedell et al. |
| 2005/0098822 A1 | 5/2005 | Mathew |
| 2005/0110041 A1 | 5/2005 | Boutros et al. |
| 2005/0121676 A1 | 6/2005 | Fried et al. |
| 2005/0121789 A1 | 6/2005 | Madurawe |
| 2005/0130351 A1 | 6/2005 | Leedy |
| 2005/0130429 A1 | 6/2005 | Rayssac et al. |
| 2005/0148137 A1 | 7/2005 | Brask et al. |
| 2005/0176174 A1 | 8/2005 | Leedy |
| 2005/0218521 A1 | 10/2005 | Lee |
| 2005/0225237 A1 | 10/2005 | Winters |
| 2005/0266659 A1 | 12/2005 | Ghyselen et al. |
| 2005/0273749 A1 | 12/2005 | Kirk |
| 2005/0280061 A1 | 12/2005 | Lee |
| 2005/0280090 A1 | 12/2005 | Anderson et al. |
| 2005/0280154 A1 | 12/2005 | Lee |
| 2005/0280155 A1 | 12/2005 | Lee |
| 2005/0280156 A1 | 12/2005 | Lee |
| 2005/0282019 A1 | 12/2005 | Fukushima et al. |
| 2006/0014331 A1 | 1/2006 | Tang et al. |
| 2006/0024923 A1 | 2/2006 | Sarma et al. |
| 2006/0033110 A1 | 2/2006 | Alam et al. |
| 2006/0033124 A1 | 2/2006 | Or-Bach et al. |
| 2006/0043367 A1 | 2/2006 | Chang et al. |
| 2006/0049449 A1 | 3/2006 | Iino |
| 2006/0065953 A1 | 3/2006 | Kim et al. |
| 2006/0067122 A1 | 3/2006 | Verhoeven |
| 2006/0071322 A1 | 4/2006 | Kitamura |
| 2006/0071332 A1 | 4/2006 | Speers |
| 2006/0083280 A1 | 4/2006 | Tauzin et al. |
| 2006/0108613 A1 | 5/2006 | Song |
| 2006/0108627 A1 | 5/2006 | Choi et al. |
| 2006/0113522 A1 | 6/2006 | Lee et al. |
| 2006/0118935 A1 | 6/2006 | Kamiyama et al. |
| 2006/0121690 A1 | 6/2006 | Pogge et al. |
| 2006/0150137 A1 | 7/2006 | Madurawe |
| 2006/0158511 A1 | 7/2006 | Harrold |
| 2006/0170046 A1 | 8/2006 | Hara |
| 2006/0179417 A1 | 8/2006 | Madurawe |
| 2006/0181202 A1 | 8/2006 | Liao et al. |
| 2006/0189095 A1 | 8/2006 | Ghyselen et al. |
| 2006/0194401 A1 | 8/2006 | Hu et al. |
| 2006/0195729 A1 | 8/2006 | Huppenthal et al. |
| 2006/0207087 A1 | 9/2006 | Jafri et al. |
| 2006/0224814 A1 | 10/2006 | Kim et al. |
| 2006/0237777 A1 | 10/2006 | Choi |
| 2006/0249859 A1 | 11/2006 | Eiles et al. |
| 2006/0275962 A1 | 12/2006 | Lee |
| 2007/0004150 A1 | 1/2007 | Huang |
| 2007/0014508 A1 | 1/2007 | Chen et al. |
| 2007/0035329 A1 | 2/2007 | Madurawe |
| 2007/0063259 A1 | 3/2007 | Derderian et al. |
| 2007/0072391 A1 | 3/2007 | Pocas et al. |
| 2007/0076509 A1 | 4/2007 | Zhang |
| 2007/0077694 A1 | 4/2007 | Lee |
| 2007/0077743 A1 | 4/2007 | Rao et al. |
| 2007/0090416 A1 | 4/2007 | Doyle et al. |
| 2007/0102737 A1 | 5/2007 | Kashiwabara et al. |
| 2007/0103191 A1 | 5/2007 | Sugawara et al. |
| 2007/0108523 A1 | 5/2007 | Ogawa et al. |
| 2007/0109831 A1 | 5/2007 | RaghuRam |
| 2007/0111386 A1 | 5/2007 | Kim et al. |
| 2007/0111406 A1 | 5/2007 | Joshi et al. |
| 2007/0132049 A1 | 6/2007 | Stipe |
| 2007/0132369 A1 | 6/2007 | Forrest et al. |
| 2007/0135013 A1 | 6/2007 | Faris |
| 2007/0141781 A1 | 6/2007 | Park |
| 2007/0158659 A1 | 7/2007 | Bensce |
| 2007/0158831 A1 | 7/2007 | Cha et al. |
| 2007/0176214 A1 | 8/2007 | Kwon et al. |
| 2007/0187775 A1 | 8/2007 | Okhonin et al. |
| 2007/0190746 A1 | 8/2007 | Ito et al. |
| 2007/0194453 A1 | 8/2007 | Chakraborty et al. |
| 2007/0206408 A1 | 9/2007 | Schwerin |
| 2007/0210336 A1 | 9/2007 | Madurawe |
| 2007/0211535 A1 | 9/2007 | Kim |
| 2007/0215903 A1 | 9/2007 | Sakamoto et al. |
| 2007/0218622 A1 | 9/2007 | Lee et al. |
| 2007/0228383 A1 | 10/2007 | Bernstein et al. |
| 2007/0252201 A1 | 11/2007 | Kito et al. |
| 2007/0252203 A1 | 11/2007 | Zhu et al. |
| 2007/0262457 A1 | 11/2007 | Lin |
| 2007/0275520 A1 | 11/2007 | Suzuki |
| 2007/0281439 A1 | 12/2007 | Bedell et al. |
| 2007/0283298 A1 | 12/2007 | Bernstein et al. |
| 2007/0287224 A1 | 12/2007 | Alam et al. |
| 2007/0296073 A1 | 12/2007 | Wu |
| 2007/0297232 A1 | 12/2007 | Iwata |
| 2008/0001204 A1 | 1/2008 | Lee |
| 2008/0003818 A1 | 1/2008 | Seidel et al. |
| 2008/0030228 A1 | 2/2008 | Amarilio |
| 2008/0032463 A1 | 2/2008 | Lee |
| 2008/0038902 A1 | 2/2008 | Lee |
| 2008/0048239 A1 | 2/2008 | Huo |
| 2008/0048327 A1 | 2/2008 | Lee |
| 2008/0054359 A1 | 3/2008 | Yang et al. |
| 2008/0067573 A1 | 3/2008 | Jang et al. |
| 2008/0070340 A1 | 3/2008 | Borrelli et al. |
| 2008/0072182 A1 | 3/2008 | He et al. |
| 2008/0099780 A1 | 5/2008 | Tran |
| 2008/0099819 A1 | 5/2008 | Kito et al. |
| 2008/0108171 A1 | 5/2008 | Rogers et al. |
| 2008/0123418 A1 | 5/2008 | Widjaja |
| 2008/0124845 A1 | 5/2008 | Yu et al. |
| 2008/0128745 A1 | 6/2008 | Mastro et al. |
| 2008/0128780 A1 | 6/2008 | Nishihara |
| 2008/0135949 A1 | 6/2008 | Lo et al. |
| 2008/0136455 A1 | 6/2008 | Diamant et al. |
| 2008/0142937 A1 | 6/2008 | Chen et al. |
| 2008/0142959 A1 | 6/2008 | DeMulder et al. |
| 2008/0143379 A1 | 6/2008 | Norman |
| 2008/0150579 A1 | 6/2008 | Madurawe |
| 2008/0160431 A1 | 7/2008 | Scott et al. |
| 2008/0160726 A1 | 7/2008 | Lim et al. |
| 2008/0165521 A1 | 7/2008 | Bernstein et al. |
| 2008/0175032 A1 | 7/2008 | Tanaka et al. |
| 2008/0179678 A1 | 7/2008 | Dyer et al. |
| 2008/0180132 A1 | 7/2008 | Ishikawa |
| 2008/0185648 A1 | 8/2008 | Jeong |
| 2008/0191247 A1 | 8/2008 | Yin et al. |
| 2008/0191312 A1 | 8/2008 | Oh et al. |
| 2008/0194068 A1 | 8/2008 | Temmler et al. |
| 2008/0203452 A1 | 8/2008 | Moon et al. |
| 2008/0213982 A1 | 9/2008 | Park et al. |
| 2008/0220558 A1 | 9/2008 | Zehavi et al. |
| 2008/0220565 A1 | 9/2008 | Hsu et al. |
| 2008/0224260 A1 | 9/2008 | Schmit et al. |
| 2008/0237591 A1 | 10/2008 | Leedy |
| 2008/0239818 A1 | 10/2008 | Mokhlesi |
| 2008/0242028 A1 | 10/2008 | Mokhlesi |
| 2008/0248618 A1 | 10/2008 | Ahn et al. |
| 2008/0251862 A1 | 10/2008 | Fonash et al. |
| 2008/0254561 A2 | 10/2008 | Yoo |
| 2008/0254572 A1 | 10/2008 | Leedy |
| 2008/0254623 A1 | 10/2008 | Chan |
| 2008/0261378 A1 | 10/2008 | Yao et al. |
| 2008/0266960 A1 | 10/2008 | Kuo |
| 2008/0272492 A1 | 11/2008 | Tsang |
| 2008/0277778 A1 | 11/2008 | Furman et al. |
| 2008/0283873 A1 | 11/2008 | Yang |
| 2008/0283875 A1 | 11/2008 | Mukasa et al. |
| 2008/0284611 A1 | 11/2008 | Leedy |
| 2008/0296681 A1 | 12/2008 | Georgakos et al. |
| 2008/0315253 A1 | 12/2008 | Yuan |
| 2008/0315351 A1 | 12/2008 | Kakehata |
| 2009/0001469 A1 | 1/2009 | Yoshida et al. |

(56) References Cited

U.S. PATENT DOCUMENTS

| | | |
|---|---|---|
| 2009/0001504 A1 | 1/2009 | Takei et al. |
| 2009/0016716 A1 | 1/2009 | Ishida |
| 2009/0026541 A1 | 1/2009 | Chung |
| 2009/0026618 A1 | 1/2009 | Kim |
| 2009/0032899 A1 | 2/2009 | Irie |
| 2009/0032951 A1 | 2/2009 | Andry et al. |
| 2009/0039918 A1 | 2/2009 | Madurawe |
| 2009/0052827 A1 | 2/2009 | Durfee et al. |
| 2009/0055789 A1 | 2/2009 | McIlrath |
| 2009/0057879 A1 | 3/2009 | Garrou et al. |
| 2009/0061572 A1 | 3/2009 | Hareland et al. |
| 2009/0064058 A1 | 3/2009 | McIlrath |
| 2009/0065827 A1 | 3/2009 | Hwang |
| 2009/0066365 A1 | 3/2009 | Solomon |
| 2009/0066366 A1 | 3/2009 | Solomon |
| 2009/0070721 A1 | 3/2009 | Solomon |
| 2009/0070727 A1 | 3/2009 | Solomon |
| 2009/0078970 A1 | 3/2009 | Yamazaki |
| 2009/0079000 A1 | 3/2009 | Yamazaki et al. |
| 2009/0081848 A1 | 3/2009 | Erokhin |
| 2009/0087759 A1 | 4/2009 | Matsumoto et al. |
| 2009/0096009 A1 | 4/2009 | Dong et al. |
| 2009/0096024 A1 | 4/2009 | Shingu et al. |
| 2009/0108318 A1 | 4/2009 | Yoon et al. |
| 2009/0115042 A1 | 5/2009 | Koyanagi |
| 2009/0128189 A1 | 5/2009 | Madurawe et al. |
| 2009/0134397 A1 | 5/2009 | Yokoi et al. |
| 2009/0144669 A1 | 6/2009 | Bose et al. |
| 2009/0144678 A1 | 6/2009 | Bose et al. |
| 2009/0146172 A1 | 6/2009 | Pumyea |
| 2009/0159870 A1 | 6/2009 | Lin et al. |
| 2009/0160482 A1 | 6/2009 | Karp et al. |
| 2009/0161401 A1 | 6/2009 | Bigler et al. |
| 2009/0162993 A1 | 6/2009 | Yui et al. |
| 2009/0166627 A1 | 7/2009 | Han |
| 2009/0174018 A1 | 7/2009 | Dungan |
| 2009/0179268 A1 | 7/2009 | Abou-Khalil et al. |
| 2009/0185407 A1 | 7/2009 | Park |
| 2009/0194152 A1 | 8/2009 | Liu et al. |
| 2009/0194768 A1 | 8/2009 | Leedy |
| 2009/0194829 A1 | 8/2009 | Chung |
| 2009/0194836 A1 | 8/2009 | Kim |
| 2009/0204933 A1 | 8/2009 | Rezgui |
| 2009/0212317 A1 | 8/2009 | Kolodin et al. |
| 2009/0218627 A1 | 9/2009 | Zhu |
| 2009/0221110 A1 | 9/2009 | Lee et al. |
| 2009/0224330 A1 | 9/2009 | Hong |
| 2009/0224364 A1 | 9/2009 | Oh et al. |
| 2009/0230462 A1 | 9/2009 | Tanaka et al. |
| 2009/0234331 A1 | 9/2009 | Langereis et al. |
| 2009/0236749 A1 | 9/2009 | Otemba et al. |
| 2009/0242893 A1 | 10/2009 | Tomiyasu |
| 2009/0242935 A1 | 10/2009 | Fitzgerald |
| 2009/0250686 A1 | 10/2009 | Sato et al. |
| 2009/0262572 A1 | 10/2009 | Krusin-Elbaum |
| 2009/0262583 A1 | 10/2009 | Lue |
| 2009/0263942 A1 | 10/2009 | Ohnuma et al. |
| 2009/0267233 A1 | 10/2009 | Lee |
| 2009/0268983 A1 | 10/2009 | Stone et al. |
| 2009/0272989 A1 | 11/2009 | Shum et al. |
| 2009/0290434 A1 | 11/2009 | Kurjanowicz |
| 2009/0294822 A1 | 12/2009 | Batude et al. |
| 2009/0294836 A1 | 12/2009 | Kiyotoshi |
| 2009/0294861 A1 | 12/2009 | Thomas et al. |
| 2009/0294990 A1 | 12/2009 | Ishino et al. |
| 2009/0302294 A1 | 12/2009 | Kim |
| 2009/0302387 A1 | 12/2009 | Joshi et al. |
| 2009/0302394 A1 | 12/2009 | Fujita |
| 2009/0309152 A1 | 12/2009 | Knoefler et al. |
| 2009/0315095 A1 | 12/2009 | Kim |
| 2009/0317950 A1 | 12/2009 | Okihara |
| 2009/0321830 A1 | 12/2009 | Maly |
| 2009/0321853 A1 | 12/2009 | Cheng |
| 2009/0321948 A1 | 12/2009 | Wang et al. |
| 2009/0325343 A1 | 12/2009 | Lee |
| 2010/0001282 A1 | 1/2010 | Mieno |
| 2010/0013049 A1 | 1/2010 | Tanaka |
| 2010/0025766 A1 | 2/2010 | Nuttinck et al. |
| 2010/0025825 A1 | 2/2010 | DeGraw et al. |
| 2010/0031217 A1 | 2/2010 | Sinha et al. |
| 2010/0032635 A1 | 2/2010 | Schwerin |
| 2010/0038699 A1 | 2/2010 | Katsumata et al. |
| 2010/0038743 A1 | 2/2010 | Lee |
| 2010/0045849 A1 | 2/2010 | Yamasaki |
| 2010/0052134 A1 | 3/2010 | Werner et al. |
| 2010/0058580 A1 | 3/2010 | Yazdani |
| 2010/0059796 A1 | 3/2010 | Scheuerlein |
| 2010/0059864 A1 | 3/2010 | Mahler et al. |
| 2010/0078770 A1 | 4/2010 | Purushothaman et al. |
| 2010/0081232 A1 | 4/2010 | Furman et al. |
| 2010/0089627 A1 | 4/2010 | Huang et al. |
| 2010/0090188 A1 | 4/2010 | Fatasuyama |
| 2010/0112753 A1 | 5/2010 | Lee |
| 2010/0112810 A1 | 5/2010 | Lee et al. |
| 2010/0117048 A1 | 5/2010 | Lung et al. |
| 2010/0123202 A1 | 5/2010 | Hofmann |
| 2010/0123480 A1 | 5/2010 | Kitada et al. |
| 2010/0133695 A1 | 6/2010 | Lee |
| 2010/0133704 A1 | 6/2010 | Marimuthu et al. |
| 2010/0137143 A1 | 6/2010 | Rothberg et al. |
| 2010/0139836 A1 | 6/2010 | Horikoshi |
| 2010/0140790 A1 | 6/2010 | Setiadi et al. |
| 2010/0155932 A1 | 6/2010 | Gambino |
| 2010/0157117 A1 | 6/2010 | Wang |
| 2010/0159650 A1 | 6/2010 | Song |
| 2010/0181600 A1 | 7/2010 | Law |
| 2010/0190334 A1 | 7/2010 | Lee |
| 2010/0193884 A1 | 8/2010 | Park et al. |
| 2010/0193964 A1 | 8/2010 | Farooq et al. |
| 2010/0219392 A1 | 9/2010 | Awaya |
| 2010/0221867 A1 | 9/2010 | Bedell et al. |
| 2010/0224876 A1 | 9/2010 | Zhu |
| 2010/0224915 A1 | 9/2010 | Kawashima et al. |
| 2010/0225002 A1 | 9/2010 | Law et al. |
| 2010/0232200 A1 | 9/2010 | Shepard |
| 2010/0252934 A1 | 10/2010 | Law |
| 2010/0264551 A1 | 10/2010 | Farooq |
| 2010/0276662 A1 | 11/2010 | Colinge |
| 2010/0289144 A1 | 11/2010 | Farooq |
| 2010/0297844 A1 | 11/2010 | Yelehanka |
| 2010/0307572 A1 | 12/2010 | Bedell et al. |
| 2010/0308211 A1 | 12/2010 | Cho et al. |
| 2010/0308863 A1 | 12/2010 | Gliese et al. |
| 2010/0320514 A1 | 12/2010 | Tredwell |
| 2010/0320526 A1 | 12/2010 | Kidoh et al. |
| 2010/0330728 A1 | 12/2010 | McCarten |
| 2010/0330752 A1 | 12/2010 | Jeong |
| 2011/0001172 A1 | 1/2011 | Lee |
| 2011/0003438 A1 | 1/2011 | Lee |
| 2011/0024724 A1 | 2/2011 | Frolov et al. |
| 2011/0026263 A1 | 2/2011 | Xu |
| 2011/0027967 A1 | 2/2011 | Beyne |
| 2011/0037052 A1 | 2/2011 | Schmidt et al. |
| 2011/0042696 A1 | 2/2011 | Smith et al. |
| 2011/0049336 A1 | 3/2011 | Matsunuma |
| 2011/0050125 A1 | 3/2011 | Medendorp et al. |
| 2011/0053332 A1 | 3/2011 | Lee |
| 2011/0101537 A1 | 5/2011 | Barth et al. |
| 2011/0102014 A1 | 5/2011 | Madurawe |
| 2011/0111560 A1 | 5/2011 | Purushothaman |
| 2011/0115023 A1 | 5/2011 | Cheng |
| 2011/0121366 A1* | 5/2011 | Or-Bach ............ H01L 21/8221 257/204 |
| 2011/0128777 A1 | 6/2011 | Yamazaki |
| 2011/0134683 A1 | 6/2011 | Yamazaki |
| 2011/0143506 A1 | 6/2011 | Lee |
| 2011/0147791 A1 | 6/2011 | Norman et al. |
| 2011/0147849 A1 | 6/2011 | Augendre et al. |
| 2011/0159635 A1 | 6/2011 | Doan et al. |
| 2011/0170331 A1 | 7/2011 | Oh |
| 2011/0204917 A1 | 8/2011 | O'Neill |
| 2011/0221022 A1 | 9/2011 | Toda |
| 2011/0222356 A1 | 9/2011 | Banna |
| 2011/0227158 A1 | 9/2011 | Zhu |

(56) References Cited

U.S. PATENT DOCUMENTS

| | | |
|---|---|---|
| 2011/0241082 A1 | 10/2011 | Bernstein et al. |
| 2011/0284946 A1 | 11/2011 | Kiyotoshi |
| 2011/0284992 A1 | 11/2011 | Zhu |
| 2011/0286283 A1 | 11/2011 | Lung et al. |
| 2011/0304765 A1 | 12/2011 | Yogo et al. |
| 2011/0309432 A1 | 12/2011 | Ishihara et al. |
| 2011/0314437 A1 | 12/2011 | McIlrath |
| 2012/0001184 A1 | 1/2012 | Ha et al. |
| 2012/0003815 A1 | 1/2012 | Lee |
| 2012/0013013 A1 | 1/2012 | Sadaka et al. |
| 2012/0025388 A1 | 2/2012 | Law et al. |
| 2012/0032250 A1 | 2/2012 | Son et al. |
| 2012/0034759 A1 | 2/2012 | Sakaguchi et al. |
| 2012/0063090 A1 | 3/2012 | Hsiao et al. |
| 2012/0074466 A1 | 3/2012 | Setiadi et al. |
| 2012/0086100 A1 | 4/2012 | Andry |
| 2012/0126197 A1 | 5/2012 | Chung |
| 2012/0146193 A1 | 6/2012 | Stuber et al. |
| 2012/0161310 A1 | 6/2012 | Brindle et al. |
| 2012/0169319 A1 | 7/2012 | Dennard |
| 2012/0178211 A1 | 7/2012 | Hebert |
| 2012/0181654 A1 | 7/2012 | Lue |
| 2012/0182801 A1 | 7/2012 | Lue |
| 2012/0187444 A1 | 7/2012 | Oh |
| 2012/0193785 A1 | 8/2012 | Lin |
| 2012/0241919 A1 | 9/2012 | Mitani |
| 2012/0286822 A1 | 11/2012 | Madurawe |
| 2012/0304142 A1 | 11/2012 | Morimoto |
| 2012/0317528 A1 | 12/2012 | McIlrath |
| 2012/0319728 A1 | 12/2012 | Madurawe |
| 2013/0026663 A1 | 1/2013 | Radu et al. |
| 2013/0037802 A1 | 2/2013 | England |
| 2013/0049796 A1 | 2/2013 | Pang |
| 2013/0070506 A1 | 3/2013 | Kajigaya |
| 2013/0082235 A1 | 4/2013 | Gu et al. |
| 2013/0097574 A1 | 4/2013 | Balabanov et al. |
| 2013/0100743 A1 | 4/2013 | Lue |
| 2013/0128666 A1 | 5/2013 | Avila |
| 2013/0187720 A1 | 7/2013 | Ishii |
| 2013/0193550 A1 | 8/2013 | Sklenard et al. |
| 2013/0196500 A1 | 8/2013 | Batude et al. |
| 2013/0203248 A1 | 8/2013 | Ernst et al. |
| 2013/0207243 A1 | 8/2013 | Fuergut et al. |
| 2013/0263393 A1 | 10/2013 | Mazumder |
| 2013/0337601 A1 | 12/2013 | Kapur |
| 2014/0015136 A1 | 1/2014 | Gan et al. |
| 2014/0030871 A1 | 1/2014 | Arriagada et al. |
| 2014/0035616 A1 | 2/2014 | Oda et al. |
| 2014/0048867 A1 | 2/2014 | Toh |
| 2014/0099761 A1 | 4/2014 | Kim et al. |
| 2014/0103959 A1 | 4/2014 | Andreev |
| 2014/0117413 A1 | 5/2014 | Madurawe |
| 2014/0120695 A1 | 5/2014 | Ohtsuki |
| 2014/0131885 A1 | 5/2014 | Samadi et al. |
| 2014/0137061 A1 | 5/2014 | McIlrath |
| 2014/0145347 A1 | 5/2014 | Samadi et al. |
| 2014/0146630 A1 | 5/2014 | Xie et al. |
| 2014/0149958 A1 | 5/2014 | Samadi et al. |
| 2014/0151774 A1 | 6/2014 | Rhie |
| 2014/0191357 A1 | 7/2014 | Lee |
| 2014/0225218 A1 | 8/2014 | Du |
| 2014/0225235 A1 | 8/2014 | Du |
| 2014/0252306 A1 | 9/2014 | Du |
| 2014/0253196 A1 | 9/2014 | Du et al. |
| 2014/0264228 A1 | 9/2014 | Toh |
| 2014/0357054 A1 | 12/2014 | Son et al. |
| 2015/0021785 A1 | 1/2015 | Lin |
| 2015/0034898 A1 | 2/2015 | Wang |
| 2015/0243887 A1 | 8/2015 | Saitoh |
| 2015/0255418 A1 | 9/2015 | Gowda |
| 2015/0279829 A1 | 10/2015 | Kuo |
| 2015/0340369 A1 | 11/2015 | Lue |
| 2016/0049201 A1 | 2/2016 | Lue |
| 2016/0104780 A1 | 4/2016 | Mauder |
| 2016/0133603 A1 | 5/2016 | Ahn |
| 2016/0141299 A1 | 5/2016 | Hong |
| 2016/0141334 A1 | 5/2016 | Takaki |
| 2016/0307952 A1 | 10/2016 | Huang |
| 2016/0343687 A1 | 11/2016 | Vadhavkar |
| 2017/0069601 A1 | 3/2017 | Park |
| 2017/0092371 A1 | 3/2017 | Harari |
| 2017/0098596 A1 | 4/2017 | Lin |
| 2017/0148517 A1 | 5/2017 | Harari |
| 2017/0179146 A1 | 6/2017 | Park |
| 2017/0221900 A1 | 8/2017 | Widjaja |
| 2017/0278858 A1 | 9/2017 | Walker et al. |
| 2018/0090219 A1 | 3/2018 | Harari |
| 2018/0090368 A1 | 3/2018 | Kim |
| 2018/0108416 A1 | 4/2018 | Harari |
| 2018/0294284 A1 | 10/2018 | Tarakji |
| 2019/0006009 A1 | 1/2019 | Harari |
| 2019/0043836 A1 | 2/2019 | Fastow et al. |
| 2019/0067327 A1 | 2/2019 | Herner et al. |
| 2019/0157296 A1 | 5/2019 | Harari et al. |
| 2020/0020408 A1 | 1/2020 | Norman et al. |
| 2020/0020718 A1 | 1/2020 | Harari et al. |
| 2020/0051990 A1 | 2/2020 | Harari et al. |
| 2020/0105773 A1 | 4/2020 | Morris et al. |
| 2020/0227123 A1 | 7/2020 | Salahuddin et al. |
| 2020/0243486 A1 | 7/2020 | Quader et al. |

OTHER PUBLICATIONS

Kim, J.Y., et al., "The breakthrough in data retention time of DRAM using Recess-Channel-Array Transistor (RCAT) for 88 nm feature size and beyond," 2003 Symposium on VLSI Technology Digest of Technical Papers, pp. 11-12, Jun. 10-12, 2003.

Kim, J.Y., et al., "The excellent scalability of the RCAT (recess-channel-array-transistor) technology for sub-70nm DRAM feature size and beyond," 2005 IEEE VLSI-TSA International Symposium, pp. 33-34, Apr. 25-27, 2005.

Abramovici, Breuer and Friedman, Digital Systems Testing and Testable Design, Computer Science Press, 1990, pp. 432-447.

Yonehara, T., et al., "ELTRAN: SOI-Epi Wafer by Epitaxial Layer transfer from porous Silicon", the 198th Electrochemical Society Meeting, abstract No. 438 (2000).

Yonehara, T. et al., "Eltran®, Novel SOI Wafer Technology," JSAP International, Jul. 2001, pp. 10-16, No. 4.

Suk, S. D., et al., "High performance 5 nm radius twin silicon nanowire MOSFET(TSNWFET): Fabrication on bulk Si wafer, characteristics, and reliability," in Proc. IEDM Tech. Dig., 2005, pp. 717-720.

Bangsaruntip, S., et al., "High performance and highly uniform gate-all-around silicon nanowire MOSFETs with wire size dependent scaling," Electron Devices Meeting (IEDM), 2009 IEEE International, pp. 297-300, Dec. 7-9, 2009.

Burr, G. W., et al., "Overview of candidate device technologies for storage-class memory," IBM Journal of Research and Development, vol. 52, No. 4.5, pp. 449-464, Jul. 2008.

Bez, R., et al., "Introduction to Flash memory," Proceedings IEEE, 91(4), 489-502 (2003).

Auth, C., et al., "45nm High-k + Metal Gate Strain-Enchanced Transistors," Symposium on VLSI Technology Digest of Technical Papers, 2008, pp. 128-129.

Jan, C. H., et al., "A 32nm SoC Platform Technology with 2nd Generation High-k/Metal Gate Transistors Optimized for Ultra Low Power, High Performance, and High Density Product Applications," IEEE International Electronic Devices Meeting (IEDM), Dec. 7-9, 2009, pp. 1-4.

Mistry, K., "A 45nm Logic Technology With High-K+Metal Gate Transistors, Strained Silicon, 9 Cu Interconnect Layers, 193nm Dry Patterning, and 100% Pb-Free Packaging," Electron Devices Meeting, 2007, IEDM 2007, IEEE International, Dec. 10-12, 2007, p. 247.

Ragnarsson, L., et al., "Ultralow-EOT (5 Å) Gate-First and Gate-Last High Performance CMOS Achieved by Gate-Electrode Optimization," IEDM Tech. Dig., pp. 663-666, 2009.

(56) References Cited

OTHER PUBLICATIONS

Sen, P & Kim, C.J., "A Fast Liquid-Metal Droplet Microswitch Using EWOD-Driven Contact-Line Sliding", Journal of Microelectromechanical Systems, vol. 18, No. 1, Feb. 2009, pp. 174-185.
Iwai, H., et al., "NiSi Salicide Technology for Scaled CMOS," Microelectronic Engineering, 60 (2002), pp. 157-169.
Froment, B., et.al., "Nickel vs. Cobalt Silicide integration for sub-50nm CMOS", IMEC ESS Circuits, 2003. pp. 215-219.
James, D., "65 and 45-nm Devices—an Overview", Semicon West, Jul. 2008, paper No. ctr_024377.
Davis, J.A., et.al., "Interconnect Limits on Gigascale Integration(GSI) in the 21st Century", Proc. IEEE, vol. 89, No. 3, pp. 305-324, Mar. 2001.
Shino, T., et al., "Floating Body RAM Technology and its Scalability to 32nm Node and Beyond," Electron Devices Meeting, 2006, IEDM '06, International, pp. 1-4, Dec. 11-13, 2006.
Hamamoto, T., et al., "Overview and future challenges of floating body RAM (FBRAM) technology for 32 nm technology node and beyond", Solid-State Electronics, vol. 53, Issue 7, Papers Selected from the 38th European Solid-State Device Research Conference—ESSDERC'08, Jul. 2009, pp. 676-683.
Okhonin, S., et al., "New Generation of Z-RAM", Electron Devices Meeting, 2007. IEDM 2007. IEEE International, pp. 925-928, Dec. 10-12, 2007.
Henttinen, K. et al., "Mechanically Induced Si Layer Transfer in Hydrogen-Implanted Si Wafers," Applied Physics Letters, Apr. 24, 2000, p. 2370-2372, vol. 76, No. 17.
Lee, C.-W., et al., "Junctionless multigate field-effect transistor," Applied Physics Letters, vol. 94, p. 053511-1 to 053511-2, 2009.
Park, S. G., et al., "Implementation of HfSiON gate dielectric for sub-60nm DRAM dual gate oxide with recess channel array transistor (RCAT) and tungsten gate," International Electron Devices Meeting, IEDM 2004, pp. 515-518, Dec. 13-15, 2004.
Kim, J.Y., et al., "S-RCAT (sphere-shaped-recess-channel-array transistor) technology for 70nm DRAM feature size and beyond," 2005 Symposium on VLSI Technology Digest of Technical Papers, 2005 pp. 34-35, Jun. 14-16, 2005.
Oh, H.J., et al., "High-density low-power-operating DRAM device adopting 6F2 cell scheme with novel S-RCAT structure on 80nm feature size and beyond," Solid-State Device Research Conference, ESSDERC 2005. Proceedings of 35th European , pp. 177-180, Sep. 12-16, 2005.
Chung, S.-W., et al., "Highly Scalable Saddle-Fin (S-Fin) Transistor for Sub-50nm DRAM Technology," 2006 Symposium on VLSI Technology Digest of Technical Papers, pp. 32-33.
Lee, M. J., et al., "A Proposal on an Optimized Device Structure With Experimental Studies on Recent Devices for the DRAM Cell Transistor," IEEE Transactions on Electron Devices, vol. 54, No. 12, pp. 3325-3335, Dec. 2007.
Henttinen, K. et al., "Cold ion-cutting of hydrogen implanted Si," J. Nucl. Instr. and Meth. in Phys. Res. B, 2002, pp. 761-766, vol. 190.
Brumfiel, G., "Solar cells sliced and diced", May 19, 2010, Nature News.
Dragoi, et al., "Plasma-activated wafer bonding: the new low-temperature tool for MEMS fabrication", Proc. SPIE, vol. 6589, 65890T (2007).
Vengurlekar, A., et al., "Mechanism of Dopant Activation Enhancement in Shallow Junctions by Hydrogen", Proceedings of the Materials Research Society, vol. 864, Spring 2005, E9.28.1-6.
Yamada, M. et al., "Phosphor Free High-Luminous-Efficiency White Light-Emitting Diodes Composed of InGaN Multi-Quantum Well," Japanese Journal of Applied Physics, 2002, pp. L246-L248, vol. 41.
Guo, X. et al., "Cascade single-chip phosphor-free white light emitting diodes," Applied Physics Letters, 2008, pp. 013507-1-013507-3, vol. 92.
Takafuji, Y. et al., "Integration of Single Crystal Si TFTs and Circuits on a Large Glass Substrate," IEEE International Electron Devices Meeting (IEDM), Dec. 7-9, 2009, pp. 1-4.

Wierer, J.J. et al., "High-power AlGaInN flip-chip light-emitting diodes," Applied Physics Letters, May 28, 2001, pp. 3379-3381, vol. 78, No. 22.
El-Gamal, A., "Trends in CMOS Image Sensor Technology and Design," International Electron Devices Meeting Digest of Technical Papers, Dec. 2002.
Ahn, S.W., "Fabrication of a 50 nm half-pitch wire grid polarizer using nanoimprint lithography," Nanotechnology, 2005, pp. 1874-1877, vol. 16, No. 9.
Johnson, R.C., "Switching LEDs on and off to enlighten wireless communications," EE Times, Jun. 2010, last accessed Oct. 11, 2010, <http://www.embeddedinternetdesign.com/design/225402094>.
Ohsawa, et al., "Autonomous Refresh of Floating Body Cell (FBC)", International Electron Device Meeting, 2008, pp. 801-804.
Chen, P., et al., "Effects of Hydrogen Implantation Damage on the Performance of InP/InGaAs/InP p-i-n Photodiodes, Transferred on Silicon," Applied Physics Letters, vol. 94, No. 1, Jan. 2009, pp. 012101-1 to 012101-3.
Lee, D., et al., "Single-Crystalline Silicon Micromirrors Actuated by Self-Aligned Vertical Electrostatic Combdrives with Piston-Motion and Rotation Capability," Sensors and Actuators A114, 2004, pp. 423-428.
Shi, X., et al., "Characterization of Low-Temperature Processed Single-Crystalline Silicon Thin-Film Transistor on Glass," IEEE Electron Device Letters, vol. 24, No. 9, Sep. 2003, pp. 574-576.
Chen, W., et al., "InP Layer Transfer with Masked Implantation," Electrochemical and Solid-State Letters, Issue 12, No. 4, Apr. 2009, H149-150.
Feng, J., et al., "Integration of Germanium-on-Insulator and Silicon MOSFETs on a Silicon Substrate," IEEE Electron Device Letters, vol. 27, No. 11, Nov. 2006, pp. 911-913.
Zhang, S., et al., "Stacked CMOS Technology on SOI Substrate," IEEE Electron Device Letters, vol. 25, No. 9, Sep. 2004, pp. 661-663.
Brebner, G., "Tooling up for Reconfigurable System Design," IEE Colloquium on Reconfigurable Systems, 1999, Ref. No. 1999/061, pp. 2/1-2/4.
Bae, Y.-D., "A Single-Chip Programmable Platform Based on a Multithreaded Processor and Configurable Logic Clusters," 2002 IEEE International Solid-State Circuits Conference, Feb. 3-7, 2002, Digest of Technical Papers, ISSCC, vol. 1, pp. 336-337.
Lu, N.C.C., et al., "A Buried-Trench DRAM Cell Using a Self-aligned Epitaxy Over Trench Technology," Electron Devices Meeting, IEDM '88 Technical Digest, International, 1988, pp. 588-591.
Valsamakis, E.A., "Generator for a Custom Statistical Bipolar Transistor Model," IEEE Journal of Solid-State Circuits, Apr. 1985, pp. 586-589, vol. SC-20, No. 2.
Srivastava, P. et al., "Silicon Substrate Removal of GaN DHFETs for enhanced (>1100V) Breakdown Voltage," Aug. 2010, IEEE Electron Device Letters, vol. 31, No. 8, pp. 851-852.
Gosele, U., et al., "Semiconductor Wafer Bonding," Annual Review of Materials Science, Aug. 1998, pp. 215-241, vol. 28.
Spangler, L.J. et al., "A Technology for High Performance Single-Crystal Silicon-on-Insulator Transistors," IEEE Electron Device Letters, Apr. 1987, pp. 137-139, vol. 8, No. 4.
Larrieu, G., et al., "Low Temperature Implementation of Dopant-Segregated Band-edger Metallic S/D junctions in Thin-Body SOI p-MOSFETs", Proceedings IEDM, 2007, pp. 147-150.
Qui, Z., et al., "A Comparative Study of Two Different Schemes to Dopant Segregation at NiSi/Si and PtSi/Si Interfaces for Schottky Barrier Height Lowering", IEEE Transactions on Electron Devices, vol. 55, No. 1, Jan. 2008, pp. 396-403.
Khater, M.H., et al., "High-k/Metal-Gate Fully Depleted SOI CMOS With Single-Silicide Schottky Source/Drain With Sub-30-nm Gate Length", IEEE Electron Device Letters, vol. 31, No. 4, Apr. 2010, pp. 275-277.
Abramovici, M., "In-system silicon validation and debug", (2008) IEEE Design and Test of Computers, 25 (3), pp. 216-223.
Saxena, P., et al., "Repeater Scaling and Its Impact on CAD", IEEE Transactions On Computer-Aided Design of Integrated Circuits and Systems, vol. 23, No. 4, Apr. 2004.

(56) References Cited

OTHER PUBLICATIONS

Abrmovici, M., et al., A reconfigurable design-for-debug infrastructure for SoCs, (2006) Proceedings—Design Automation Conference, pp. 7-12.
Anis, E., et al., "Low cost debug architecture using lossy compression for silicon debug", (2007) Proceedings of the IEEE/ACM Design, pp. 225-230.
Anis, E., et al., "On using lossless compression of debug data in embedded logic analysis", (2007) Proceedings of the IEEE International Test Conference, paper 18.3, pp. 1-10.
Boule, M., et al., "Adding debug enhancements to assertion checkers for hardware emulation and silicon debug", (2006) Proceedings of the IEEE International Conference on Computer Design, pp. 294-299.
Boule, M., et al., "Assertion checkers in verification, silicon debug and in-field diagnosis", (2007) Proceedings—Eighth International Symposium on Quality Electronic Design, ISQED 2007, pp. 613-618.
Burtscher, M., et al., "The VPC trace-compression algorithms", (2005) IEEE Transactions on Computers, 54 (11), Nov. 2005, pp. 1329-1344.
Frieden, B., "Trace port on powerPC 405 cores", (2007) Electronic Product Design, 28 (6), pp. 12-14.
Hopkins, A.B.T., et al., "Debug support for complex systems on-chip: A review", (2006) IEEE Proceedings: Computers and Digital Techniques, 153 (4), Jul. 2006, pp. 197-207.
Hsu, Y.-C., et al., "Visibility enhancement for silicon debug", (2006) Proceedings—Design Automation Conference, Jul. 24-28, 2006, San Francisco, pp. 13-18.
Josephson, D., et al., "The crazy mixed up world of silicon debug", (2004) Proceedings of the Custom Integrated Circuits Conference, paper 30-1, pp. 665-670.
Josephson, D.D., "The manic depression of microprocessor debug", (2002) IEEE International Test Conference (TC), paper 23.4, pp. 657-663.
Ko, H.F., et al., "Algorithms for state restoration and trace-signal selection for data acquisition in silicon debug", (2009) IEEE Transactions on Computer-Aided Design of Integrated Circuits and Systems, 28 (2), pp. 285-297.
Ko, H.F., et al., "Distributed embedded logic analysis for post-silicon validation of SOCs", (2008) Proceedings of the IEEE International Test Conference, paper 16.3, pp. 755-763.
Ko, H.F., et al., "Functional scan chain design at RTL for skewed-load delay fault testing", (2004) Proceedings of the Asian Test Symposium, pp. 454-459.
Ko, H.F., et al., "Resource-efficient programmable trigger units for post-silicon validation", (2009) Proceedings of the 14th IEEE European Test Symposium, ETS 2009, pp. 17-22.
Liu, X., et al., "On reusing test access mechanisms for debug data transfer in SoC post-silicon validation", (2008) Proceedings of the Asian Test Symposium, pp. 303-308.
Liu, X., et al., "Trace signal selection for visibility enhancement in post-silicon validation", (2009) Proceedings Date, pp. 1338-1343.
McLaughlin, R., et al., "Automated debug of speed path failures using functional tests", (2009) Proceedings of the IEEE VLSI Test Symposium, pp. 91-96.
Morris, K., "On-Chip Debugging—Built-in Logic Analyzers on your FPGA", (2004) Journal of FPGA and Structured ASIC, 2 (3).
Nicolici, N., et al., "Design-for-debug for post-silicon validation: Can high-level descriptions help?", (2009) Proceedings—IEEE International High-Level Design Validation and Test Workshop, HLDVT, pp. 172-175.
Park, S.-B., et al., "IFRA: Instruction Footprint Recording and Analysis for Post-Silicon Bug Localization", (2008) Design Automation Conference (DAC08), Jun. 8-13, 2008, Anaheim, CA, USA, pp. 373-378.
Park, S.-B., et al., "Post-silicon bug localization in processors using instruction footprint recording and analysis (IFRA)", (2009) IEEE Transactions on Computer-Aided Design of Integrated Circuits and Systems, 28 (10), pp. 1545-1558.
Moore, B., et al., "High Throughput Non-contact SiP Testing", (2007) Proceedings—International Test Conference, paper 12.3.
Riley, M.W., et al., "Cell broadband engine debugging for unknown events", (2007) IEEE Design and Test of Computers, 24 (5), pp. 486-493.
Vermeulen, B., "Functional debug techniques for embedded systems", (2008) IEEE Design and Test of Computers, 25 (3), pp. 208-215.
Vermeulen, B., et al., "Automatic Generation of Breakpoint Hardware for Silicon Debug", Proceeding of the 41st Design Automation Conference, Jun. 7-11, 2004, p. 514-517.
Vermeulen, B., et al., "Design for debug: Catching design errors in digital chips", (2002) IEEE Design and Test of Computers, 19 (3), pp. 37-45.
Vermeulen, B., et al., "Core-based scan architecture for silicon debug", (2002) IEEE International Test Conference (TC), pp. 638-647.
Vanrootselaar, G. J., et al., "Silicon debug: scan chains alone are not enough", (1999) IEEE International Test Conference (TC), pp. 892-902.
Kim, G.-S., et al., "A 25-mV-sensitivity 2-Gb/s optimum-logic-threshold capacitive-coupling receiver for wireless wafer probing systems", (2009) IEEE Transactions on Circuits and Systems II: Express Briefs, 56 (9), pp. 709-713.
Sellathamby, C.V., et al., "Non-contact wafer probe using wireless probe cards", (2005) Proceedings—International Test Conference, 2005, pp. 447-452.
Jung, S.-M., et al., "Soft Error Immune 0.46pm2 SRAM Cell with MIM Node Capacitor by 65nm CMOS Technology for Ultra High Speed SRAM", IEDM 2003, pp. 289-292.
Brillouet, M., "Emerging Technologies on Silicon", IEDM 2004, pp. 17-24.
Meindl, J. D., "Beyond Moore's Law: The Interconnect Era", IEEE Computing in Science & Engineering, Jan./Feb. 2003, pp. 20-24.
Lin, X., et al., "Local Clustering 3-D Stacked CMOS Technology for Interconnect Loading Reduction", IEEE Transactions on electron Devices, vol. 53, No. 6, Jun. 2006, pp. 1405-1410.
He, T., et al., "Controllable Molecular Modulation of Conductivity in Silicon-Based Devices", J. Am. Chem. Soc. 2009, 131, 10023-10030.
Henley, F., "Engineered Substrates Using the Nanocleave Process", SemiconWest, TechXPOT Conference—Challenges in Device Scaling, Jul. 19, 2006, San Francisco.
Diamant, G., et al., "Integrated Circuits based on Nanoscale Vacuum Phototubes", Applied Physics Letters 92, 262903-1 to 262903-3 (2008).
Landesberger, C., et al., "Carrier techniques for thin wafer processing", CS Mantech Conference, May 14-17, 2007 Austin, Texas, pp. 33-36.
Shen, W., et al., "Mercury Droplet Micro switch for Re-configurable Circuit Interconnect", The 12th International Conference on Solid State Sensors, Actuators and Microsystems. Boston, Jun. 8-12, 2003, pp. 464-467.
Bangsaruntip, S., et al., "Gate-all-around Silicon Nanowire 25-Stage CMOS Ring Oscillators with Diameter Down to 3 nm", 2010 Symposium on VLSI Technology Digest of papers, pp. 21-22.
Borland, J.O., "Low Temperature Activation Of Ion Implanted Dopants: A Review", International Workshop on Junction technology 2002, S7-3, Japan Society of Applied Physics, pp. 85-88.
Vengurlekar, A., et al., "Hydrogen Plasma Enhancement of Boron Activation in Shallow Junctions", Applied Physics Letters, vol. 85, No. 18, Nov. 1, 2004, pp. 4052-4054.
El-Maleh, A. H., et al., "Transistor-Level Defect Tolerant Digital System Design at the Nanoscale", Research Proposal Submitted to Internal Track Research Grant Programs, 2007. Internal Track Research Grant Programs.
Austin, T., et al., "Reliable Systems on Unreliable Fabrics", IEEE Design & Test of Computers, Jul./Aug. 2008, vol. 25, issue 4, pp. 322-332.
Borkar, S., "Designing Reliable Systems from Unreliable Components: The Challenges of Transistor Variability and Degradation", IEEE Micro, IEEE Computer Society, Nov.-Dec. 2005, pp. 10-16.

(56) References Cited

OTHER PUBLICATIONS

Zhu, S., et al., "N-Type Schottky Barrier Source/Drain MOSFET Using Ytterbium Silicide", IEEE Electron Device Letters, vol. 25, No. 8, Aug. 2004, pp. 565-567.

Zhang, Z., et al., "Sharp Reduction of Contact Resistivities by Effective Schottky Barrier Lowering With Silicides as Diffusion Sources," IEEE Electron Device Letters, vol. 31, No. 7, Jul. 2010, pp. 731-733.

Lee, R. T.P., et al., "Novel Epitaxial Nickel Aluminide-Silicide with Low Schottky-Barrier and Series Resistance for Enhanced Performance of Dopant-Segregated Source/Drain N-channel MuGFETs", 2007 Symposium on VLSI Technology Digest of Technical Papers, pp. 108-109.

Awano, M., et al., "Advanced DSS MOSFET Technology for Ultrahigh Performance Applications", 2008 Symposium on VLSI Technology Digest of Technical Papers, pp. 24-25.

Choi, S.-J., et al., "Performance Breakthrough in NOR Flash Memory with Dopant-Segregated Schottky-Barrier (DSSB) Sonos Devices", 2009 Symposium of VLSI Technology Digest, pp. 222-223.

Zhang, M., et al., "Schottky barrier height modulation using dopant segregation in Schottky-barrier SOI-MOSFETs", Proceeding of ESSDERC, Grenoble, France, 2005, pp. 457-460.

Larrieu, G., et al., "Arsenic-Segregated Rare-Earth Silicide Junctions: Reduction of Schottky Barrier and Integration in Metallic n-MOSFETs on SOI", IEEE Electron Device Letters, vol. 30, No. 12, Dec. 2009, pp. 1266-1268.

Ko, C.H., et al., "NiSi Schottky Barrier Process-Strained Si (SB—PSS) CMOS Technology for High Performance Applications", 2006 Symposium on VLSI Technology Digest of Technical Papers.

Kinoshita, A., et al., "Solution for High-Performance Schottky-Source/Drain MOSFETs: Schottky Barrier Height Engineering with Dopant Segregation Technique", 2004 Symposium on VLSI Technology Digest of Technical Papers, pp. 168-169.

Kinoshita, A., et al., "High-performance 50-nm-Gate-Length Schottky-Source/Drain MOSFETs with Dopant-Segregation Junctions", 2005 Symposium on VLSI Technology Digest of Technical Papers, pp. 158-159.

Kaneko, A., et al., "High-Performance FinFET with Dopant-Segregated Schottky Source/Drain", IEDM 2006.

Kinoshita, A., et al., "Ultra Low Voltage Operations in Bulk CMOS Logic Circuits with Dopant Segregated Schottky Source/Drain Transistors", IEDM 2006.

Kinoshita, A., et al., "Comprehensive Study on Injection Velocity Enhancement in Dopant-Segregated Schottky MOSFETs", IEDM 2006.

Choi, S.-J., et al., "High Speed Flash Memory and 1T-DRAM on Dopant Segregated Schottky Barrier (DSSB) FinFET Sonos Device for Multi-functional SoC Applications", 2008 IEDM, pp. 223-226.

Chin, Y.K., et al., "Excimer Laser-Annealed Dopant Segregated Schottky (ELA-DSS) Si Nanowire Gate-All-Around (GAA) pFET with Near Zero Effective Schottky Barrier Height (SBH)", IEDM 2009, pp. 935-938.

Agoura Technologies white paper, "Wire Grid Polarizers: a New High Contrast Polarizer Technology for Liquid Crystal Displays", 2008, pp. 1-12.

Unipixel Displays, Inc. white paper, "Time Multi-plexed Optical Shutter (TMOS) Displays", Jun. 2007, pp. 1-49.

Azevedo, I. L., et al., "The Transition to Solid-State Lighting", Proc. IEEE, vol. 97, No. 3, Mar. 2009, pp. 481-510.

Crawford, M.H., "LEDs for Solid-State Lighting: Performance Challenges and Recent Advances", IEEE Journal of Selected Topics in Quantum Electronics, vol. 15, No. 4, Jul./Aug. 2009, pp. 1028-1040.

Tong, Q.-Y., et al., "A "smarter-cut" approach to low temperature silicon layer transfer", Applied Physics Letters, vol. 72, No. 1, Jan. 5, 1998, pp. 49-51.

Tong, Q.-Y., et al., "Low Temperature Si Layer Splitting", Proceedings 1997 IEEE International SOI Conference, Oct. 1997, pp. 126-127.

Nguyen, P., et al., "Systematic study of the splitting kinetic of H/He co-implanted substrate", SOI Conference, 2003, pp. 132-134.

Ma, X., et al., "A high-quality SOI structure fabricated by low-temperature technology with B+/H+ co-implantation and plasma bonding", Semiconductor Science and Technology, vol. 21, 2006, pp. 959-963.

Yu, C.Y., et al., "Low-temperature fabrication and characterization of Ge-on-insulator structures", Applied Physics Letters, vol. 89, 101913-1 to 101913-2 (2006).

Li, Y. A., et al., "Surface Roughness of Hydrogen Ion Cut Low Temperature Bonded Thin Film Layers", Japan Journal of Applied Physics, vol. 39 (2000), Part 1, No. 1, pp. 275-276.

Hoechbauer, T., et al., "Comparison of thermally and mechanically induced Si layer transfer in hydrogen-implanted Si wafers", Nuclear Instruments and Methods in Physics Research B, vol. 216 (2004), pp. 257-263.

Aspar, B., et al., "Transfer of structured and patterned thin silicon films using the Smart-Cut process", Electronics Letters, Oct. 10, 1996, vol. 32, No. 21, pp. 1985-1986.

Agarwal, A., et al., "Efficient production of silicon-on-insulator films by co-implantation of He+ with H+" Applied Physics Letters, vol. 72, No. 9, Mar. 1998, pp. 1086-1088.

Cook III, G. O., et al., "Overview of transient liquid phase and partial transient liquid phase bonding," Journal of Material Science, vol. 46, 2011, pp. 5305-5323.

Moustris, G. P., et al., "Evolution of autonomous and semi-autonomous robotic surgical systems: a review of the literature," International Journal of Medical Robotics and Computer Assisted Surgery, Wiley Online Library, 2011, DOI: 10.10002/rcs.408.

Subbarao, M., et al., "Depth from Defocus: A Spatial Domain Approach," International Journal of Computer Vision, vol. 13, No. 3, pp. 271-294 (1994).

Subbarao, M., et al., "Focused Image Recovery from Two Defocused Images Recorded with Different Camera Settings," IEEE Transactions on Image Processing, vol. 4, No. 12, Dec. 1995, pp. 1613-1628.

Guseynov, N. A., et al., "Ultrasonic Treatment Restores the Photoelectric Parameters of Silicon Solar Cells Degraded under the Action of 60Cobalt Gamma Radiation," Technical Physics Letters, vol. 33, No. 1, pp. 18-21 (2007).

Gawlik, G., et al., "GaAs on Si: towards a low-temperature "smart-cut" technology", Vacuum, vol. 70, pp. 103-107 (2003).

Weldon, M. K., et al., "Mechanism of Silicon Exfoliation Induced by Hydrogen/Helium Co-implantation," Applied Physics Letters, vol. 73, No. 25, pp. 3721-3723 (1998).

Miller, D.A.B., "Optical interconnects to electronic chips," Applied Optics, vol. 49, No. 25, Sep. 1, 2010, pp. F59-F70.

En, W. G., et al., "The Genesis Process": A New SOI wafer fabrication method, Proceedings 1998 IEEE International SOI Conference, Oct. 1998, pp. 163-164.

Uchikoga, S., et al., "Low temperature poly-Si TFT-LCD by excimer laser anneal," Thin Solid Films, vol. 383 (2001), pp. 19-24.

He, M., et al., "Large Polycrystalline Silicon Grains Prepared by Excimer Laser Crystallization of Sputtered Amorphous Silicon Film with Process Temperature at 100 C," Japanese Journal of Applied Physics, vol. 46, No. 3B, 2007, pp. 1245-1249.

Kim, S.D., et al., "Advanced source/drain engineering for box-shaped ultra shallow junction formation using laser annealing and pre-amorphization implantation in sub-100-nm SOI CMOS," IEEE Trans. Electron Devices, vol. 49, No. 10, pp. 1748-1754, Oct. 2002.

Ahn, J., et al., "High-quality MOSFET's with ultrathin LPCVD gate SiO2," IEEE Electron Device Lett., vol. 13, No. 4, pp. 186-188, Apr. 1992.

Yang, M., et al., "High Performance CMOS Fabricated on Hybrid Substrate with Different Crystal Orientation," Proceedings IEDM 2003.

Yin, H., et al., "Scalable 3-D finlike poly-Si TFT and its nonvolatile memory application," IEEE Trans. Electron Devices, vol. 55, No. 2, pp. 578-584, Feb. 2008.

Kawaguchi, N., et al., "Pulsed Green-Laser Annealing for Single-Crystalline Silicon Film Transferred onto Silicon wafer and Non-alkaline Glass by Hydrogen-Induced Exfoliation," Japanese Journal of Appl,ied Physics, vol. 46, No. 1, 2007, pp. 21-23.

(56) References Cited

OTHER PUBLICATIONS

Faynot, O. et al., "Planar Fully depleted SOI technology: A Powerful architecture for the 20nm node and beyond," Electron Devices Meeting (IEDM), 2010 IEEE International, vol. No., pp. 3.2.1, 3.2.4, Dec. 6-8, 2010.

Khakifirooz, A., "ETSOI Technology for 20nm and Beyond", SOI Consortium Workshop: Fully Depleted SOI, Apr. 28, 2011, Hsinchu Taiwan.

Kim, I.-K., et al.,"Advanced Integration Technology for a Highly Scalable SOI DRAM with SOC (Silicon-On-Capacitors)", IEDM 1996, pp. 96-605-608, 22.5.4.

Lee, B.H., et al., "A Novel CMP Method for cost-effective Bonded SOI Wafer Fabrication," Proceedings 1995 IEEE International SOI Conference, Oct. 1995, pp. 60-61.

Choi, Sung-Jin, et al., "Performance Breakthrough in NOR Flash Memory with Dopant-Segregated Schottky-Barrier (DSSB) Sonos Devices," paper 11B-3, 2009 Symposium on VLSI Technology, Digest of Technical Papers, pp. 222-223.

Chang, Wei, et al., "Drain-induced Schottky barrier source-side hot carriers and its application to program local bits of nanowire charge-trapping memories," Japanese Journal of Applied Physics 53, 094001 (2014) pp. 094001-1 to 094001-5.

Topol, A.W., et al., "Enabling SOI-Based Assembly Technology for Three-Dimensional (3D) Integrated Circuits (ICs)," IEDM Tech. Digest, Dec. 5, 2005, pp. 363-366.

Demeester, P. et al., "Epitaxial lift-off and its applications," Semicond. Sci. Technol., 1993, pp. 1124-1135, vol. 8.

Yoon, J., et al., "GaAs Photovoltaics and optoelectronics using releasable multilayer epitaxial assemblies", Nature, vol. 465, May 20, 2010, pp. 329-334.

Bakir and Meindl, "Integrated Interconnect Technologies for 3D Nanoelectronic Systems", Artech House, 2009, Chapter 13, pp. 389-419.

Tanaka, H., et al., "Bit Cost Scalable Technology with Punch and Plug Process for Ultra High Density Flash Memory," VLSI Technology, 2007 IEEE Symposium on , vol. No., pp. 14-15, Jun. 12-14, 2007.

Lue, H.-T., et al., "A Highly Scalable 8-Layer 3D Vertical-Gate (VG) TFT NAND Flash Using Junction-Free Buried Channel BE-Sonos Device," Symposium on VLSI Technology, 2010, pp. 131-132.

Kim, W., et al., "Multi-layered Vertical Gate NAND Flash overcoming stacking limit for terabit density storage", Symposium on VLSI Technology Digest of Technical Papers, 2009, pp. 188-189.

Dicioccio, L., et al., "Direct bonding for wafer level 3D integration", ICICDT 2010, pp. 110-113.

Kim, W., et al., "Multi-Layered Vertical Gate NAND Flash Overcoming Stacking Limit for Terabit Density Storage," Symposium on VLSI Technology, 2009, pp. 188-189.

Walker, A. J., "Sub-50nm Dual-Gate Thin-Film Transistors for Monolithic 3-D Flash", IEEE Trans. Elect. Dev., vol. 56, No. 11, pp. 2703-2710, Nov. 2009.

Hubert, A., et al., "A Stacked Sonos Technology, Up to 4 Levels and 6nm Crystalline Nanowires, with Gate-All-Around or Independent Gates (φFlash), Suitable for Full 3D Integration", International Electron Devices Meeting, 2009, pp. 637-640.

Celler, G.K. et al., "Frontiers of silicon-on-insulator," J. App. Phys., May 1, 2003, pp. 4955-4978, vol. 93, No. 9.

Rajendran, B., et al., "Electrical Integrity of MOS Devices in Laser Annealed 3D IC Structures", proceedings VLSI Multi Level Interconnect Conference 2004, pp. 73-74.

Rajendran, B., "Sequential 3D IC Fabrication: Challenges and Prospects", Proceedings of VLSI Multi Level Interconnect Conference 2006, pp. 57-64.

Jung, S.-M., et al., "The revolutionary and truly 3-dimensional 25F2 SRAM technology with the smallest S3 ( stacked single-crystal Si) cell, 0.16um2, and SSTFT (stacked single-crystal thin film transistor) for ultra high density SRAM," VLSI Technology, 2004. Digest of Technical Papers, pp. 228-229, Jun. 15-17, 2004.

Hui, K. N., et al., "Design of vertically-stacked polychromatic light-emitting diodes," Optics Express, Jun. 8, 2009, pp. 9873-9878, vol. 17, No. 12.

Chuai, D. X., et al., "A Trichromatic Phosphor-Free White Light-Emitting Diode by Using Adhesive Bonding Scheme," Proc. SPIE, 2009, vol. 7635.

Suntharalingam, V. et al., "Megapixel CMOS Image Sensor Fabricated in Three-Dimensional Integrated Circuit Technology," Solid-State Circuits Conference, Digest of Technical Papers, ISSCC, Aug. 29, 2005, pp. 356-357, vol. 1.

Coudrain, P. et al., "Setting up 3D Sequential Integration for Back-Illuminated CMOS Image Sensors with Highly Miniaturized Pixels with Low Temperature Fully-Depleted SOI Transistors," IEDM, 2008, pp. 1-4.

Flamand, G. et al., "Towards Highly Efficient 4-Terminal Mechanical Photovoltaic Stacks," III-Vs Review, Sep.-Oct. 2006, pp. 24-27, vol. 19, Issue 7.

Zahler, J.M. et al., "Wafer Bonding and Layer Transfer Processes for High Efficiency Solar Cells," Photovoltaic Specialists Conference, Conference Record of the Twenty-Ninth IEEE, May 19-24, 2002, pp. 1039-1042.

Sekar, D. C., et al., "A 3D-IC Technology with Integrated Microchannel Cooling", Proc. Intl. Interconnect Technology Conference, 2008, pp. 13-15.

Brunschweiler, T., et al., "Forced Convective Interlayer Cooling in Vertically Integrated Packages," Proc. Intersoc. Conference on Thermal Management (ITHERM), 2008, pp. 1114-1125.

Yu, H., et al., "Allocating Power Ground Vias in 3D ICs for Simultaneous Power and Thermal Integrity" ACM Transactions on Design Automation of Electronic Systems (TODAES), vol. 14, No. 3, Article 41, May 2009, pp. 41.1-41.31.

Motoyoshi, M., "3D-IC Integration," 3rd Stanford and Tohoku University Joint Open Workshop, Dec. 4, 2009, pp. 1-52.

Wong, S., et al., "Monolithic 3D Integrated Circuits," VLSI Technology, Systems and Applications, 2007, International Symposium on VLSI-TSA 2007, pp. 1-4.

Batude, P., et al., "Advances in 3D CMOS Sequential Integration," 2009 IEEE International Electron Devices Meeting (Baltimore, Maryland), Dec. 7-9, 2009, pp. 345-348.

Tan, C.S., et al., "Wafer Level 3-D ICs Process Technology," ISBN-10: 0387765328, Springer, 1st Ed., Sep. 19, 2008, pp. v-xii, 34, 58, and 59.

Yoon, S.W et al., "Fabrication and Packaging of Microbump Interconnections for 3D TSV," IEEE International Conference on 3D System Integration (3DIC), Sep. 28-30, 2009, pp. 1-5.

Franzon, P.D. et al., "Design and CAD for 3D Integrated Circuits," 45th ACM/IEEE Design, Automation Conference (DAC), Jun. 8-13, 2008, pp. 668-673.

Lajevardi, P., "Design of a 3-Dimension FPGA," Thesis paper, University of British Columbia, Submitted to Dept. of Electrical Engineering and Computer Science, Massachusetts Institute of Technology, Jul. 2005, pp. 1-71.

Dong, C. et al., "Reconfigurable Circuit Design with Nanomaterials," Design, Automation & Test in Europe Conference & Exhibition, Apr. 20-24, 2009, pp. 442-447.

Razavi, S.A., et al., "A Tileable Switch Module Architecture for Homogeneous 3D FPGAs," IEEE International Conference on 3D System Integration (3DIC), Sep. 28-30, 2009, 4 pages.

Bakir M., et al., "3D Device-Stacking Technology for Memory," Chptr. 13.4, pp. 407-410, in "Integrated Interconnect Technologies for 3D Nano Electronic Systems", 2009, Artech House.

Weis, M. et al., "Stacked 3-Dimensional 6T SRAM Cell with Independent Double Gate Transistors," IC Design and Technology, May 18-20, 2009.

Doucette, P., "Integrating Photonics: Hitachi, Oki Put LEDs on Silicon," Solid State Technology, Jan. 2007, p. 22, vol. 50, No. 1.

Luo, Z.S. et al., "Enhancement of (In, Ga)N Light-emitting Diode Performance by Laser Liftoff and Transfer from Sapphire to Silicon," Photonics Technology Letters, Oct. 2002, pp. 1400-1402, vol. 14, No. 10.

Zahler, J.M. et al., "Wafer Bonding and Layer Transfer Processes for High Efficiency Solar Cells," NCPV and Solar Program Review Meeting, 2003, pp. 723-726.

(56) References Cited

OTHER PUBLICATIONS

Kada, M., "Updated results of R&D on functionally innovative 3D-integrated circuit (dream chip) technology in FY2009", (2010) International Microsystems Packaging Assembly and Circuits Technology Conference, IMPACT 2010 and International 3D IC Conference, Proceedings.

Kada, M., "Development of functionally innovative 3D-integrated circuit (dream chip) technology / high-density 3D-integration technology for multifunctional devices", (2009) IEEE International Conference on 3D System Integration, 3DIC 2009.

Marchal, P., et al., "3-D technology assessment: Path-finding the technology/design sweet-spot", (2009) Proceedings of the IEEE, 97 (1), pp. 96-107.

Xie, Y., et al., "Design space exploration for 3D architectures", (2006) ACM Journal on Emerging Technologies in Computing Systems, 2 (2), Apr. 2006, pp. 65-103.

Souri, S., et al., "Multiple Si layers ICs: motivation, performance analysis, and design Implications", (2000) Proceedings—Design Automation Conference, pp. 213-220.

Vinet, M., et.al., "3D monolithic integration: Technological challenges and electrical results", Microelectronic Engineering Apr. 2011 vol. 88, Issue 4, pp. 331-335.

Bobba, S. et al., "CELONCEL: Effective Design Technique for 3-D Monolithic Integration targeting High Performance Integrated Circuits", *Asia pacific DAC 2011*, paper 4A-4.

Choudhury, D., "3D Integration Technologies for Emerging Microsystems", IEEE Proceedings of the IMS 2010, pp. 1-4.

Lee, Y.-J., et al., "3D 65nm CMOS with 320° C Microwave Dopant Activation", IEDM 2010, pp. 1-4.

Crnogorac, F., et al., "Semiconductor crystal islands for three-dimensional integration", J. Vac. Sci. Technol. B 28(6), Nov./Dec. 2010, pp. C6P53-C6P58.

Park, J.-H., et al., "N-Channel Germanium MOSFET Fabricated Below 360 ° C by Cobalt-Induced Dopant Activation for Monolithic Three-Dimensional-ICs", IEEE Electron Device Letters, vol. 32, No. 3, Mar. 2011, pp. 234-236.

Jung, S.-M., et al., "Highly Area Efficient and Cost Effective Double Stacked S3( Stacked Single-crystal Si) Peripheral CMOS SSTFT and SRAM Cell Technology for 512M bit density SRAM", IEDM 2003, pp. 265-268.

Joyner, J.W., "Opportunities and Limitations of Three-dimensional Integration for Interconnect Design", PhD Thesis, Georgia Institute of Technology, Jul. 2003.

Choi, S.-J., "A Novel TFT with a Laterally Engineered Bandgap for of 3D Logic and Flash Memory", 2010 Symposium of VLSI Technology Digest, pp. 111-112.

Radu, I., et al., "Recent Developments of Cu—Cu non-thermo compression bonding for wafer-to-wafer 3D stacking", IEEE 3D Systems Integration Conference (3DIC), Nov. 16-18, 2010.

Gaudin, G., et al., "Low temperature direct wafer to wafer bonding for 3D integration", 3D Systems Integration Conference (3DIC), IEEE, 2010, Munich, Nov. 16-18, 2010, pp. 1-4.

"Jung, S.-M., et al.,""Three Dimensionally Stacked NAND Flash Memory Technology Using Stacking Single Crystal Si Layers on ILD and TANOS Structure for Beyond 30nm Node", IEDM 2006, Dec. 11-13, 2006.

Souri, S. J., "Interconnect Performance in 3-Dimensional Integrated Circuits", PhD Thesis, Stanford, Jul. 2003.

Uemoto, Y., et al., "A High-Performance Stacked-CMOS SRAM Cell by Solid Phase Growth Technique", Symposium on VLSI Technology, 2010, pp. 21-22.

Jung, S.-M., et al., "Highly Cost Effective and High Performance 65nm S3( Stacked Single-crystal Si) SRAM Technology with 25F2, 0.16um2 cell and doubly Stacked SSTFT Cell Transistors for Ultra High Density and High Speed Applications", 2005 Symposium on VLSI Technology Digest of Technical papers, pp. 220-221.

Steen, S.E., et al., "Overlay as the key to drive wafer scale 3D integration", Microelectronic Engineering 84 (2007) 1412-1415.

Maeda, N., et al., "Development of Sub 10-μm Ultra-Thinning Technology using Device Wafers for 3D Manufacturing of Terabit Memory", 2010 Symposium on VLSI Technology Digest of Technical Papers, pp. 105-106.

Chan, M., et al., "3-Dimensional Integration for Interconnect Reduction in for Nano-CMOS Technologies", IEEE Tencon, Nov. 23, 2006, Hong Kong.

Dong, X., et al., "Chapter 10: System-Level 3D IC Cost Analysis and Design Exploration", in Xie, Y., et al., "Three-Dimensional Integrated Circuit Design", book in series "Integrated Circuits and Systems" ed. A. Andrakasan, Springer 2010.

Naito, T., et al., "World's first monolithic 3D-FPGA with TFT SRAM over 90nm 9 layer Cu CMOS", 2010 Symposium on VLSI Technology Digest of Technical Papers, pp. 219-220.

Bernard, E., et al., "Novel integration process and performances analysis of Low STandby Power (LSTP) 3D Multi-Channel CMOSFET (MCFET) on SOI with Metal / High-K Gate stack", 2008 Symposium on VLSI Technology Digest of Technical Papers, pp. 16-17.

Cong, J., et al., "Quantitative Studies of Impact of 3D IC Design on Repeater Usage", Proceedings of International VLSI/ULSI Multilevel Interconnection Conference, pp. 344-348, 2008.

Gutmann, R.J., et al., "Wafer-Level Three-Dimensional Monolithic Integration for Intelligent Wireless Terminals", Journal of Semiconductor Technology and Science, vol. 4, No. 3, Sep. 2004, pp. 196-203.

Crnogorac, F., et al., "Nano-graphoepitaxy of semiconductors for 3D integration", Microelectronic Engineering 84 (2007) 891-894.

Koyanagi, M, "Different Approaches to 3D Chips", 3D IC Review, Stanford University, May 2005.

Koyanagi, M, "Three-Dimensional Integration Technology and Integrated Systems", ASPDAC 2009 presentation.

Koyanagi, M., et al., "Three-Dimensional Integration Technology and Integrated Systems", ASPDAC 2009, paper 4D-1, pp. 409-415.

Hayashi, Y., et al., "A New Three Dimensional IC Fabrication Technology Stacking Thin Film Dual-CMOS Layers", IEDM 1991, paper 25.6.1, pp. 657-660.

Clavelier, L., et al., "Engineered Substrates for Future More Moore and More Than Moore Integrated Devices", IEDM 2010, paper 2.6.1, pp. 42-45.

Kim, K., "From The Future Si Technology Perspective: Challenges and Opportunities", IEDM 2010, pp. 1.1.1-1.1.9.

Ababei, C., et al., "Exploring Potential Benefits of 3D FPGA Integration", in book by Becker, J. et al. Eds., "Field Programmable Logic 2004", LNCS 3203, pp. 874-880, 2004, Springer-Verlag Berlin Heidelberg.

Ramaswami, S., "3D TSV IC Processing", 3DIC Technology Forum Semicon Taiwan 2010, Sep. 9, 2010.

Davis, W.R., et al., "Demystifying 3D Ics: Pros and Cons of Going Vertical", IEEE Design and Test of Computers, Nov.-Dec. 2005, pp. 498-510.

Lin, M., et al., "Performance Benefits of Monolithically Stacked 3DFPGA", FPGA06, Feb. 22-24, 2006, Monterey, California, pp. 113-122.

Dong, C., et al., "Performance and Power Evaluation of a 3D CMOS/Nanomaterial Reconfigurable Architecture", ICCAD 2007, pp. 758-764.

Gojman, B., et al., "3D Nanowire-Based Programmable Logic", International Conference on Nano-Networks (Nanonets 2006), Sep. 14-16, 2006.

Dong, C., et al., "3-D nFPGA: A Reconfigurable Architecture for 3-D CMOS/Nanomaterial Hybrid Digital Circuits", IEEE Transactions on Circuits and Systems, vol. 54, No. 11, Nov. 2007, pp. 2489-2501.

Golshani, N., et al., "Monolithic 3D Integration of SRAM and Image Sensor Using Two Layers of Single Grain Silicon", 2010 IEEE International 3D Systems Integration Conference (3DIC), Nov. 16-18, 2010, pp. 1-4.

Rajendran, B., et al., "Thermal Simulation of laser Annealing for 3D Integration", Proceedings VMIC 2003.

Woo, H.-J., et al., "Hydrogen Ion Implantation Mechanism in GaAs-on-insulator Wafer Formation by Ion-cut Process", Journal of Semiconductor Technology and Science, vol. 6, No. 2, Jun. 2006, pp. 95-100.

(56) References Cited

OTHER PUBLICATIONS

Sadaka, M., et al., "Building Blocks for wafer level 3D integration",www.electroiq.com, Aug. 18, 2010, last accessed Aug. 18, 2010.
Madan, N., et al., "Leveraging 3D Technology for Improved Reliability," Proceedings of the 40th Annual IEEE/ACM International Symposium on Microarchitecture (MICRO 2007), IEEE Computer Society.
Hayashi, Y., et al., "Fabrication of Three Dimensional IC Using "Cumulatively Bonded IC" (CUBIC) Technology", 1990 Symposium on VLSI Technology, pp. 95-96.
Akasaka, Y., "Three Dimensional IC Trends," Proceedings of the IEEE, vol. 24, No. 12, Dec. 1986.
Guarini, K. W., et al., "Electrical Integrity of State-of-the-Art 0.13um SOI Device and Circuits Transferred for Three-Dimensional (3D) Integrated Circuit (IC) Fabrication," IEDM 2002, paper 16.6, pp. 943-945.
Kunio, T., et al., "Three Dimensional Ics, Having Four Stacked Active Device Layers," IEDM 1989, paper 34.6, pp. 837-840.
Gaillardon, P-E., et al., "Can We Go Towards True 3-D Architectures?," DAC 2011, paper 58, pp. 282-283.
Yun, J-G., et al., "Single-Crystalline Si Stacked Array (STAR) NAND Flash Memory," IEEE Transactions on Electron Devices, vol. 58, No. 4, Apr. 2011, pp. 1006-1014.
Kim, Y., et al., "Three-Dimensional NAND Flash Architecture Design Based on Single-Crystalline Stacked Array," IEEE Transactions on Electron Devices, vol. 59, No. 1, Jan. 2012, pp. 35-45.
Goplen, B., et al., "Thermal Via Placement in 3DICs," Proceedings of the International Symposium on Physical Design, Apr. 3-6, 2005, San Francisco.
Bobba, S., et al., "Performance Analysis of 3-D Monolithic Integrated Circuits," 2010 IEEE International 3D Systems Integration Conference (3DIC), Nov. 2010, Munich, pp. 1-4.
Batude, P., et al., "Demonstration of low temperature 3D sequential FDSOI integration down to 50nm gate length," 2011 Symposium on VLSI Technology Digest of Technical Papers, pp. 158-159.
Batude, P., et al., "Advances, Challenges and Opportunties in 3D CMOS Sequential Integration," 2011 IEEE International Electron Devices Meeting, paper 7.3, Dec. 2011, pp. 151-154.
Yun, C. H., et al., "Transfer of patterned ion-cut silicon layers", Applied Physics Letters, vol. 73, No. 19, Nov. 1998, pp. 2772-2774.
Ishihara, R., et al., "Monolithic 3D-ICs with single grain Si thin film transistors," Solid-State Electronics 71 (2012) pp. 80-87.
Lee, S. Y., et al., "Architecture of 3D Memory Cell Array on 3D IC," IEEE International Memory Workshop, May 20, 2012, Monterey, CA.
Lee, S. Y., et al., "3D IC Architecture for High Density Memories," IEEE International Memory Workshop, p. 1-6, May 2010.
Rajendran, B., et al., "CMOS transistor processing compatible with monolithic 3-D Integration," Proceedings VMIC 2005.
Huet, K., "Ultra Low Thermal Budget Laser Thermal Annealing for 3D Semiconductor and Photovoltaic Applications," NCCAVS 2012 Junction Technology Group, Semicon West, San Francisco, Jul. 12, 2012.
Derakhshandeh, J., et al., "A Study of the CMP Effect on the Quality of Thin Silicon Films Crystallized by Using the u-Czochralski Process," Journal of the Korean Physical Society, vol. 54, No. 1, 2009, pp. 432-436.
Kim, J., et al., "A Stacked Memory Device on Logic 3D Technology for Ultra-high-density Data Storage," Nanotechnology, vol. 22, 254006 (2011).
Lee, K. W., et al., "Three-dimensional shared memory fabricated using wafer stacking technology," IEDM Tech. Dig., 2000, pp. 165-168.
Chen, H. Y., et al., "HfOx Based Vertical Resistive Random Access Memory for Cost Effective 3D Cross-Point Architecture without Cell Selector," Proceedings IEDM 2012, pp. 497-499.
Huet, K., et al., "Ultra Low Thermal Budget Anneals for 3D Memories: Access Device Formation," Ion Implantation Technology 2012, AIP Conf Proceedings 1496, 135-138 (2012).
Batude, P., et al., "3D Monolithic Integration," ISCAS 2011 pp. 2233-2236.
Batude, P., et al., "3D Sequential Integration: A Key Enabling Technology for Heterogeneous C-Integration of New Function With CMOS," IEEE Journal on Emerging and Selected Topics in Circuits and Systems (JETCAS), vol. 2, No. 4, Dec. 2012, pp. 714-722.
Vinet, M., et al., "Germanium on Insulator and new 3D architectures opportunities for integration", International Journal of Nanotechnology, vol. 7, No. 4, (Aug. 2010) pp. 304-319.
Bernstein, K., et al., "Interconnects in the Third Dimension: Design Challenges for 3DICs," Design Automation Conference, 2007, DAC'07, 44th ACM/IEEE, vol. No., pp. 562-567, Jun. 4-8, 2007.
Kuroda, T., "ThruChip Interface for Heterogeneous Chip Stacking," ElectroChemicalSociety Transactions, 50(14) 63-68 (2012).
Miura, N., et al., "A Scalable 3D Heterogeneous Multi-Core Processor with Inductive-Coupling ThruChip Interface," IEEE Micro Cool Chips XVI, Yokohama, Apr. 17-19, 2013, pp. 1-3(2013).
Kuroda, T., "Wireless Proximity Communications for 3D System Integration," Future Directions in IC and Package Design Workshop, Oct. 29, 2007.
Qiang, J-Q, "3-D Hyperintegration and Packaging Technologies for Micro-Nano Systems," Proceedings of the IEEE, 97.1 (2009) pp. 18-30.
Lee, B.H., et al., "A Novel Pattern Transfer Process for Bonded SOI Giga-bit DRAMs," Proceedings 1996 IEEE International SOI Conference, Oct. 1996, pp. 114-115.
Wu, B., et al., "Extreme ultraviolet lithography and three dimensional circuits," Applied Phyisics Reviews, 1, 011104 (2014).
Delhougne, R., et al., "First Demonstration of Monocrystalline Silicon Macaroni Channel for 3-D NAND Memory Devices" IEEE VLSI Tech Digest, 2018, pp. 203-204.
Kim, J., et al.; "A stacked memory device on logic 3D technology for ultra-high-density data storage"; Nanotechnology 22 (2011) 254006 (7pp).
Hsieh, P-Y, et al.,"Monolithic 3D BEOL FinFET switch arrays using location-controlled-grain technique in voltage regulator with better FOM than 2D regulators", IEDM paper 3.1, pp. IEDM19-46 to IEDM19-49.
Then, Han Wui, et al., "3D heterogeneous integration of high performance high-K metal gate GaN NMOS and Si PMOS transistors on 300mm high resistivity Si substrate for energy-efficient and compact power delivery, RF (5G and beyond) and SoC applications", IEDM 2019, paper 17.3, pp. IEDM19-402 to IEDM19-405.
Rachmady, W., et al.,"300mm Heterogeneous 3D Integration of Record Performance Layer Transfer Germanium PMOS with Silicon NMOS for Low Power High Performance Logic Applications", IEDM 2019, paper 29.7, pp. IEDM19-697 to IEDM19-700.

* cited by examiner

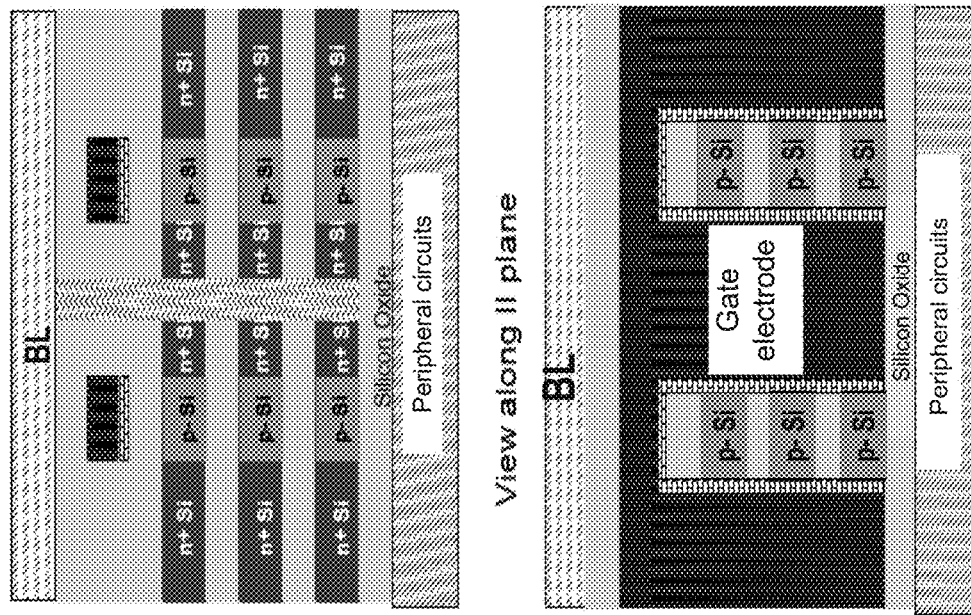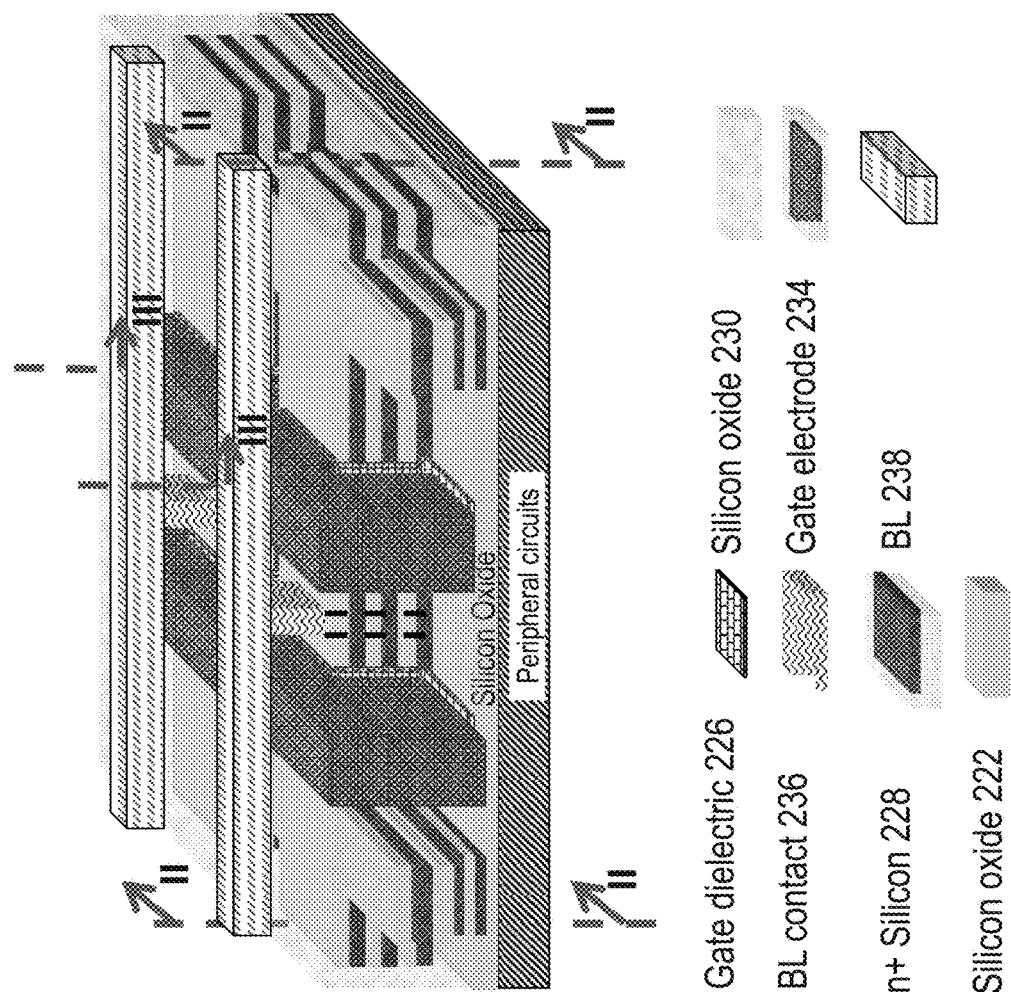
Fig. 2K

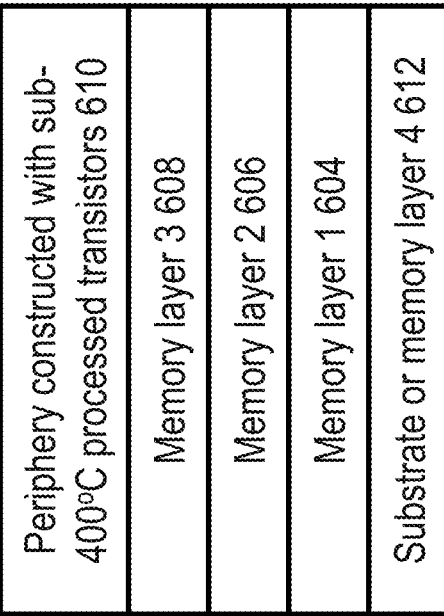
Fig. 6B: Periphery-on-top architecture
An alternative
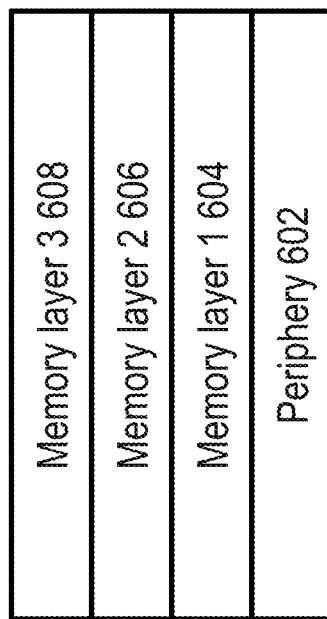
Fig. 6A: Periphery-on-bottom architecture

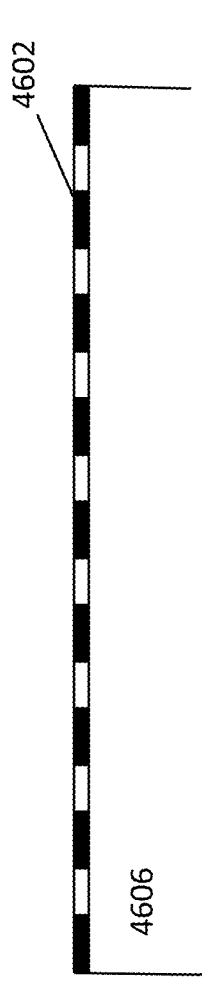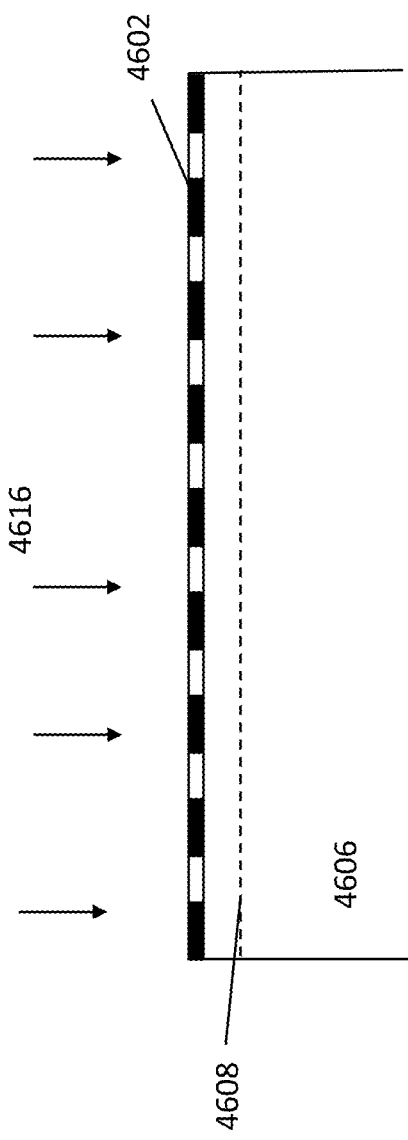

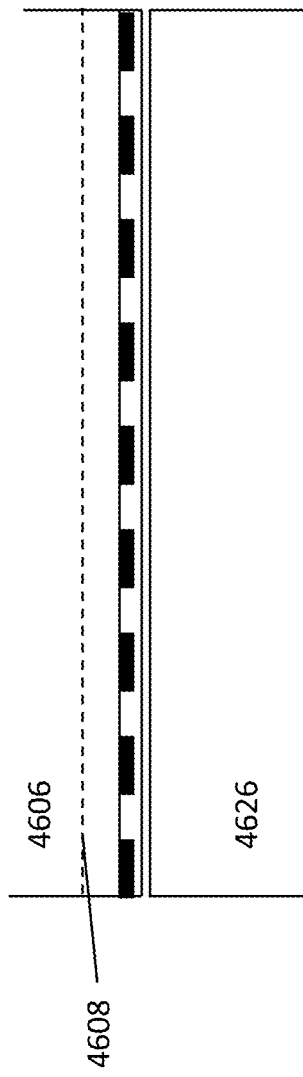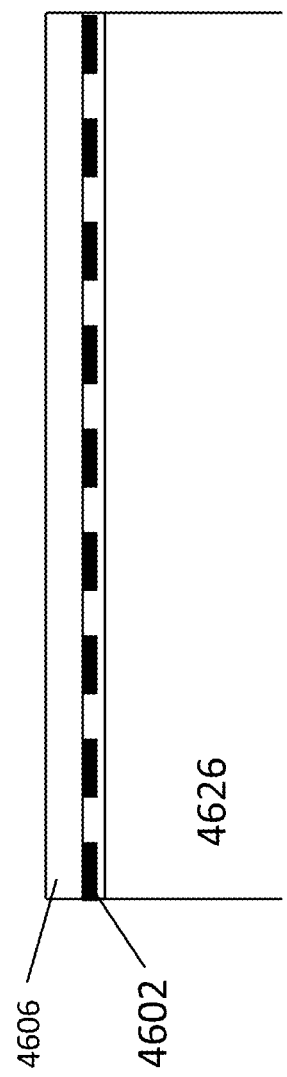

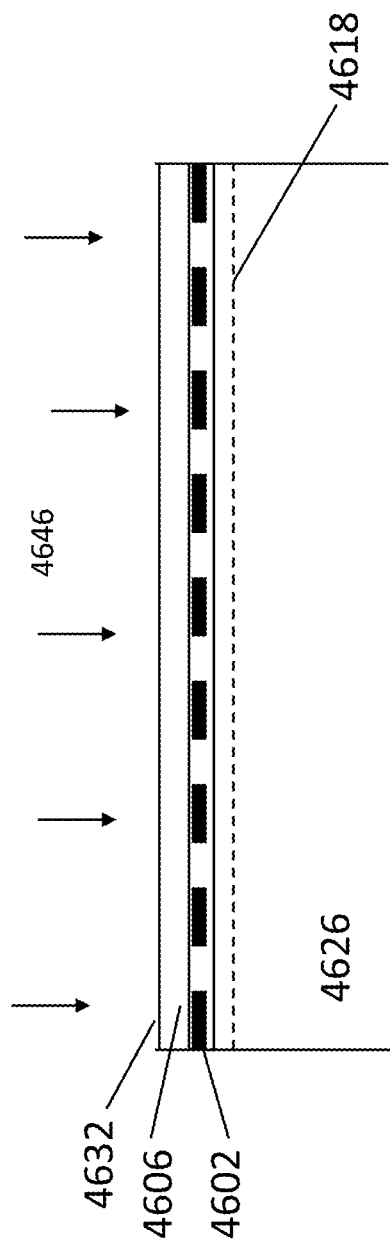
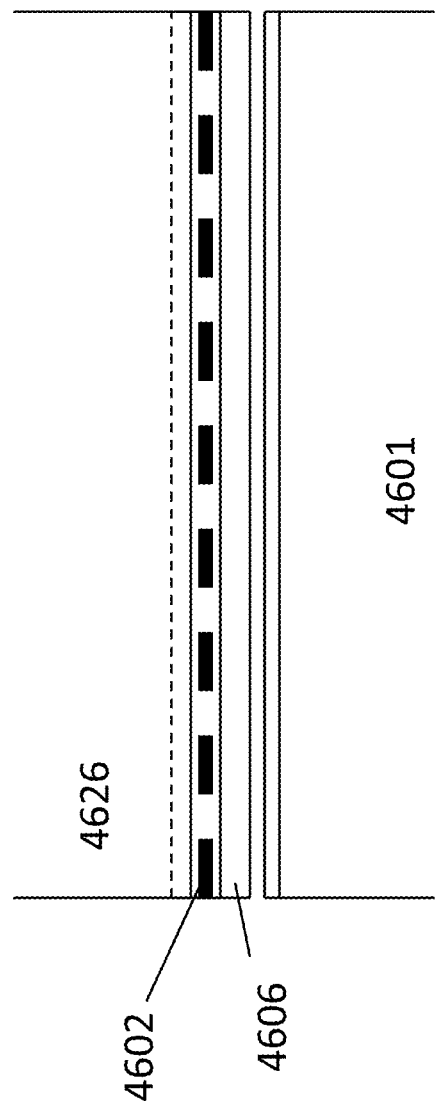

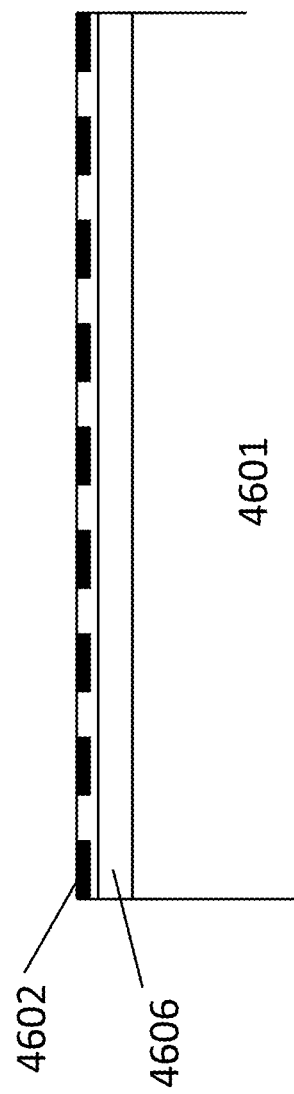

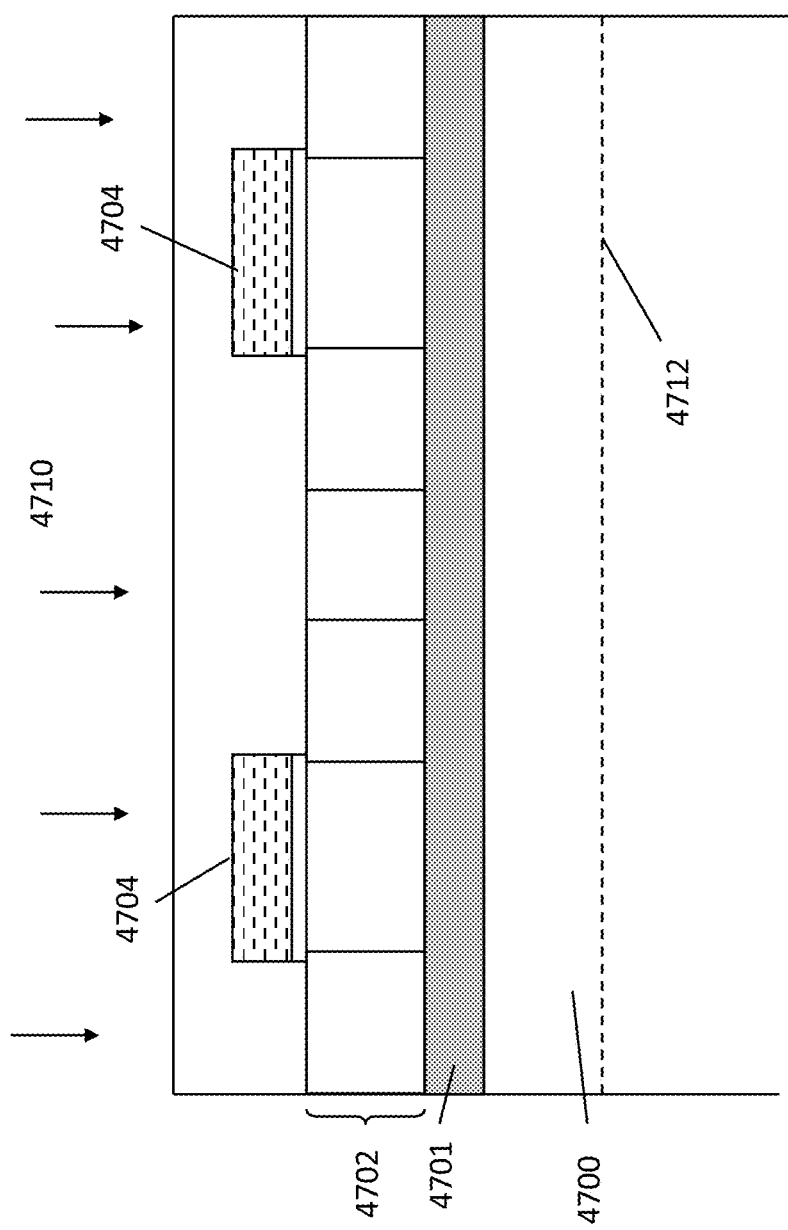

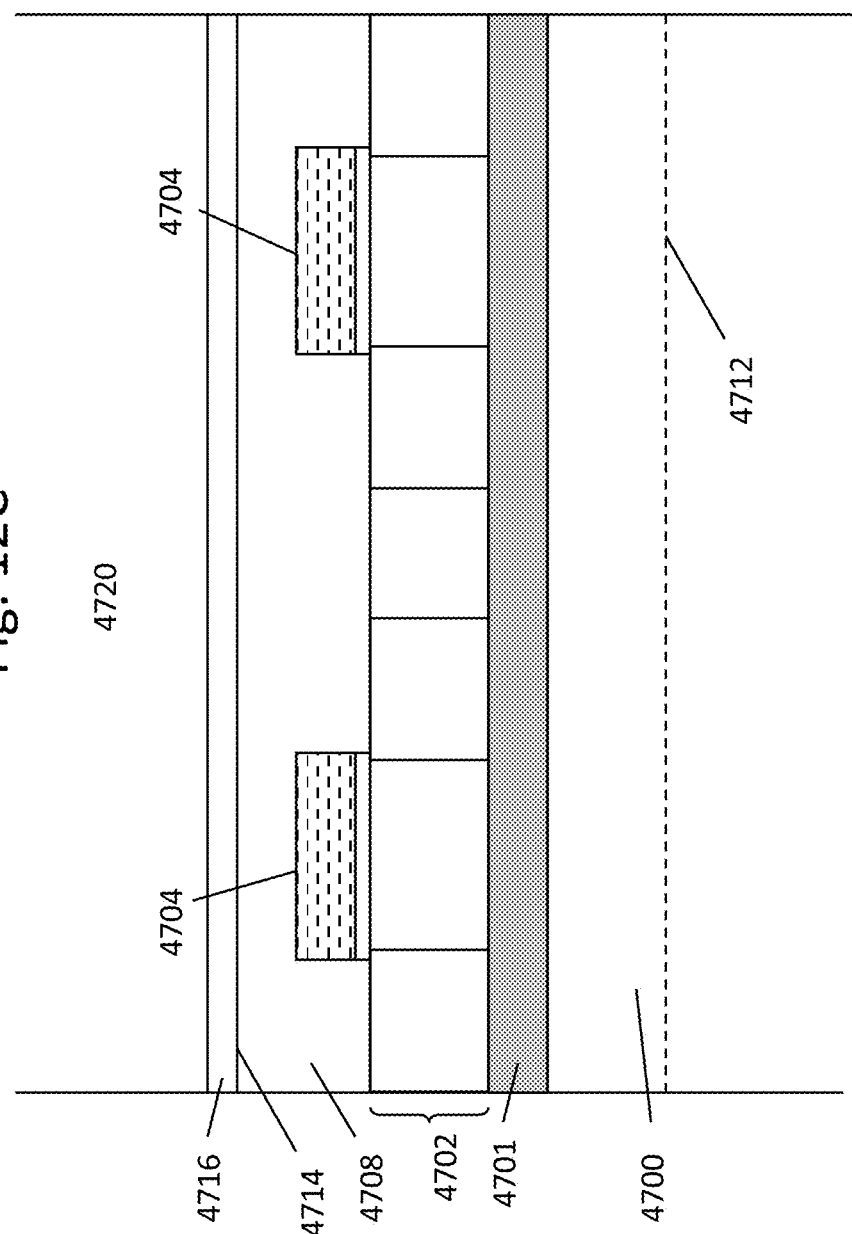

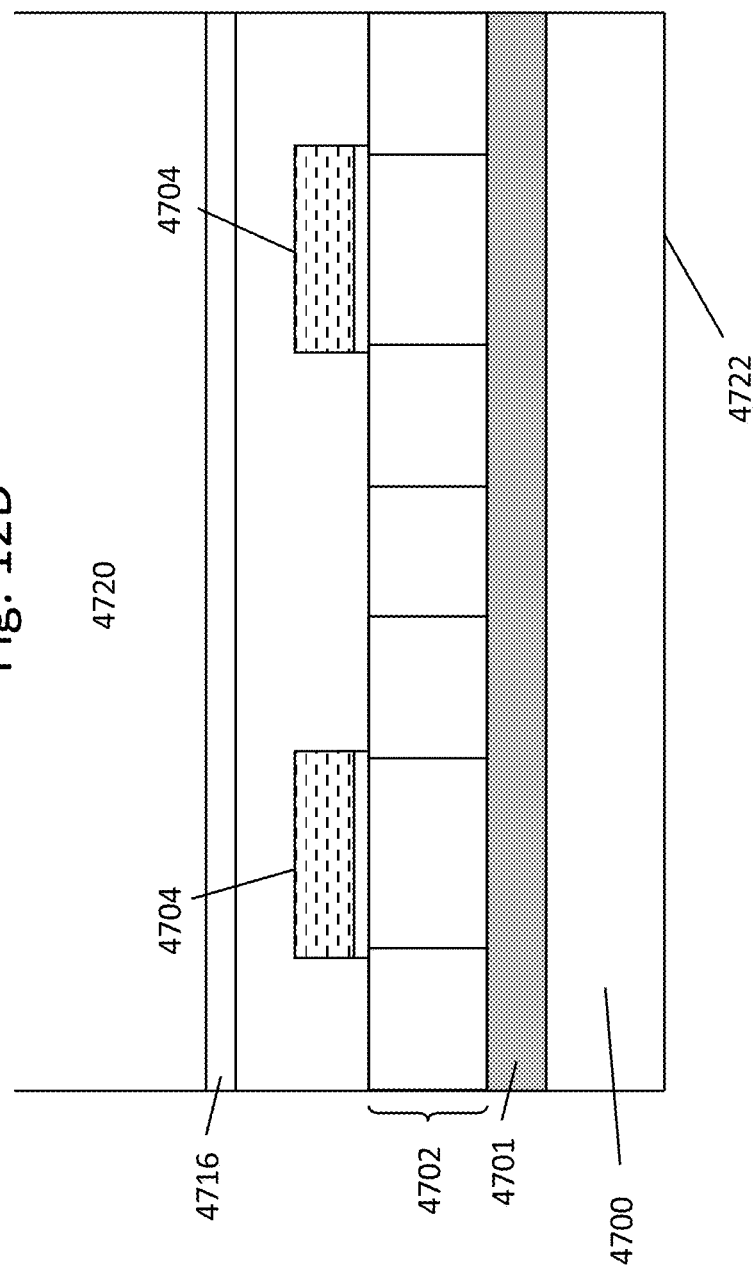

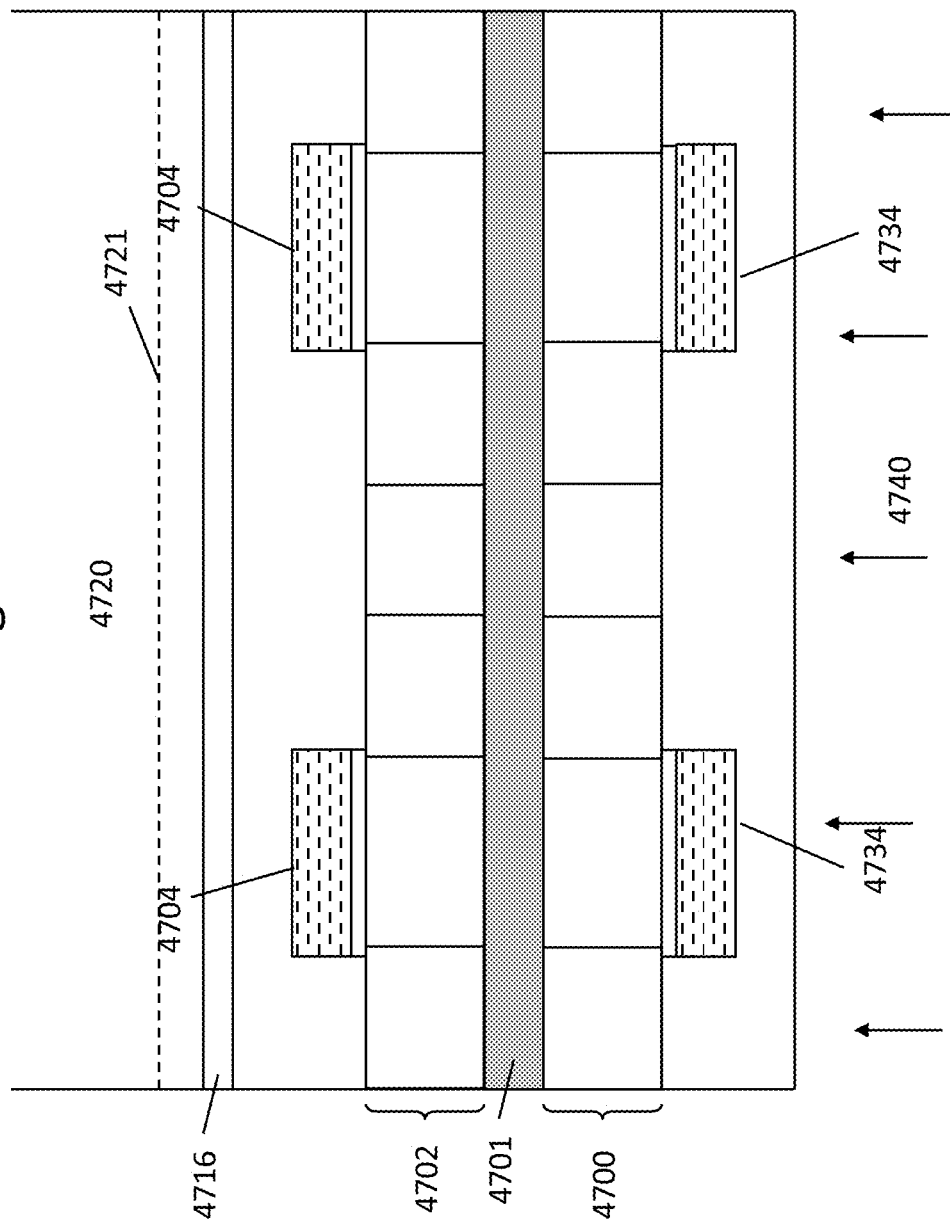

METHOD TO PRODUCE A 3D SEMICONDUCTOR DEVICE AND STRUCTURE

CROSS-REFERENCE OF RELATED APPLICATION

This application is a continuation in part of U.S. patent application Ser. No. 17/114,155, which was filed on Dec. 7, 2020, which is a continuation in part of U.S. patent application Ser. No. 17/013,823, which was filed on Sep. 7, 2020, which is a continuation in part of U.S. patent application Ser. No. 16/409,813, which was filed on May 11, 2019, and now is U.S. Pat. No. 10,825,864 issued on Nov. 3, 2020, which is a continuation in part of U.S. patent application Ser. No. 15/803,732, which was filed on Nov. 3, 2017, and now is U.S. Pat. No. 10,290,682 issued on May 14, 2019, which is a continuation in part of U.S. patent application Ser. No. 14/555,494, which was filed on Nov. 26, 2014, and now is U.S. Pat. No. 9,818,800 issued on Nov. 14, 2017, which is a continuation of U.S. patent application Ser. No. 13/246,157, which was filed on Sep. 27, 2011 and now is U.S. Pat. No. 8,956,959 issued on Feb. 17, 2015, which is a continuation of U.S. patent application Ser. No. 13/173,999, which was filed on Jun. 30, 2011 and now is U.S. Pat. No. 8,203,148 issued on Jun. 19, 2012, which is a continuation of U.S. patent application Ser. No. 12/901,890, which was filed on Oct. 11, 2010, and now is U.S. Pat. No. 8,026,521 issued on Sep. 27, 2011.

BACKGROUND OF THE INVENTION

1. Field of the Invention

This invention describes applications of monolithic 3D integration to at least semiconductor chips performing logic and memory functions.

2. Discussion of Background Art

Over the past 40 years, one has seen a dramatic increase in functionality and performance of Integrated Circuits (ICs). This has largely been due to the phenomenon of "scaling" i.e. component sizes within ICs have been reduced ("scaled") with every successive generation of technology. There are two main classes of components in Complimentary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate performance, functionality and power consumption of ICs.

3D stacking of semiconductor chips is one avenue to tackle issues with wires. By arranging transistors in 3 dimensions instead of 2 dimensions (as was the case in the 1990s), one can place transistors in ICs closer to each other. This reduces wire lengths and keeps wiring delay low. However, there are many barriers to practical implementation of 3D stacked chips. These include:

Constructing transistors in ICs typically require high temperatures (higher than ~700° C.) while wiring levels are constructed at low temperatures (lower than ~400° C.). Copper or Aluminum wiring levels, in fact, can get damaged when exposed to temperatures higher than ~400° C. If one would like to arrange transistors in 3 dimensions along with wires, it has the challenge described below. For example, let us consider a 2 layer stack of transistors and wires i.e. Bottom Transistor Layer, above it Bottom Wiring Layer, above it Top Transistor Layer and above it Top Wiring Layer. When the Top Transistor Layer is constructed using Temperatures higher than 700° C., it can damage the Bottom Wiring Layer.

Due to the above mentioned problem with forming transistor layers above wiring layers at temperatures lower than 400° C., the semiconductor industry has largely explored alternative architectures for 3D stacking. In these alternative architectures, Bottom Transistor Layers, Bottom Wiring Layers and Contacts to the Top Layer are constructed on one silicon wafer. Top Transistor Layers, Top Wiring Layers and Contacts to the Bottom Layer are constructed on another silicon wafer. These two wafers are bonded to each other and contacts are aligned, bonded and connected to each other as well. Unfortunately, the size of Contacts to the other Layer is large and the number of these Contacts is small. In fact, prototypes of 3D stacked chips today utilize as few as 10,000 connections between two layers, compared to billions of connections within a layer. This low connectivity between layers is because of two reasons: (i) Landing pad size needs to be relatively large due to alignment issues during wafer bonding. These could be due to many reasons, including bowing of wafers to be bonded to each other, thermal expansion differences between the two wafers, and lithographic or placement misalignment. This misalignment between two wafers limits the minimum contact landing pad area for electrical connection between two layers; (ii) The contact size needs to be relatively large. Forming contacts to another stacked wafer typically involves having a Through-Silicon Via (TSV) on a chip. Etching deep holes in silicon with small lateral dimensions and filling them with metal to form TSVs is not easy. This places a restriction on lateral dimensions of TSVs, which in turn impacts TSV density and contact density to another stacked layer. Therefore, connectivity between two wafers is limited.

It is highly desirable to circumvent these issues and build 3D stacked semiconductor chips with a high-density of connections between layers. To achieve this goal, it is sufficient that one of three requirements must be met: (1) A technology to construct high-performance transistors with processing temperatures below ~400° C.; (2) A technology where standard transistors are fabricated in a pattern, which allows for high density connectivity despite the misalignment between the two bonded wafers; and (3) A chip architecture where process temperature increase beyond 400° C. for the transistors in the top layer does not degrade the characteristics or reliability of the bottom transistors and wiring appreciably. This patent application describes approaches to address options (1), (2) and (3) in the detailed description section. In the rest of this section, background art that has previously tried to address options (1), (2) and (3) will be described.

There are many techniques to construct 3D stacked integrated circuits or chips including:

Through-silicon via (TSV) technology: Multiple layers of transistors (with or without wiring levels) can be constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318; and pending U.S. patent application Publications and applications, Ser. Nos. 14/642,724, 15/150,395, 15/173,686, 62/651,722; 62/681,249, 62/713,345, 62/770,751, 62/952,222, 2020/0013791, 16/558,304; and PCT Applications (and Publications): PCT/US2010/052093, PCT/US2011/042071 (WO2012/015550), PCT/US2016/52726 (WO2017053329), PCT/US2017/052359 (WO2018/071143), PCT/US2018/016759 (WO2018144957), and PCT/US2018/52332 (WO 2019/060798).

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, and 10,679,977.

U.S. Pat. No. 7,052,941 from Sang-Yun Lee ("S-Y Lee") describes methods to construct vertical transistors above wiring layers at less than 400° C. In these single crystal Si transistors, current flow in the transistor's channel region is in the vertical direction. Unfortunately, however, almost all semiconductor devices in the market today (logic, DRAM, flash memory) utilize horizontal (or planar) transistors due to their many advantages, and it is difficult to convince the industry to move to vertical transistor technology.

A paper from IBM at the Intl. Electron Devices Meeting in 2005 describes a method to construct transistors for the top stacked layer of a 2 chip 3D stack on a separate wafer. This paper is "Enabling SOI-Based Assembly Technology for Three-Dimensional (3D) Integrated Circuits (ICs)," *IEDM Tech. Digest*, p. 363 (2005) by A. W. Topol, D. C. La Tulipe, L. Shi, et al. ("Topol"). A process flow is utilized to transfer this top transistor layer atop the bottom wiring and transistor layers at temperatures less than 400° C. Unfortunately, since transistors are fully formed prior to bonding, this scheme suffers from misalignment issues. While Topol describes techniques to reduce misalignment errors in the above paper, the techniques of Topol still suffer from misalignment errors that limit contact dimensions between two chips in the stack to >130 nm.

The textbook "Integrated Interconnect Technologies for 3D Nanoelectronic Systems" by Bakir and Meindl ("Bakir") describes a 3D stacked DRAM concept with horizontal (i.e. planar) transistors. Silicon for stacked transistors is produced using selective epitaxy technology or laser recrystallization. Unfortunately, however, these technologies have higher defect density compared to standard single crystal silicon. This higher defect density degrades transistor performance.

In the NAND flash memory industry, several organizations have attempted to construct 3D stacked memory. These attempts predominantly use transistors constructed with poly-Si or selective epi technology as well as charge-trap concepts. References that describe these attempts to 3D stacked memory include "Integrated Interconnect Technologies for 3D Nanoelectronic Systems", Artech House, 2009 by Bakir and Meindl ("Bakir"), "Bit Cost Scalable Technology with Punch and Plug Process for Ultra High Density Flash Memory", Symp. VLSI Technology Tech. Dig. pp. 14-15, 2007 by H. Tanaka, M. Kido, K. Yahashi, et al. ("Tanaka"), "A Highly Scalable 8-Layer 3D Vertical-Gate (VG) TFT NAND Flash Using Junction-Free Buried Channel BE-SONOS Device," Symposium on VLSI Technology, 2010 by W. Kim, S. Choi, et al. ("W. Kim"), "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. ("Lue") and "Sub-50 nm Dual-Gate Thin-Film Transistors for Monolithic 3-D Flash", IEEE Trans. Elect. Dev., vol. 56, pp. 2703-2710, November 2009 by A. J. Walker ("Walker"). An architecture and technology that utilizes single crystal Silicon using epi growth is described in "A Stacked SONOS Technology, Up to 4 Levels and 6 nm Crystalline Nanowires, with Gate-All-Around or Independent Gates (ΦFlash), Suitable for Full 3D Integration", International Electron Devices Meeting, 2009 by A. Hubert, et al ("Hubert"). However, the approach described by Hubert has some challenges including use of difficult-to-manufacture nanowire transistors, higher defect densities due to formation of Si and SiGe layers atop each other, high temperature processing for long times, difficult manufacturing, etc.

It is clear based on the background art mentioned above that invention of novel technologies for 3D stacked layer and chips will be useful.

SUMMARY

The invention may be directed to at least multilayer or Three Dimensional Integrated Circuit (3D IC) devices, structures, and fabrication methods.

In one aspect, a 3D semiconductor device, the device including: a first level including a first single crystal layer and first transistors, where the first transistors each include a single crystal channel; first metal layers interconnecting at least the first transistors; and a second level including a second single crystal layer and second transistors, where the second level overlays the first level, where the second transistors are horizontally oriented and each include at least two side gates, where the second level is bonded to the first level, and where the bonded includes oxide to oxide bonds.

In another aspect, a 3D semiconductor device, the device including: a first level including a first single crystal layer and alignment marks; first transistors overlaying the first single crystal layer; second transistors overlaying the first transistors; and a second level including a second single crystal layer, where the second level overlays the second transistors, where the first transistors and the second transistors are self-aligned, being processed following the same lithography step, where the second level includes third transistors, and where the third transistors are aligned to the alignment marks.

In another aspect, a 3D semiconductor device, the device including: a first level including a first single crystal layer and first transistors, where the first transistors each include a single crystal channel; first metal layers interconnecting at least the first transistors; alignment marks, where the first level includes the alignment marks; and a second level including a second single crystal layer and second transistors, where the second level overlays the first level, where the second transistors are horizontally oriented and each include at least two side gates, where the second level is bonded to the first level, where the bonded includes oxide to oxide bonds, and where the second transistors are aligned to the alignment marks.

In another aspect, a 3D semiconductor device, the device including: a first level including a first single crystal layer and first transistors, where the first transistors each include a single crystal channel; first metal layers interconnecting at least the first transistors; and a second level including a second single crystal layer and second transistors, where the second level overlays the first level, where the second transistors are horizontally oriented and include replacement gate, where the second level is bonded to the first level, and where the bonded includes oxide to oxide bonds.

In another aspect, a 3D semiconductor device, the device including: a first level including a first single crystal layer and alignment marks; first transistors overlaying the first single crystal layer; and second transistors overlaying the first transistors, where the first transistors and the second transistors are self-aligned, being processed following the same lithography step, where the second transistors include replacement gate, being processed to replace a poly silicon gate to a metal based gate, where the first level includes third transistors disposed below the first transistor, where the third transistors are aligned to the alignment marks, and where the third transistors each include a single crystal channel.

In another aspect, a 3D semiconductor device, the device including: a first level including a first single crystal layer, first transistors, and second transistors, where the second transistors are overlaying the first transistors, and where the first transistors and the second transistors are self-aligned, being processed following the same lithography step; and a second level including a second single crystal layer and third transistors, where the second level overlays the first level, where the third transistors are horizontally oriented and include replacement gate, where the second level is bonded to the first level, and where the bonded includes oxide to oxide bonds.

In another aspect, a 3D semiconductor device, the device including: a first level including a single crystal layer, a first metal layer, a second metal layer above the first metal layer, and a third metal layer above the second metal layer, where the second metal layer is significantly thicker than either the third metal layer or the first metal layer, where the third metal layer is precisely aligned to the first metal layer with less than 20 nm misalignment; a second level including a first array of first memory cells, each of the first memory cells include first transistors; and a third level including a second array of second memory cells, each of the second memory cells include second transistors, where the second level is above the third level, where the second transistors are self-aligned to the first transistors, being processed following the same lithography step, where the first level includes third transistors, where the first metal layer provides connections to the third transistors for the construction of periphery circuits, where connections from the periphery circuits to the first memory cells and the second memory cells include the second metal, the periphery circuits and the second metal are adapted to control the memory cells, and where the periphery circuits are directly underneath the first memory cells and the second memory cells.

In another aspect, a 3D semiconductor device, the device including: a first level including a single crystal layer, a first metal layer, a second metal layer above the first metal layer, and a third metal layer above the second metal layer, where the second metal layer has a significantly greater current carrying capacity than either the third metal layer or the first metal layer, where the third metal layer is precisely aligned to the first metal layer with less than 20 nm misalignment; a second level including a first array of first memory cells, each of the first memory cells include first transistors; a third level including a second array of second memory cells, each of the second memory cells include second transistors, where the second level is above the third level, where the second transistors are self-aligned to the first transistors, being processed following the same lithography step; and a fourth level including periphery circuits, the periphery circuits include connections by the second metal, where the periphery circuits are adapted to control the first memory cells and the second memory cells, and where the periphery circuits are atop the first memory cells and the second memory cells.

In another aspect, a 3D semiconductor device, the device including: a first level including a single crystal layer, a first metal layer, a second metal layer above the first metal layer, and a third metal layer above the second metal layer, where the second metal layer is significantly thicker than either the third metal layer or the first metal layer, where the third metal layer is precisely aligned to the first metal layer with less than 20 nm misalignment; a second level including a first array of first memory cells, each of the first memory cells include first transistors; a third level including a second array of second memory cells, each of the second memory cells include second transistors, where the second level is above the third level, where the second transistors are self-aligned to the first transistors, being processed following the same lithography step; and periphery circuits connected by the second metal to control the memory cells, where the periphery circuits are either underneath the memory cells or atop the memory cells.

In another aspect, a method for producing a 3D memory device, the method including: providing a first level including a single crystal layer; forming at least one second level above the first level; performing a first etch step including etching holes within the second level; forming at least one third level above the at least one second level; performing a second etch step including etching holes within the third level; performing additional processing steps to form a plurality of first memory cells within the second level and a plurality of second memory cells within the third level, where each of the first memory cells include one first transistor, where each of the second memory cells include one second transistor, where at least one of the first or second transistors has a channel, a source and a drain having the same doping type, where the memory is a NAND nonvolatile type memory, where the first etch step is directly followed by a deposition of tunneling dielectric and then a deposition including polysilicon, where the forming at least one third level includes forming a window within the third level to allow lithography alignment through the third level to an alignment mark underneath, where the first level includes memory peripheral circuits, and where at least one of the first memory cells is at least partially atop a portion of the memory peripheral circuits.

In another aspect, a method for producing a 3D memory device, the method including: providing a first level including a single crystal layer; forming at least one second level above the first level; performing a first etch step including etching holes within the second level; forming at least one third level above the at least one second level; performing a second etch step including etching holes within the third level; performing additional processing steps to form a plurality of first memory cells within the second level and a plurality of second memory cells within the third level, where each of the first memory cells include one first transistor, where each of the second memory cells include one second transistor, where at least one of the first or second transistors has a channel, a source and a drain having the same doping type, where the forming at least one third level includes forming a window within the third level to allow lithography alignment through the third level to an alignment mark underneath, and where the memory is a NAND nonvolatile type memory.

In another aspect, a method for producing a 3D memory device, the method including: providing a first level including a single crystal layer; forming at least one second level above the first level; performing a first etch step including etching holes within the second level; forming at least one third level above the at least one second level; performing a second etch step including etching holes within the third level; performing additional processing steps to form a plurality of first memory cells within the second level and a plurality of second memory cells within the third level, where each of the first memory cells include one first transistor, where each of the second memory cells include one second transistor, where at least one of the first or second transistors has a channel, a source and a drain having the same doping type, and where the forming at least one third level includes forming a window within the third level to allow lithography alignment through the third level to an alignment mark underneath.

BRIEF DESCRIPTION OF THE DRAWINGS

Various embodiments of the invention will be understood and appreciated more fully from the following detailed description, taken in conjunction with the drawings in which:

FIGS. 2A-2K show a zero-mask per layer 3D floating body DRAM;

FIGS. 4A-4K show an alternative zero-mask per layer 3D resistive memory;

FIGS. 6A-6B show periphery on top of memory layers;

FIGS. 11A-11G illustrate using a carrier wafer for layer transfer;

FIGS. 12A-12K illustrate constructing chips with nMOS and pMOS devices on either side of the wafer.

DETAILED DESCRIPTION

Embodiments of the present invention are now described with reference to FIGS. 1A-13, it being appreciated that the figures illustrate the subject matter not to scale or to measure. Many figures describe process flows for building devices. These process flows, which are essentially a sequence of steps for building a device, have many structures, numerals and labels that are common between two or more adjacent steps. In such cases, some labels, numerals and structures used for a certain step's figure may have been described in previous steps' figures.

Figure 1A:
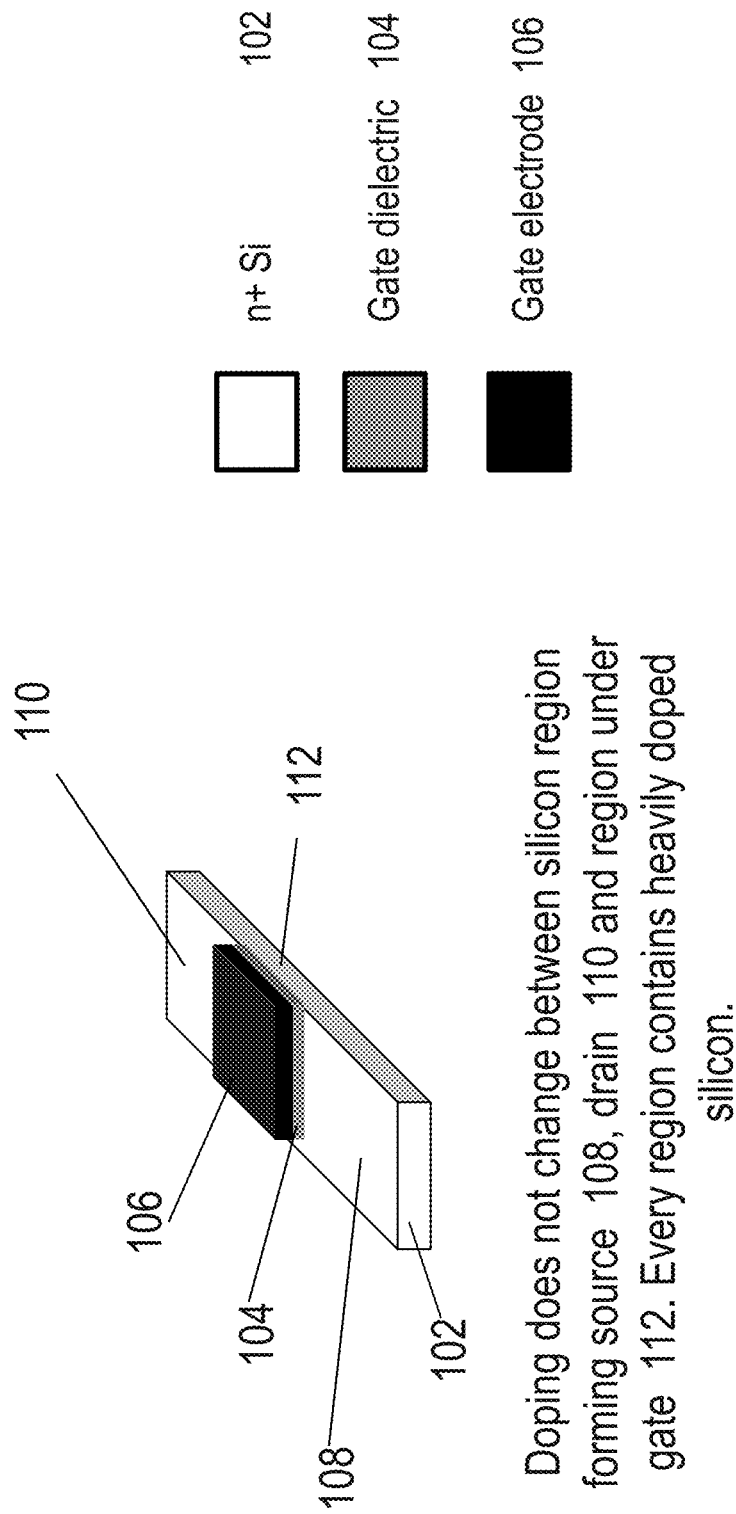
FIGS. 1A-1C show different types of junction-less transistors (JLT) that could be utilized for 3D stacking.
Figure 1B:
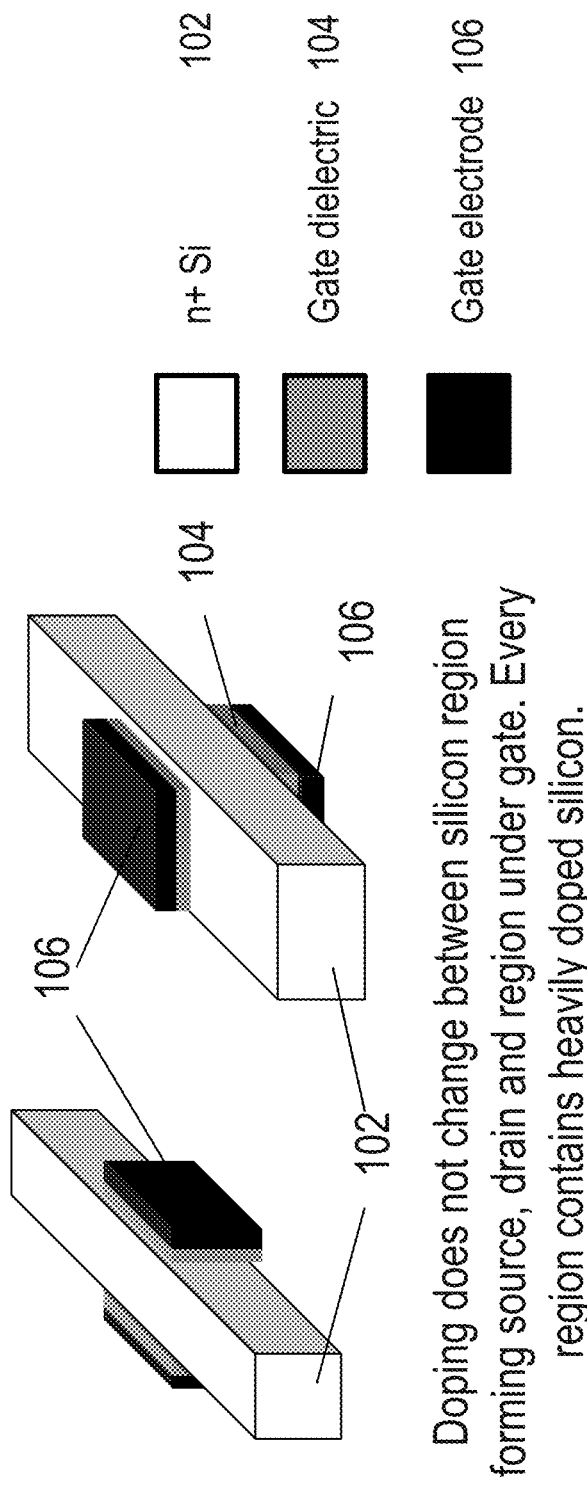
Figure 1C:
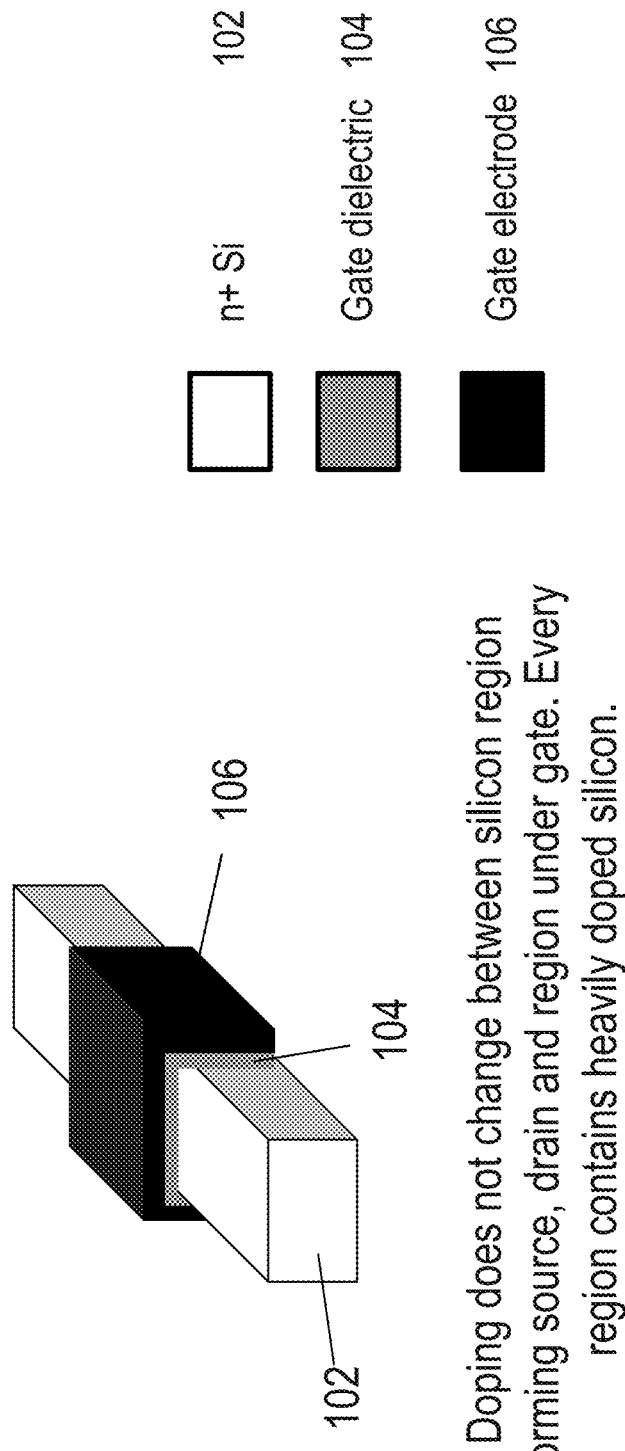

FIG. 1A-1D shows that JLTs that can be 3D stacked fall into four categories based on the number of gates they use: One-side gated JLTs as shown in FIG. 1A, two-side gated JLTs as shown in FIG. 1B, three-side gated JLTs as shown in FIG. 1C, and gate-all-around JLTs as shown in FIG. 1D. The JLTS shown may include n+ Si 102, gate dielectric 104, gate electrode 106, n+ source region 108, n+ drain region 110, and n+ region under gate 112. As the number of JLT gates increases, the gate gets more control of the channel, thereby reducing leakage of the JLT at 0V. Furthermore, the enhanced gate control can be traded-off for higher doping (which improves contact resistance to source-drain regions) or bigger JLT cross-sectional areas (which is easier from a process integration standpoint). However, adding more gates typically increases process complexity.

Some embodiments of this invention may involve floating body DRAM. Background information on floating body DRAM and its operation is given in "Floating Body RAM Technology and its Scalability to 32 nm Node and Beyond," Electron Devices Meeting, 2006. IEDM '06. International, vol., no., pp. 1-4, 11-13 Dec. 2006 by T. Shino, N. Kusunoki, T. Higashi, et al., Overview and future challenges of floating body RAM (FBRAM) technology for 32 nm technology node and beyond, Solid-State Electronics, Volume 53, Issue 7, Papers Selected from the 38th European Solid-State Device Research Conference—ESSDERC'08, July 2009, Pages 676-683, ISSN 0038-1101, DOI: 10.1016/j.sse.2009.03.010 by Takeshi Hamamoto, Takashi Ohsawa, et al., "New Generation of Z-RAM," Electron Devices Meeting, 2007. IEDM 2007. IEEE International, vol., no., pp. 925-928, 10-12 Dec. 2007 by Okhonin, S.; Nagoga, M.; Carman, E, et al. The above publications are incorporated herein by reference.

FIG. 2A-K describe a process flow to construct a horizontally-oriented monolithic 3D DRAM. This monolithic 3D DRAM utilizes the floating body effect and double-gate transistors. No mask is utilized on a "per-memory-layer" basis for the monolithic 3D DRAM concept shown in FIG. 2A-K, and all other masks are shared between different layers. The process flow may include several steps in the following sequence.

Figure 2A:
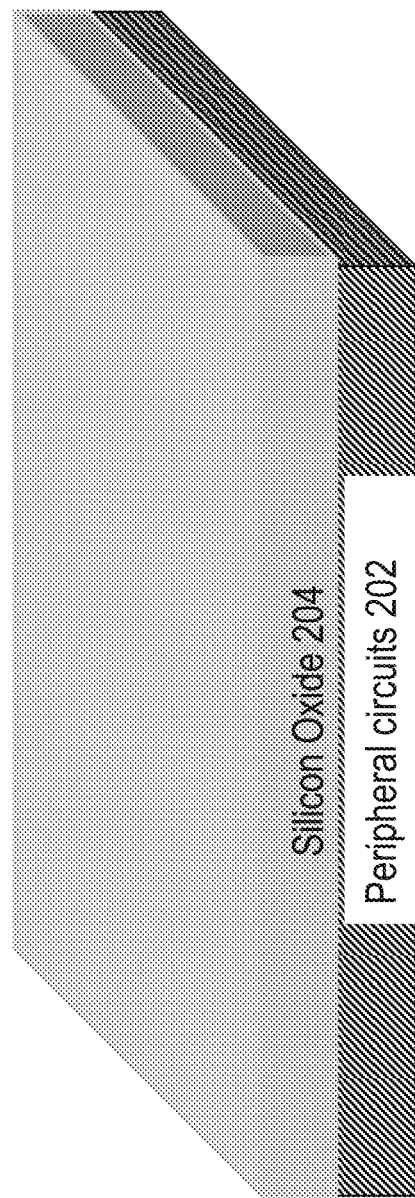

Step (A): Peripheral circuits with tungsten wiring 202 are first constructed and above this a layer of silicon dioxide 204 is deposited. FIG. 2A shows a drawing illustration after Step (A).

Figure 2B:
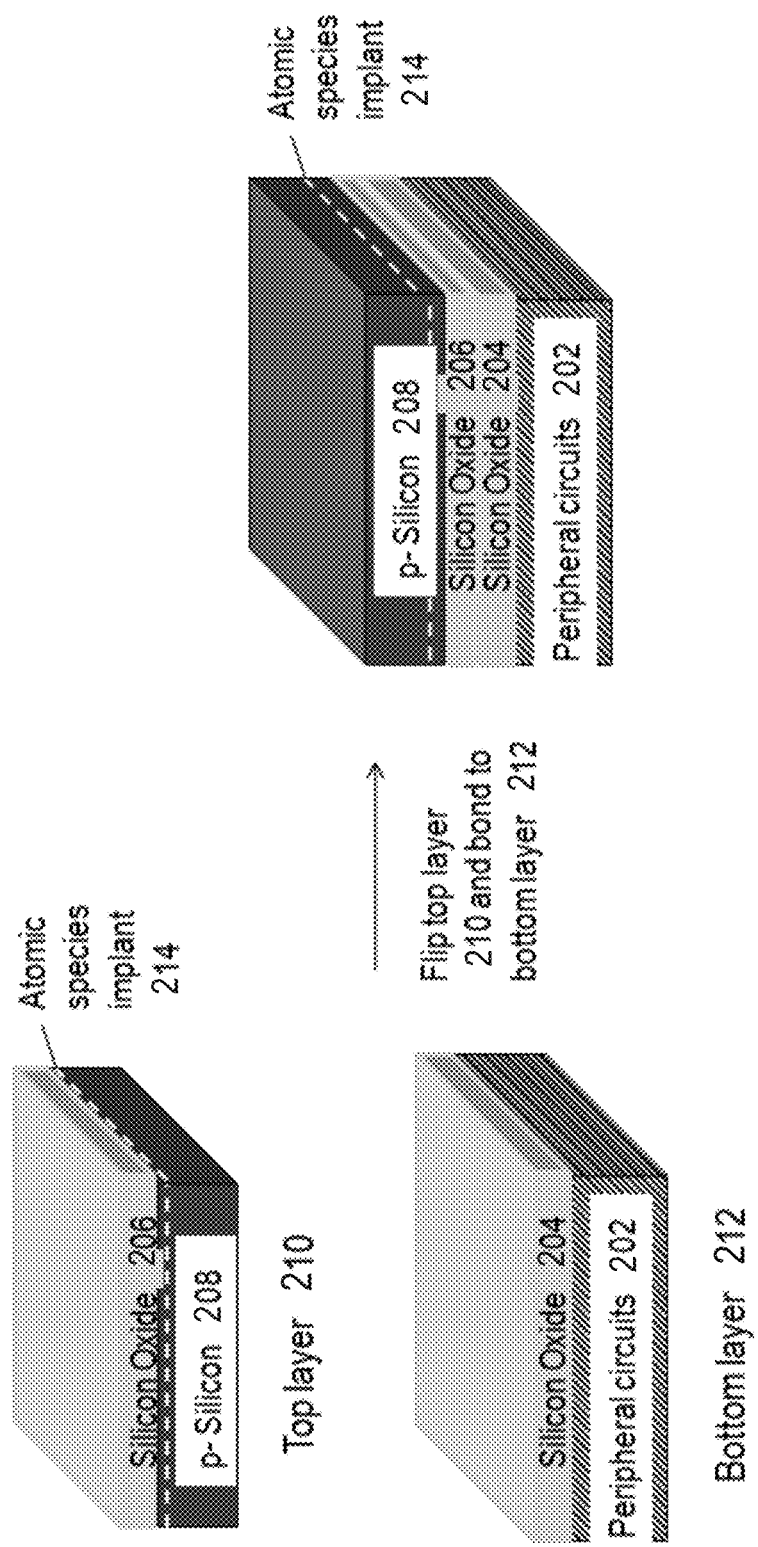

Step (B): FIG. 2B illustrates the structure after Step (B). A wafer of p− Silicon 208 has an oxide layer 206 grown or deposited above it. Following this, hydrogen is implanted into the p− Silicon wafer at a certain depth indicated by 214. Alternatively, some other atomic species such as Helium could be (co-)implanted. This hydrogen implanted p− Silicon wafer 208 forms the top layer 210. The bottom layer 212 may include the peripheral circuits 202 with oxide layer 204. The top layer 210 is flipped and bonded to the bottom layer 212 using oxide-to-oxide bonding.

Figure 2C:
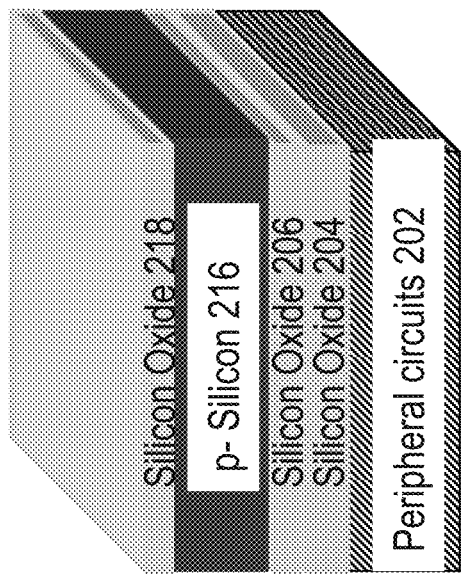

Step (C): FIG. 2C illustrates the structure after Step (C). The stack of top and bottom wafers after Step (B) is cleaved at the hydrogen plane 3014 using either a anneal or a sideways mechanical force or other means. A CMP process is then conducted. A layer of silicon oxide 218 is then deposited atop the p− Silicon layer 216. At the end of this step, a single-crystal p− Si layer 216 exists atop the peripheral circuits, and this has been achieved using layer-transfer techniques.

Figure 2D:
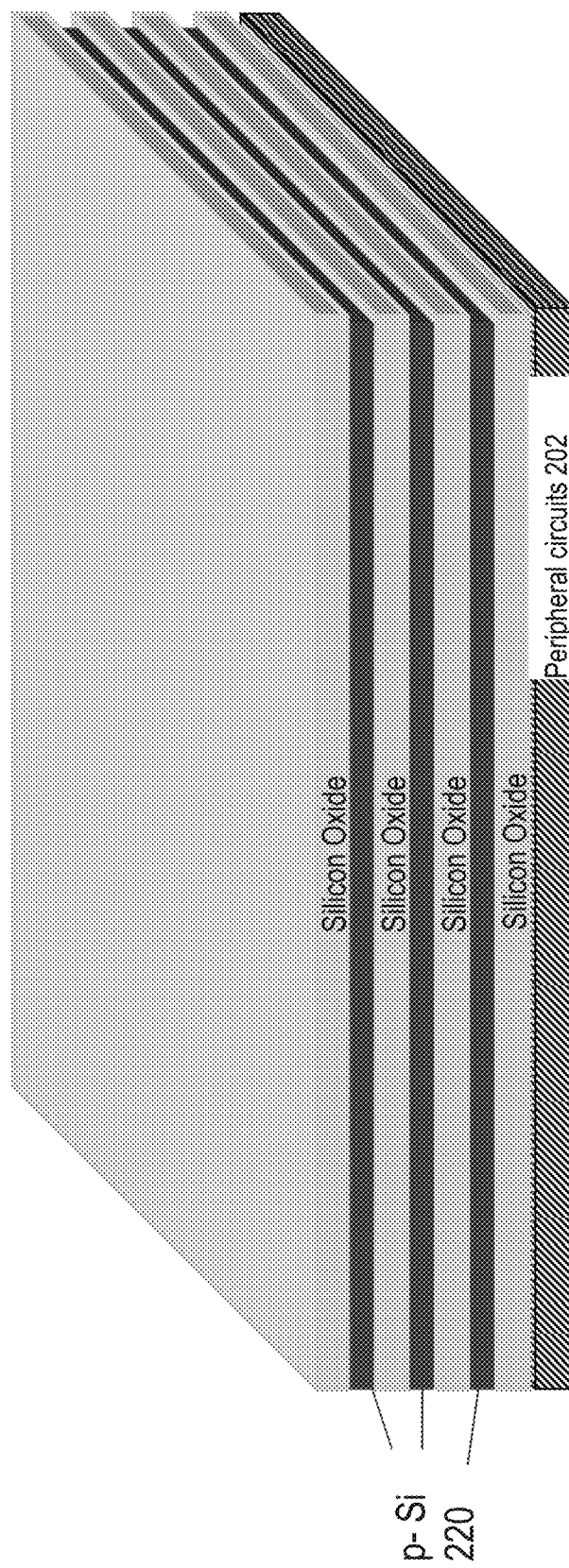

Step (D): FIG. 2D illustrates the structure after Step (D). Using methods similar to Step (B) and (C), multiple p− silicon layers 220 are formed with silicon oxide layers in between.

Figure 2E:
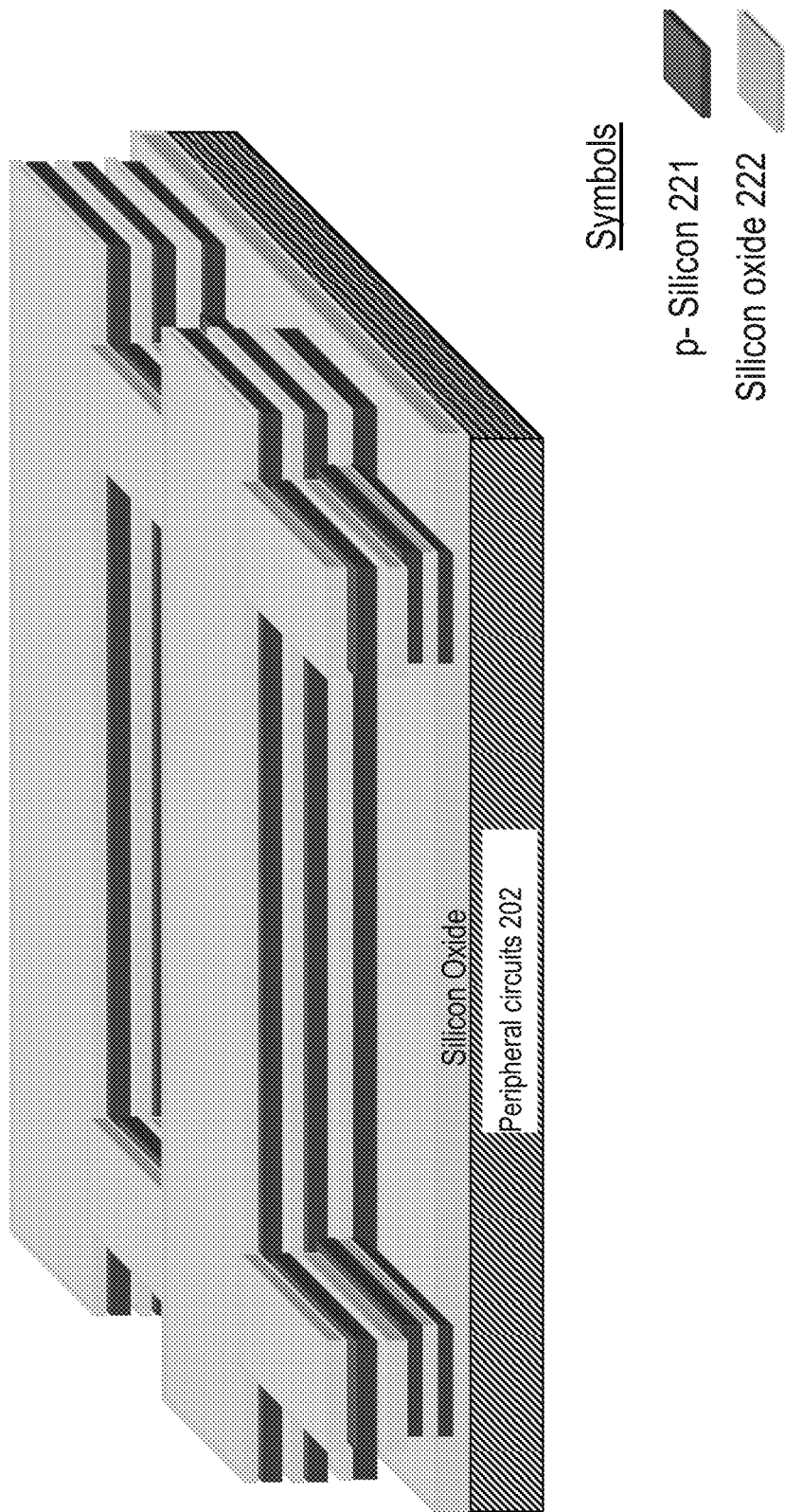

Step (E): FIG. 2E illustrates the structure after Step (E). Lithography and etch processes are then utilized to make a structure as shown in the figure, including layer regions of p− silicon 221 and associated isolation/bonding oxides 222.

Figure 2F:
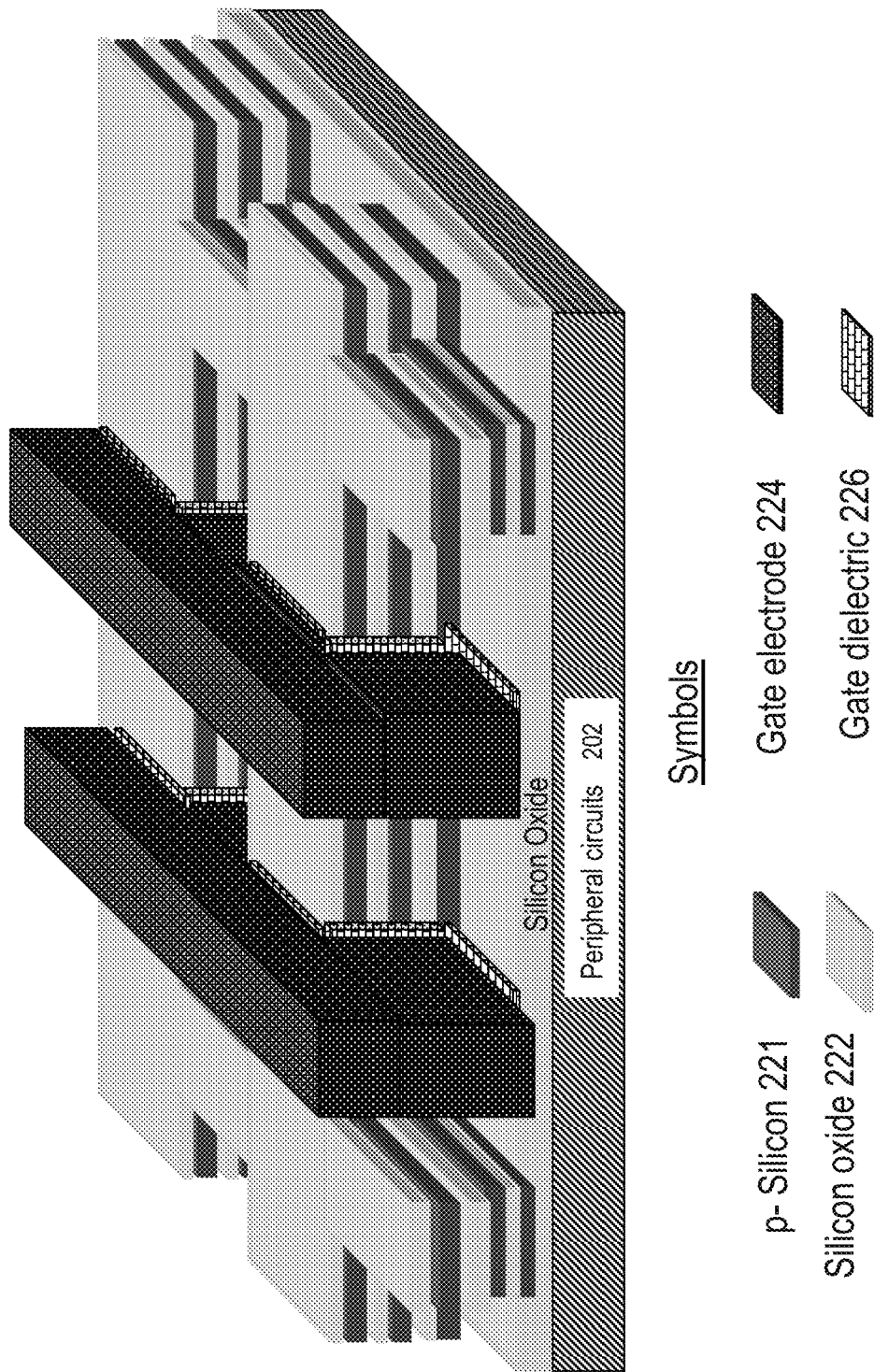

Step (F): FIG. 2F illustrates the structure after Step (F). Gate dielectric 226 and gate electrode 224 are then deposited following which a CMP is done to planarize the gate electrode 224 regions. Lithography and etch are utilized to define gate regions.

Figure 2G:
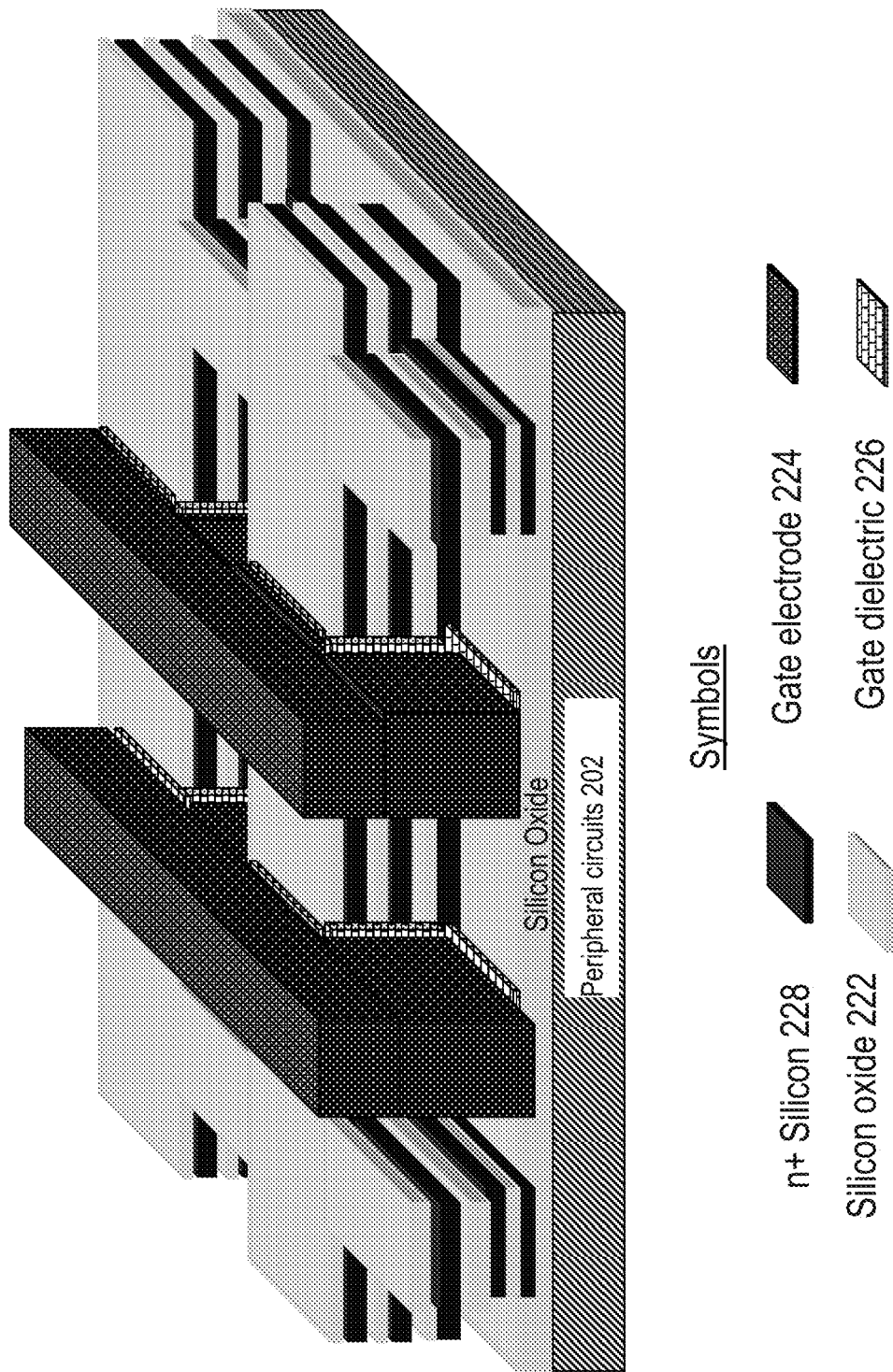

Step (G): FIG. 2G illustrates the structure after Step (G). Using the hard mask defined in Step (F), p− regions not covered by the gate are implanted to form n+ silicon regions 228. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 2H:
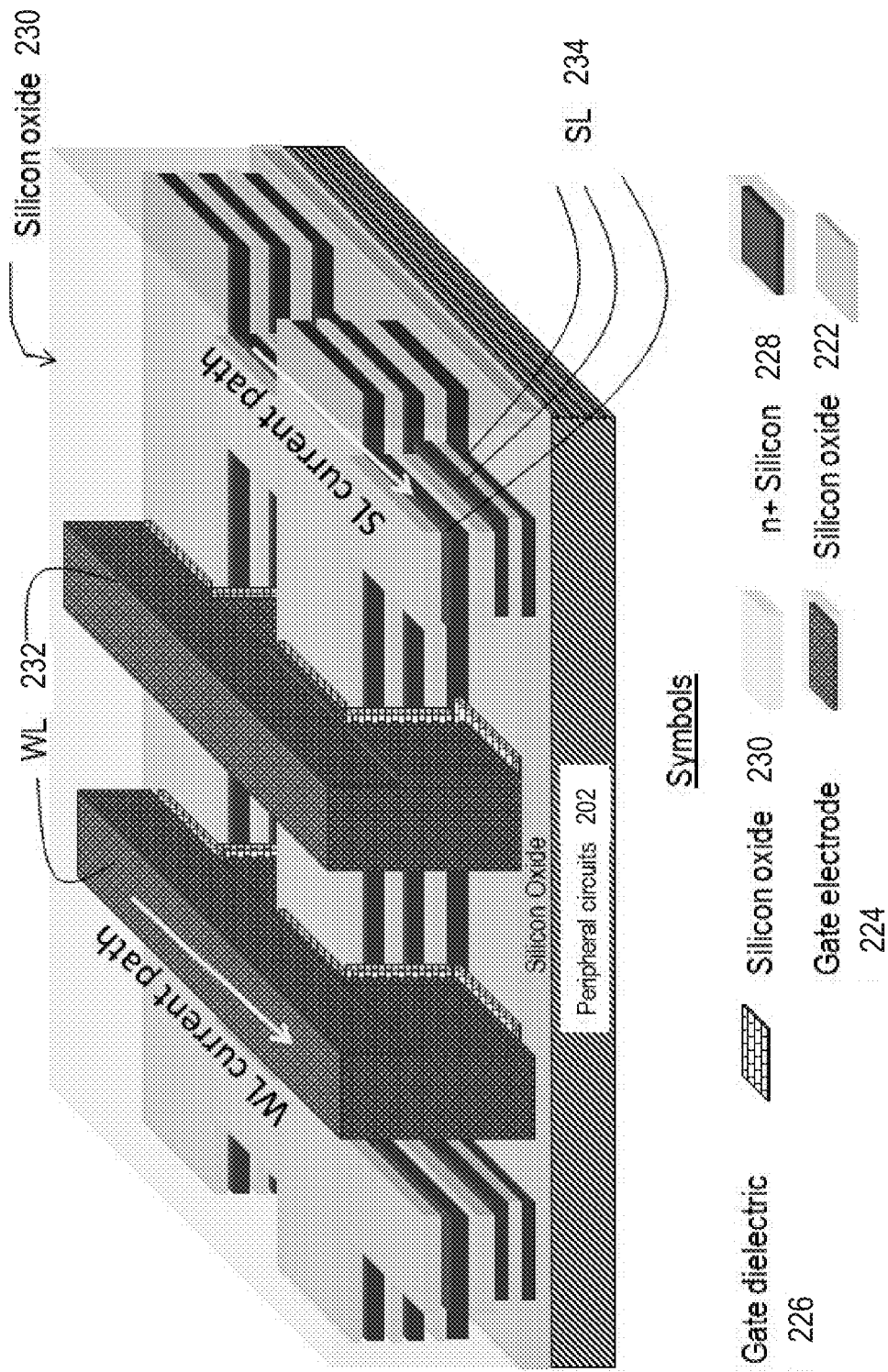
Figure 21:
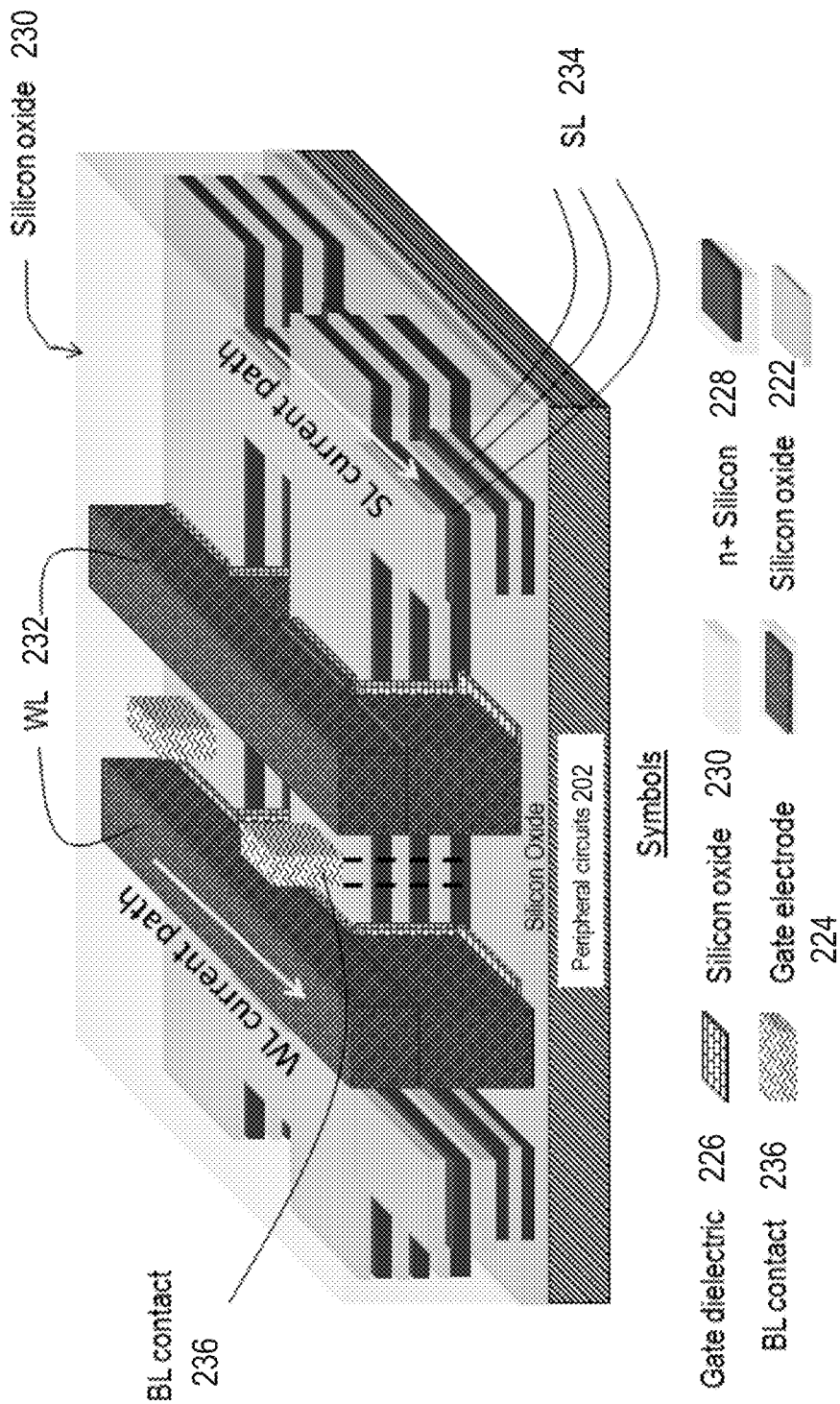

Step (H): FIG. 2H illustrates the structure after Step (H). A silicon oxide layer 230 is then deposited and planarized. For clarity, the silicon oxide layer is shown transparent, along with word-line (WL) 232 and source-line (SL) 234 regions.

Step (I): FIG. 2I illustrates the structure after Step (I). Bit-line (BL) contacts 236 are formed by etching and deposition. These BL contacts are shared among all layers of memory.

Figure 2J:
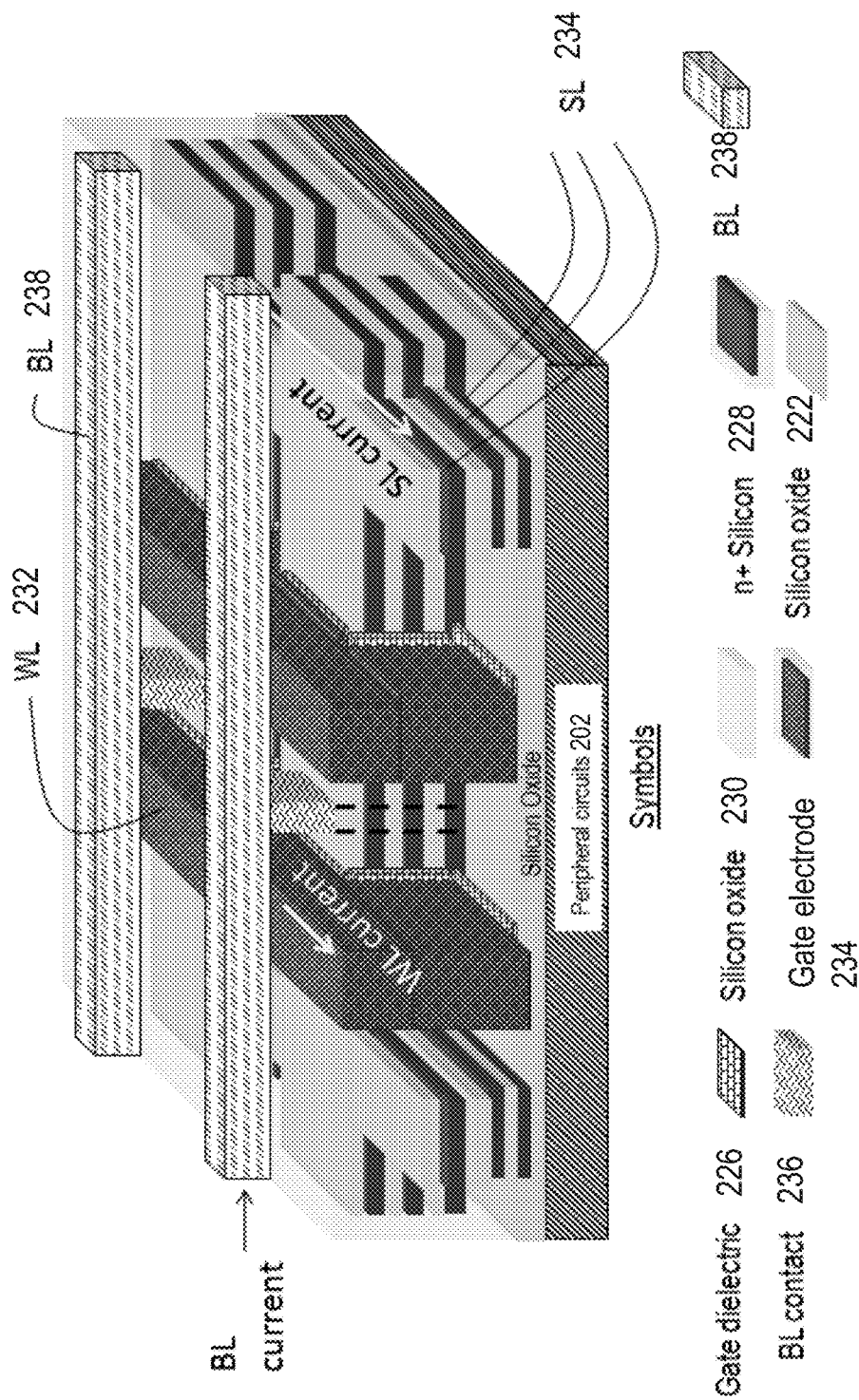

Step (J): FIG. 2J illustrates the structure after Step (J). BLs 238 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology*, 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (J) as well.

FIG. 2K shows cross-sectional views of the array for clarity. Double-gated transistors may be utilized along with the floating body effect for storing information.

A floating-body DRAM has thus been constructed, with (1) horizontally-oriented transistors—i.e. current flowing in substantially the horizontal direction in transistor channels (2) some of the memory cell control lines, e.g., source-lines SL, constructed of heavily doped silicon and embedded in the memory cell layer, (3) side gates simultaneously deposited over multiple memory layers, and (4) monocrystalline (or single-crystal) silicon layers obtained by layer transfer techniques such as ion-cut.

With the explanations for the formation of monolithic 3D DRAM with ion-cut in this section, it is clear to one skilled in the art that alternative implementations are possible. BL and SL nomenclature has been used for two terminals of the 3D DRAM array, and this nomenclature can be interchanged. Each gate of the double gate 3D DRAM can be independently controlled for better control of the memory cell. To implement these changes, the process steps in FIG. 2 may be modified. Moreover, selective epi technology or laser recrystallization technology could be utilized for implementing structures shown in FIG. 2A-K. Various other types of layer transfer schemes that have been described in Section 1.3.4 of the parent application (Ser. No. 12/901,890, U.S. Pat. No. 8,026,521) can be utilized for construction of various 3D DRAM structures. Furthermore, buried wiring, i.e. where wiring for memory arrays is below the memory layers but above the periphery, may also be used. In addition, other variations of the monolithic 3D DRAM concepts are possible.

While many of today's memory technologies rely on charge storage, several companies are developing non-volatile memory technologies based on resistance of a material changing. Examples of these resistance-based memories include phase change memory, Metal Oxide memory, resistive RAM (RRAM), memristors, solid-electrolyte memory, ferroelectric RAM, MRAM, etc. Background information on these resistive-memory types is given in "Overview of candidate device technologies for storage-class memory," *IBM Journal of Research and Development*, vol. 52, no. 4.5, pp. 449-464, July 2008 by Burr, G. W.; Kurdi, B. N.; Scott, J. C.; Lam, C. H.; Gopalakrishnan, K.; Shenoy, R. S.

FIGS. 3A-J describe a novel memory architecture for resistance-based memories, and a procedure for its construction. The memory architecture utilizes junction-less transistors and has a resistance-based memory element in series with a transistor selector. No mask is utilized on a "per-memory-layer" basis for the monolithic 3D resistance change memory (or resistive memory) concept shown in FIG. 3A-J, and all other masks are shared between different layers. The process flow may include several steps that occur in the following sequence.

Figure 3A:
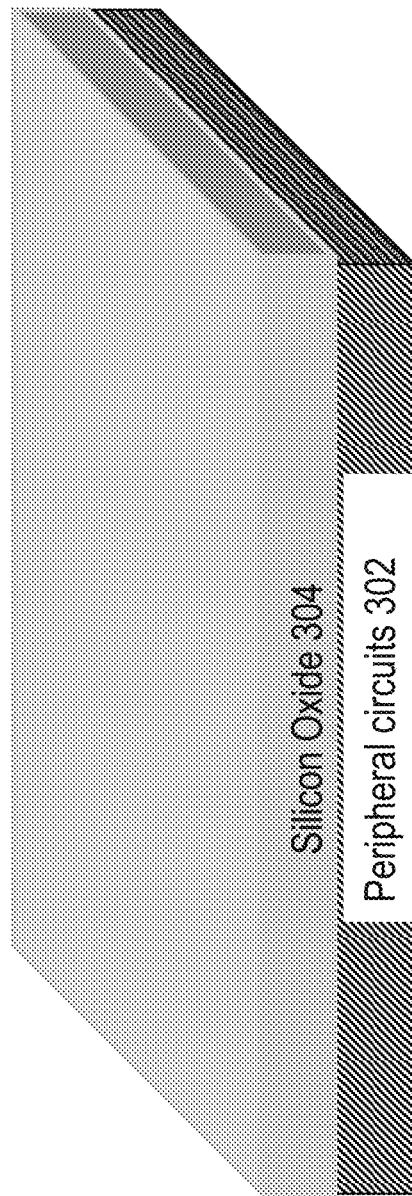
FIGS. 3A-3J show a zero-mask per layer 3D resistive memory with a junction-less transistor.

Step (A): Peripheral circuits 302 are first constructed and above this a layer of silicon dioxide 304 is deposited. FIG. 3A shows a drawing illustration after Step (A).

Figure 3B:
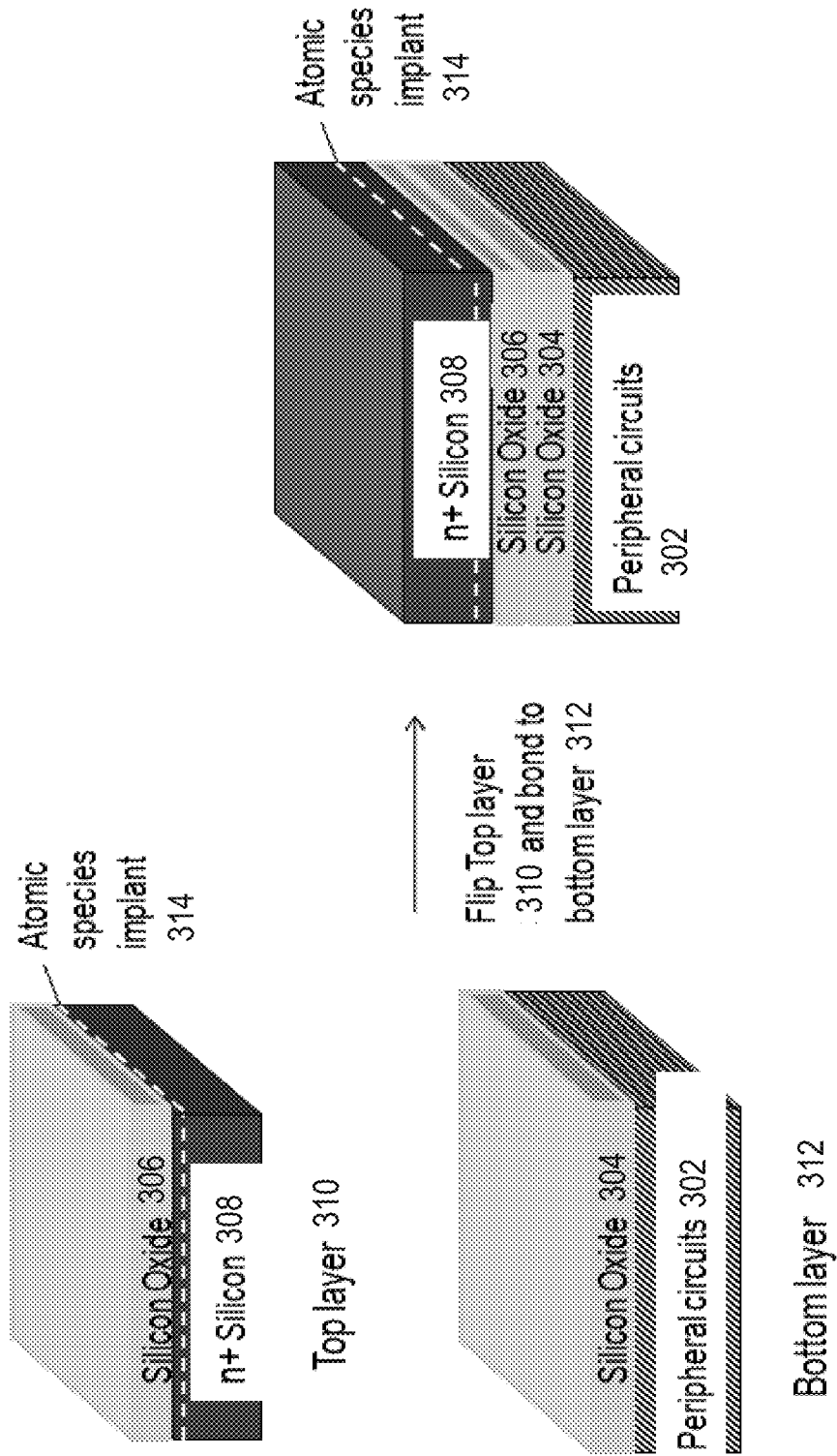

Step (B): FIG. 3B illustrates the structure after Step (B). A wafer of n+ Silicon 308 has an oxide layer 306 grown or deposited above it. Following this, hydrogen is implanted into the n+ Silicon wafer at a certain depth indicated by 314. Alternatively, some other atomic species such as Helium could be (co-)implanted. This hydrogen implanted n+ Silicon wafer 308 forms the top layer 310. The bottom layer 312 may include the peripheral circuits 302 with oxide layer 304. The top layer 310 is flipped and bonded to the bottom layer 312 using oxide-to-oxide bonding.

Figure 3C:
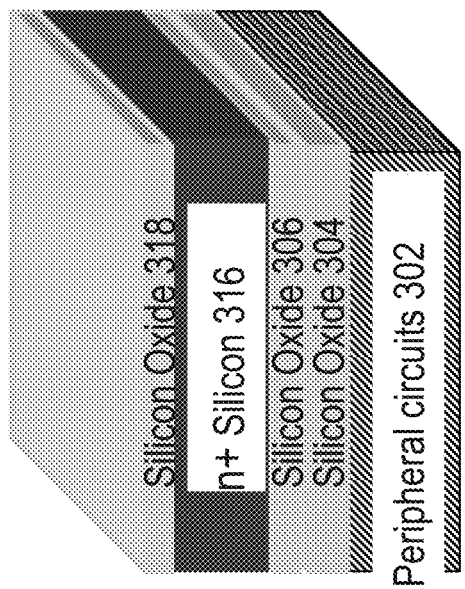

Step (C): FIG. 3C illustrates the structure after Step (C). The stack of top and bottom wafers after Step (B) is cleaved at the hydrogen plane 314 using either an anneal or a sideways mechanical force or other means. A CMP process is then conducted. A layer of silicon oxide 318 is then deposited atop the n+ Silicon layer 316. At the end of this step, a single-crystal n+ Si layer 316 exists atop the peripheral circuits, and this has been achieved using layer-transfer techniques.

Figure 3D:
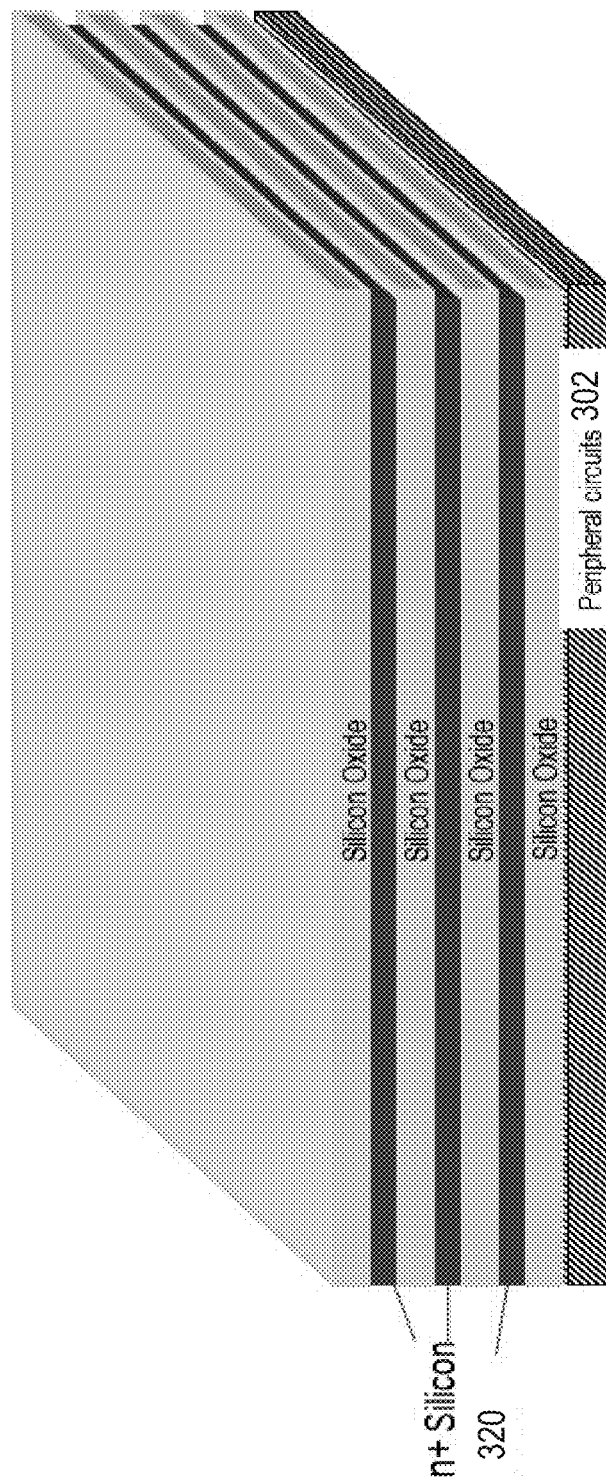

Step (D): FIG. 3D illustrates the structure after Step (D). Using methods similar to Step (B) and (C), multiple n+ silicon layers 320 are formed with silicon oxide layers in between.

Figure 3E:
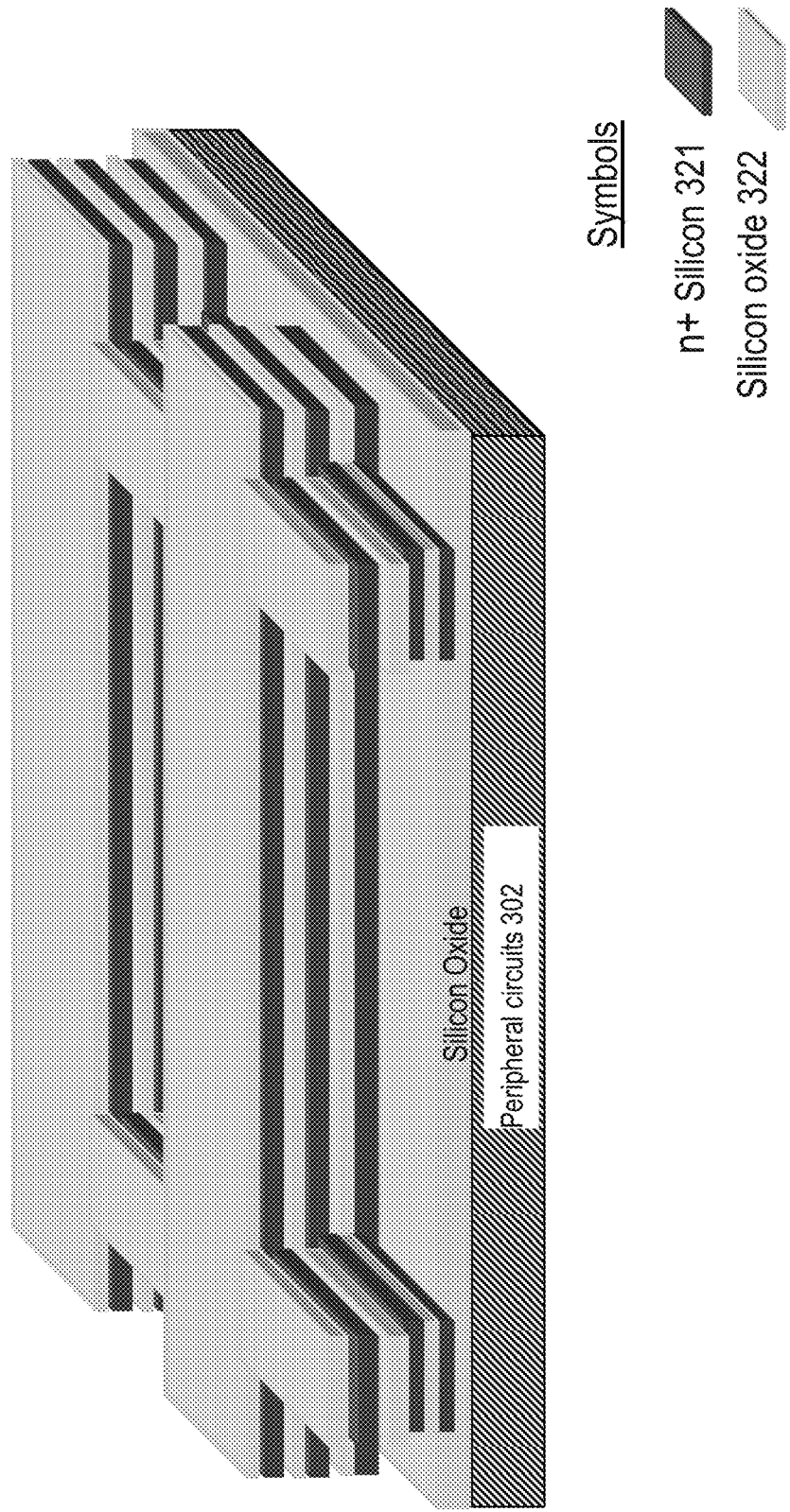

Step (E): FIG. 3E illustrates the structure after Step (E). Lithography and etch processes are then utilized to make a structure as shown in the figure, including layer regions of n+ silicon 321 and associated bonding/isolation oxides 322.

Figure 3F:
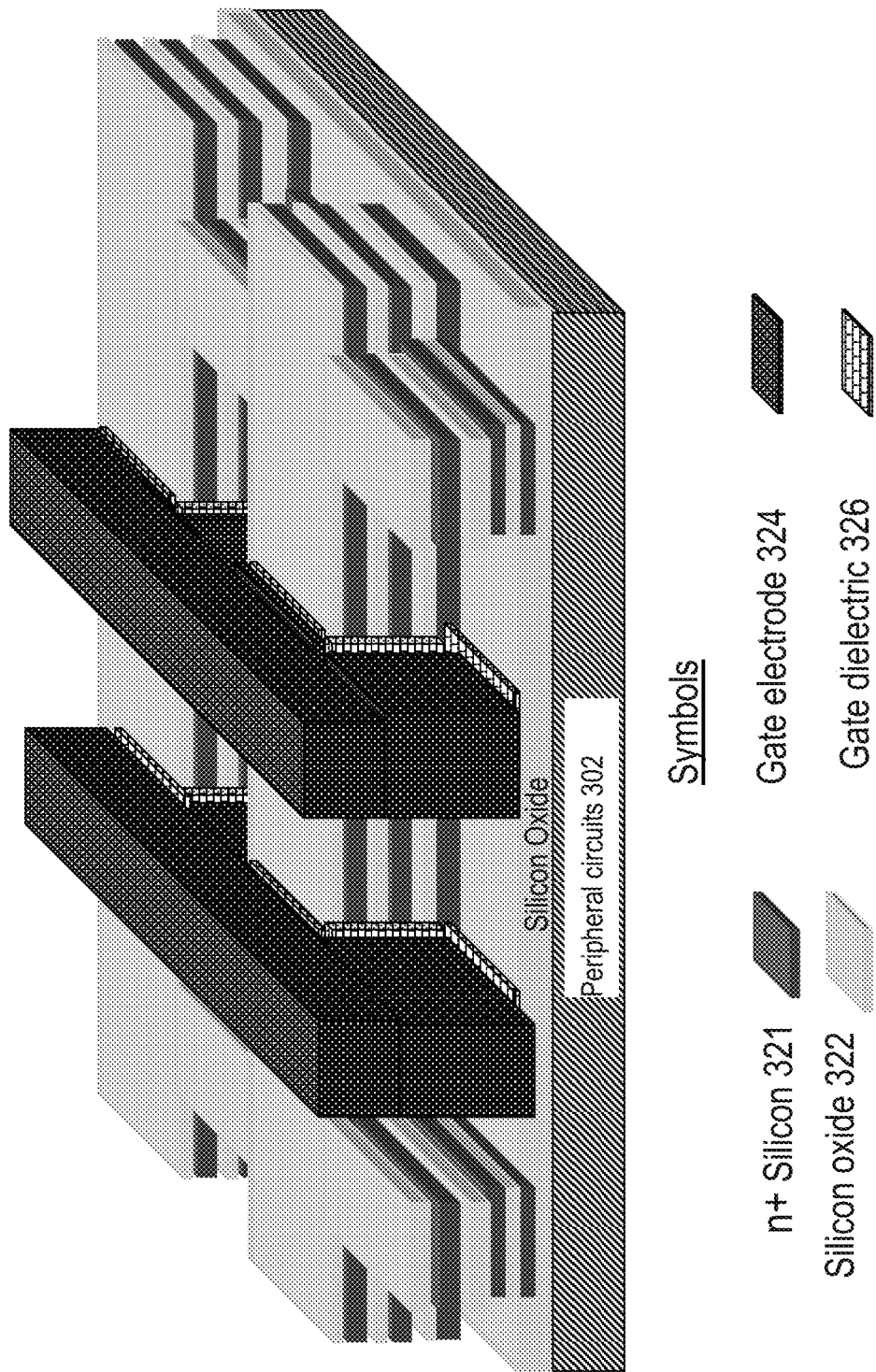

Step (F): FIG. 3F illustrates the structure after Step (F). Gate dielectric 326 and gate electrode 324 are then deposited following which a CMP is performed to planarize the gate electrode 324 regions. Lithography and etch are utilized to define gate regions.

Figure 3G:
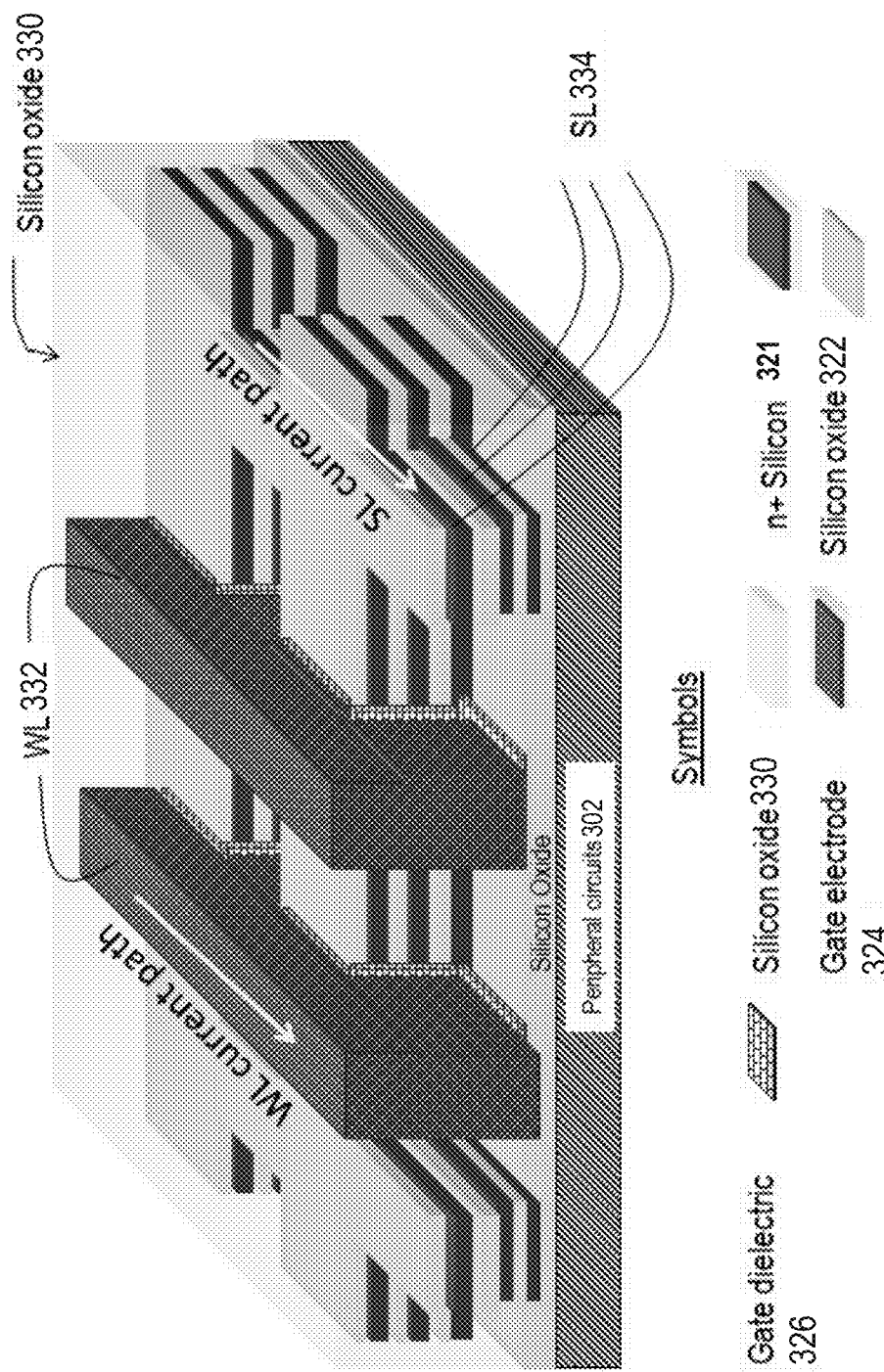

Step (G): FIG. 3G illustrates the structure after Step (G). A silicon oxide layer 330 is then deposited and planarized. The silicon oxide layer is shown transparent in the figure for clarity, along with word-line (WL) 332 and source-line (SL) 334 regions.

Figure 3H:
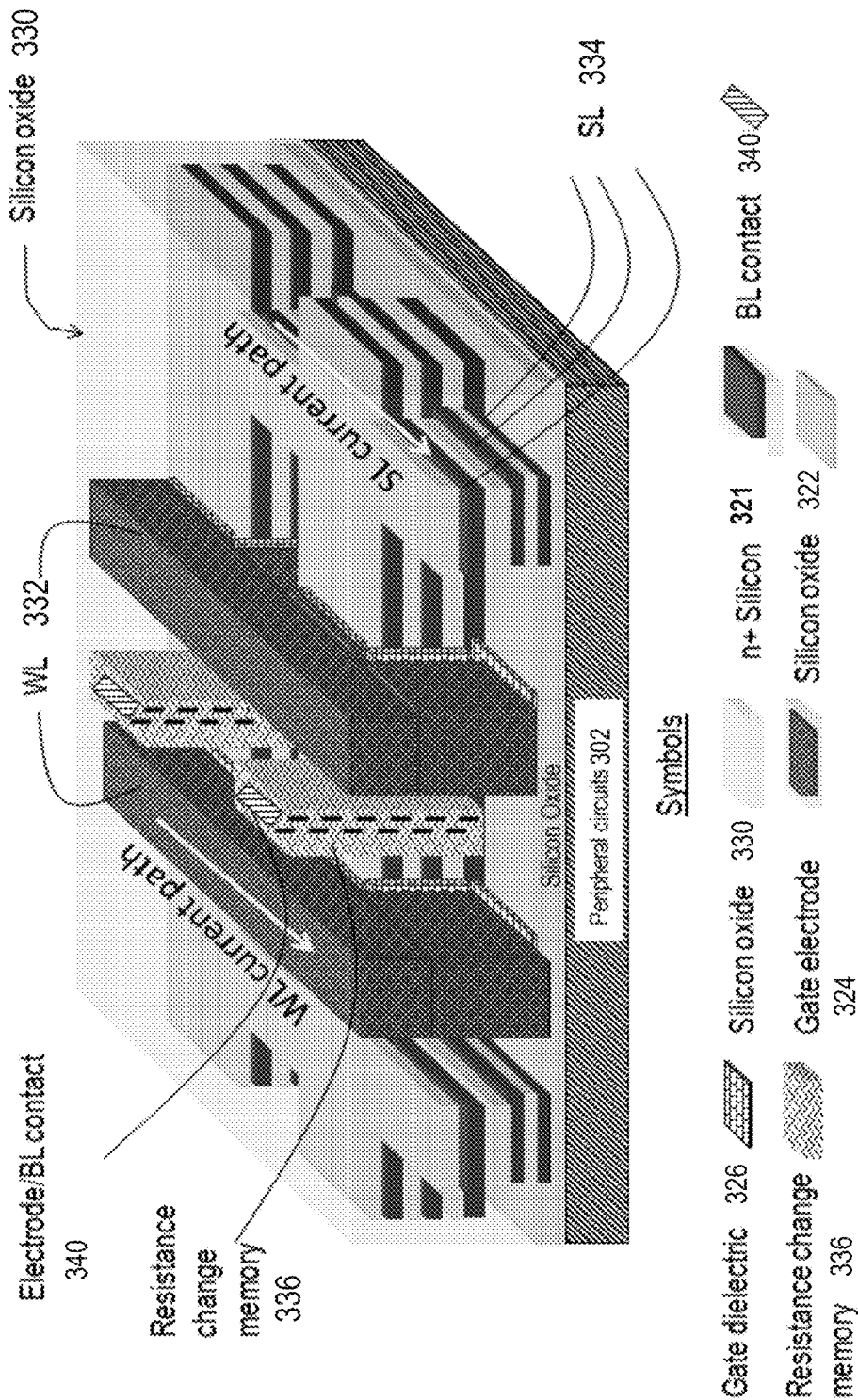

Step (H): FIG. 3H illustrates the structure after Step (H). Vias are etched through multiple layers of silicon and silicon dioxide as shown in the figure. A resistance change memory material 336 is then deposited (preferably with atomic layer deposition (ALD)). Examples of such a material include hafnium oxide, well known to change resistance by applying voltage. An electrode for the resistance change memory element is then deposited (preferably using ALD) and is shown as electrode/BL contact 340. A CMP process is then conducted to planarize the surface. It can be observed that multiple resistance change memory elements in series with junctionless transistors are created after this step.

Figure 3I:
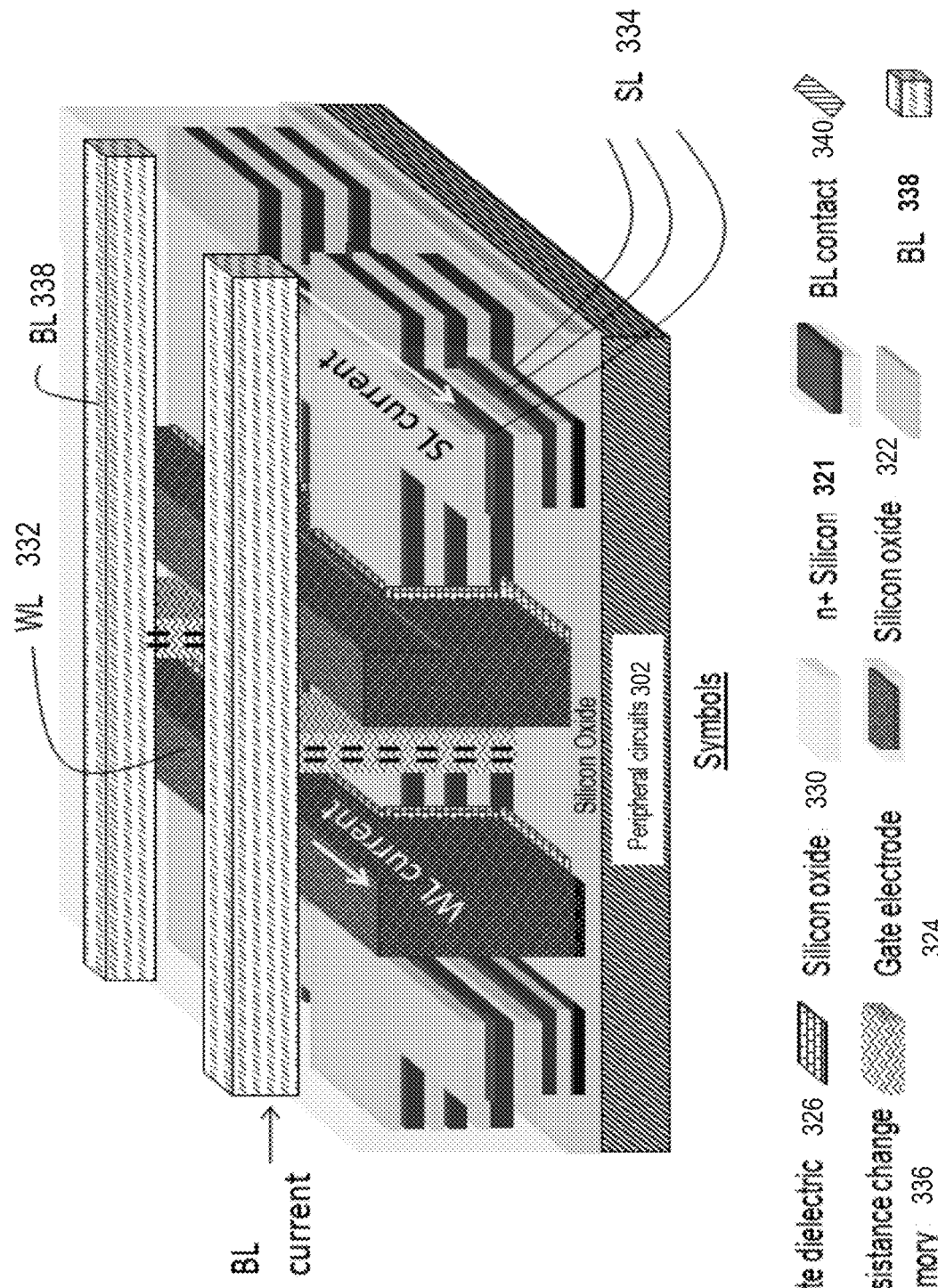

Step (I): FIG. 3I illustrates the structure after Step (I). BLs 338 are then constructed. Contacts are made to BLs, WLs and SLs of the memory array at its edges. SL contacts can be made into stair-like structures using techniques described in in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be achieved in steps prior to Step (I) as well.

Figure 3J:
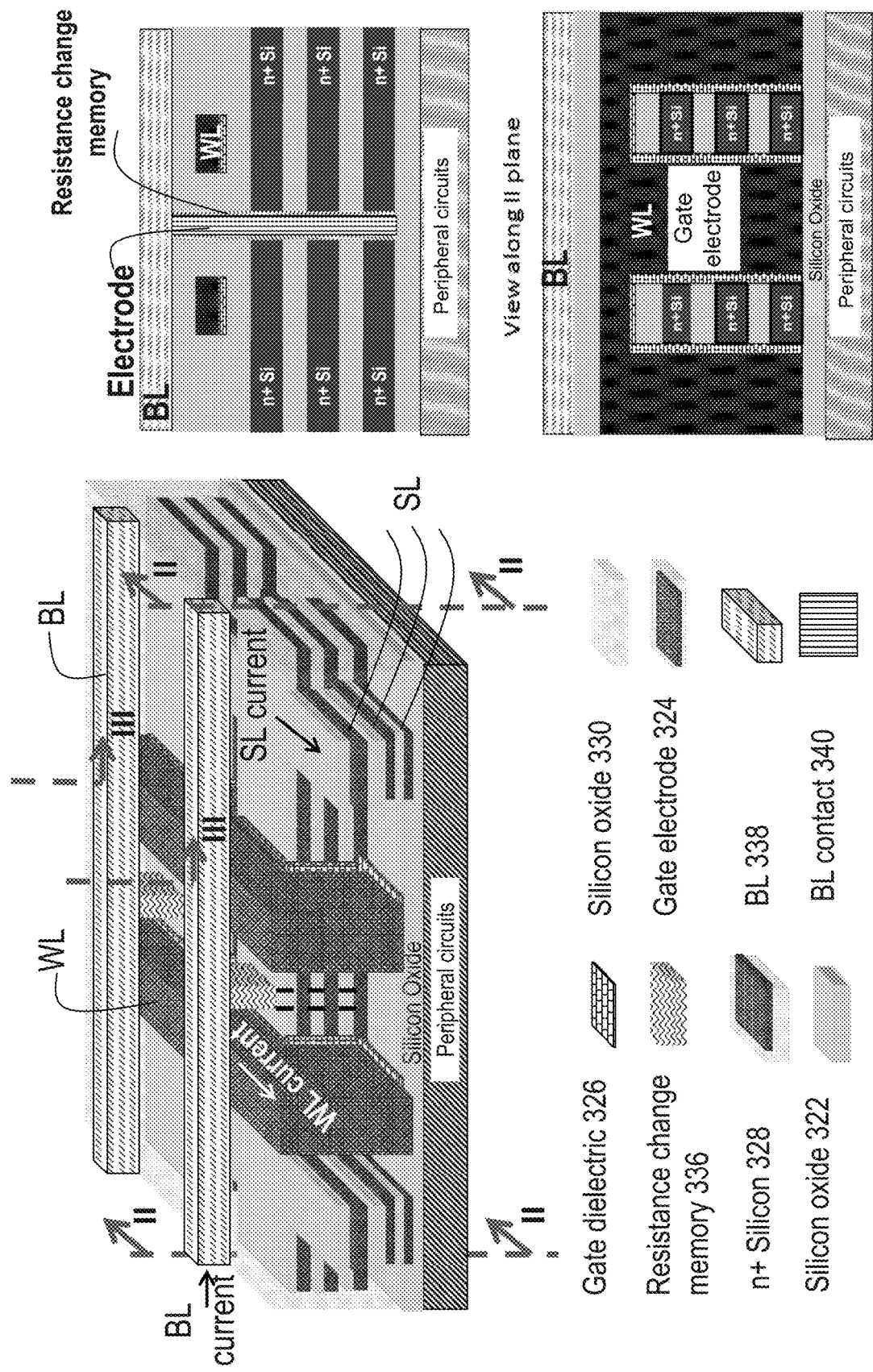

FIG. 3J shows cross-sectional views of the array for clarity. A 3D resistance change memory has thus been constructed, with (1) horizontally-oriented transistors—i.e. current flowing in substantially the horizontal direction in transistor channels, (2) some of the memory cell control lines, e.g., source-lines SL, constructed of heavily doped silicon and embedded in the memory cell layer, (3) side gates that are simultaneously deposited over multiple memory layers for transistors, and (4) monocrystalline (or single-crystal) silicon layers obtained by layer transfer techniques such as ion-cut.

FIGS. 4A-4K describe an alternative process flow to construct a horizontally-oriented monolithic 3D resistive memory array. This embodiment has a resistance-based memory element in series with a transistor selector. No mask is utilized on a "per-memory-layer" basis for the monolithic 3D resistance change memory (or resistive memory) concept shown in FIGS. 4A-4K, and all other masks are shared between different layers. The process flow may include several steps as described in the following sequence.

Figure 4A:
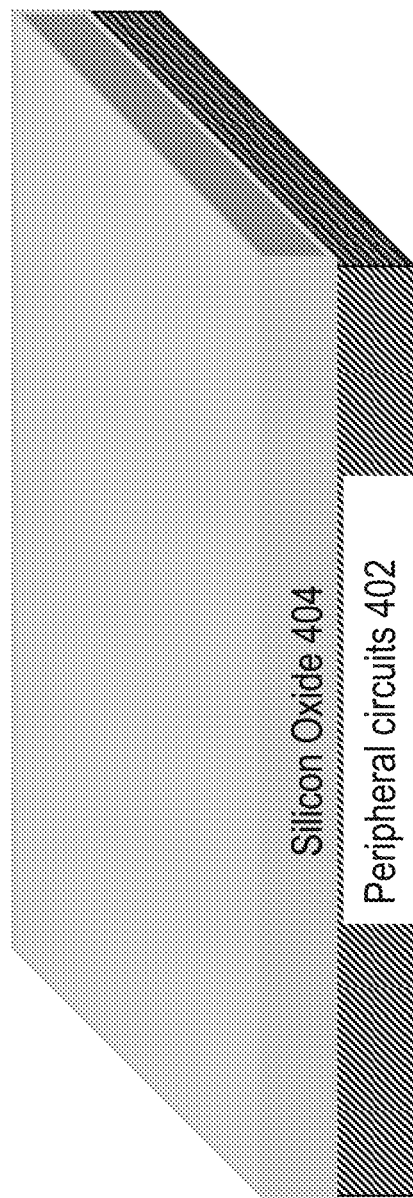

Step (A): Peripheral circuits with tungsten wiring 402 are first constructed and above this a layer of silicon dioxide 404 is deposited. FIG. 4A shows a drawing illustration after Step (A).

Figure 4B:
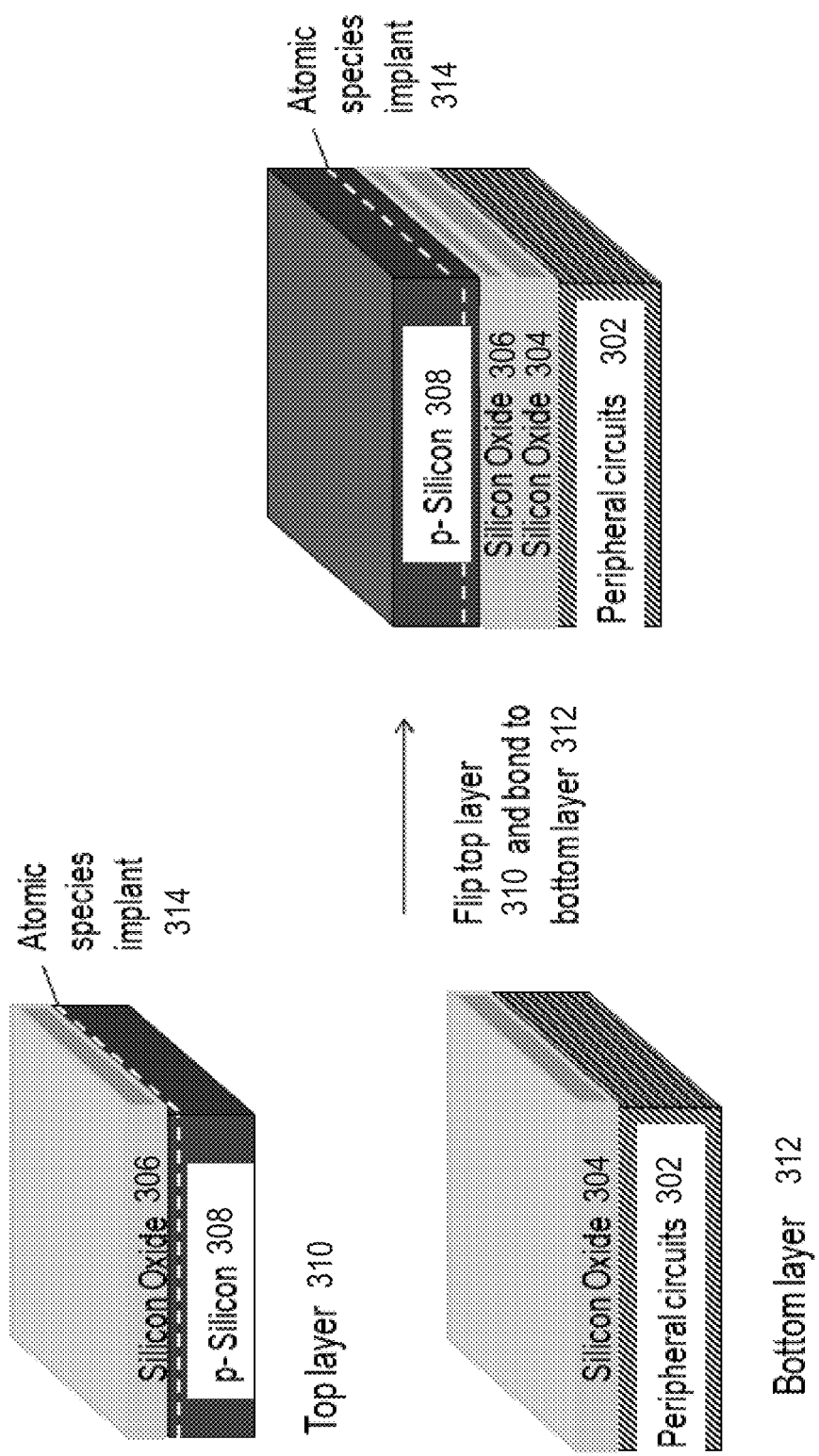

Step (B): FIG. 4B illustrates the structure after Step (B). A wafer of p− Silicon 408 has an oxide layer 406 grown or deposited above it. Following this, hydrogen is implanted into the p− Silicon wafer at a certain depth indicated by 414. Alternatively, some other atomic species such as Helium could be (co-)implanted. This hydrogen implanted p− Silicon wafer 408 forms the top layer 410. The bottom layer 412 may include the peripheral circuits 402 with oxide layer 404. The top layer 410 is flipped and bonded to the bottom layer 412 using oxide-to-oxide bonding.

Figure 4C:
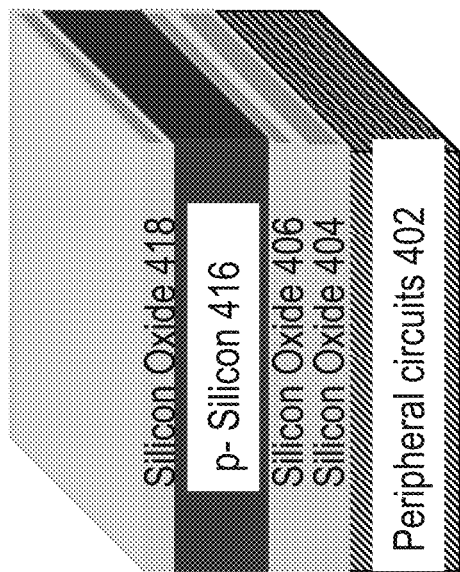

Step (C): FIG. 4C illustrates the structure after Step (C). The stack of top and bottom wafers after Step (B) is cleaved at the hydrogen plane 414 using either a anneal or a sideways mechanical force or other means. A CMP process is then conducted. A layer of silicon oxide 418 is then deposited atop the p− Silicon layer 416. At the end of this step, a single-crystal p− Si layer 416 exists atop the peripheral circuits, and this has been achieved using layer-transfer techniques.

Figure 4D:
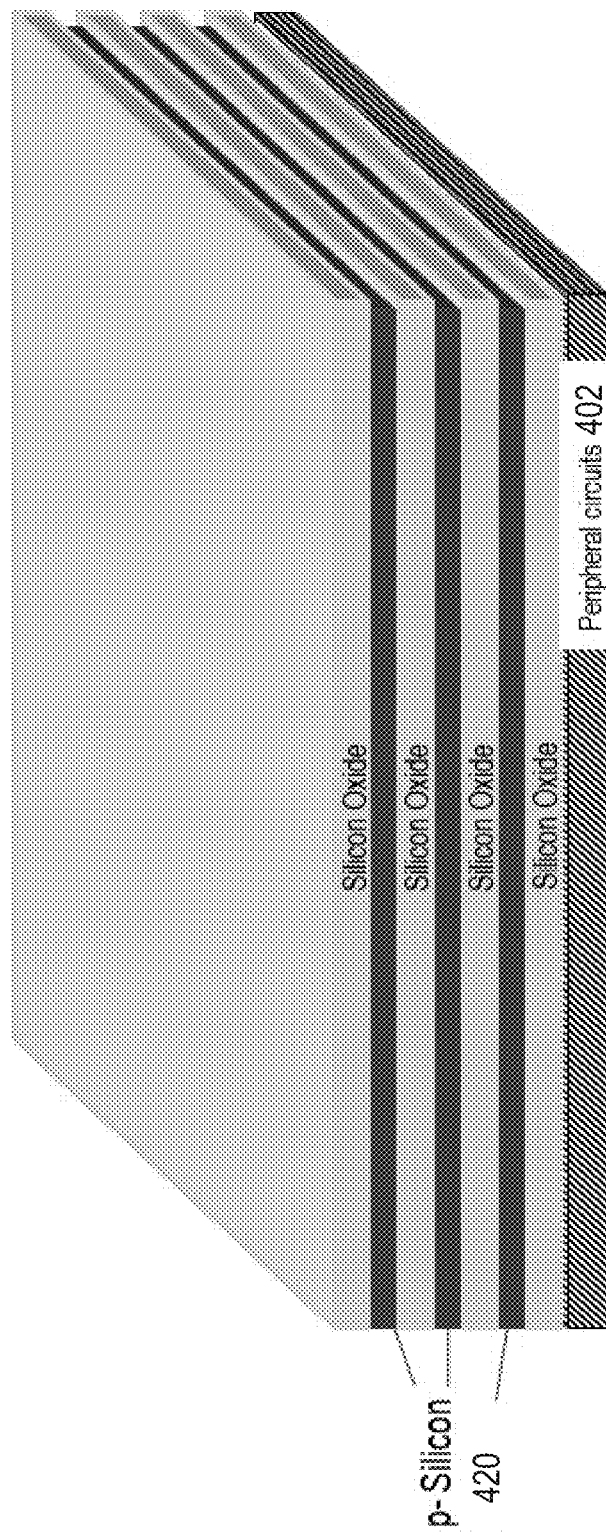

Step (D): FIG. 4D illustrates the structure after Step (D). Using methods similar to Step (B) and (C), multiple p− silicon layers 420 are formed with silicon oxide layers in between.

Figure 4E:
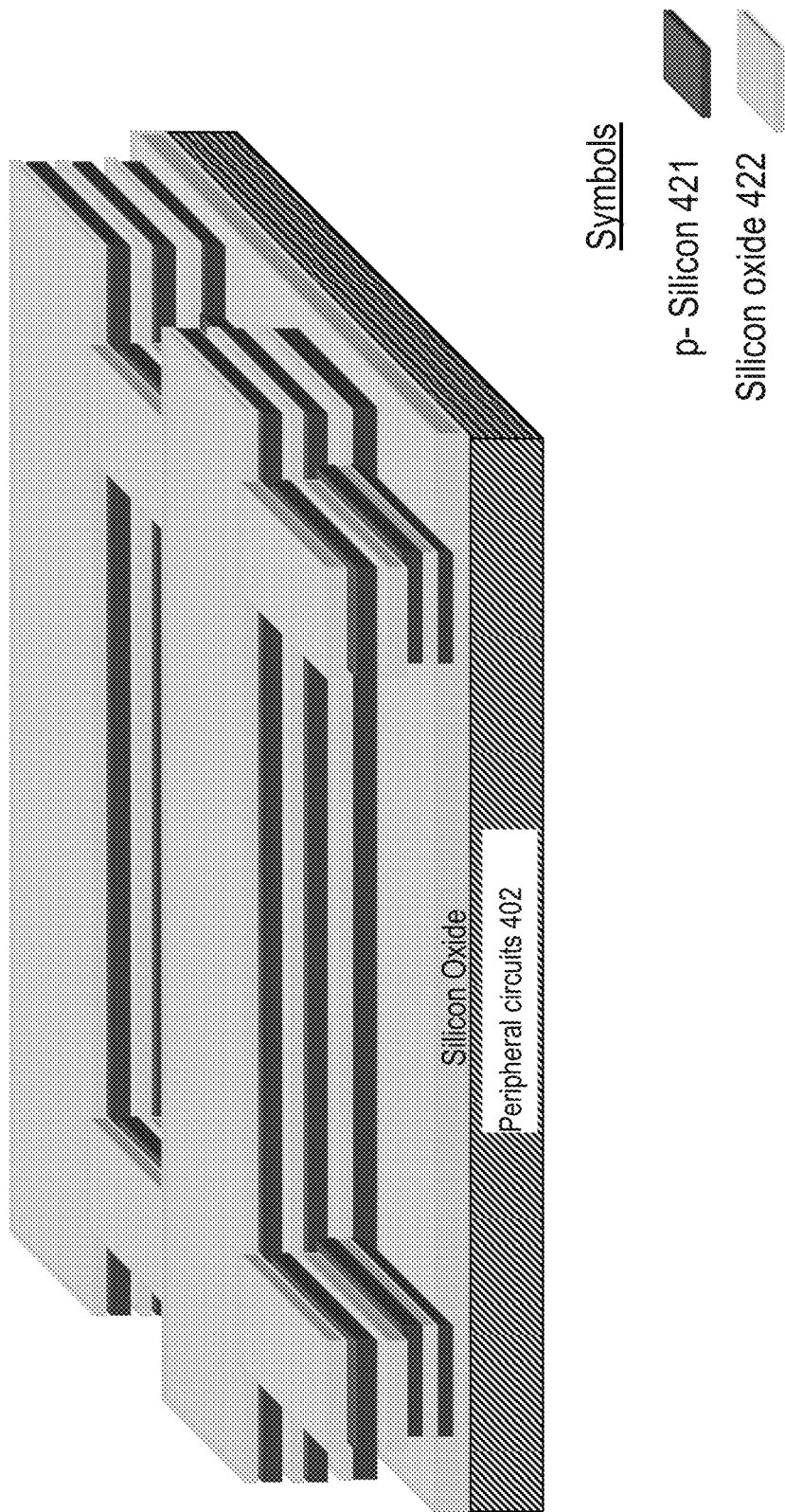

Step (E): FIG. 4E illustrates the structure after Step (E). Lithography and etch processes are then utilized to make a structure as shown in the figure, including layer regions of p− silicon 421 and associated bonding/isolation oxide 422.

Figure 4F:
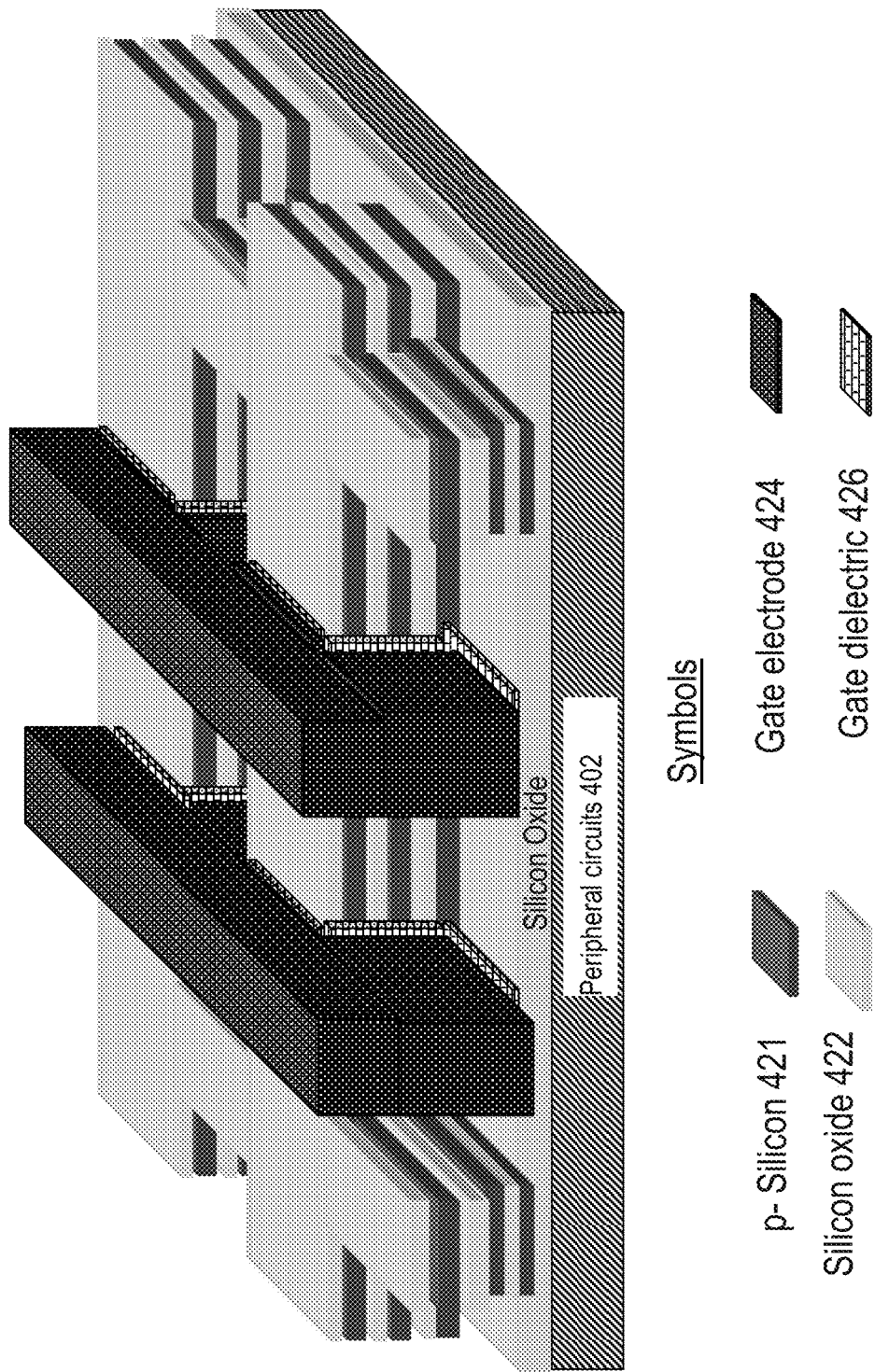

Step (F): FIG. 4F illustrates the structure on after Step (F). Gate dielectric 426 and gate electrode 424 are then deposited following which a CMP is done to planarize the gate electrode 424 regions. Lithography and etch are utilized to define gate regions.

Figure 4G:
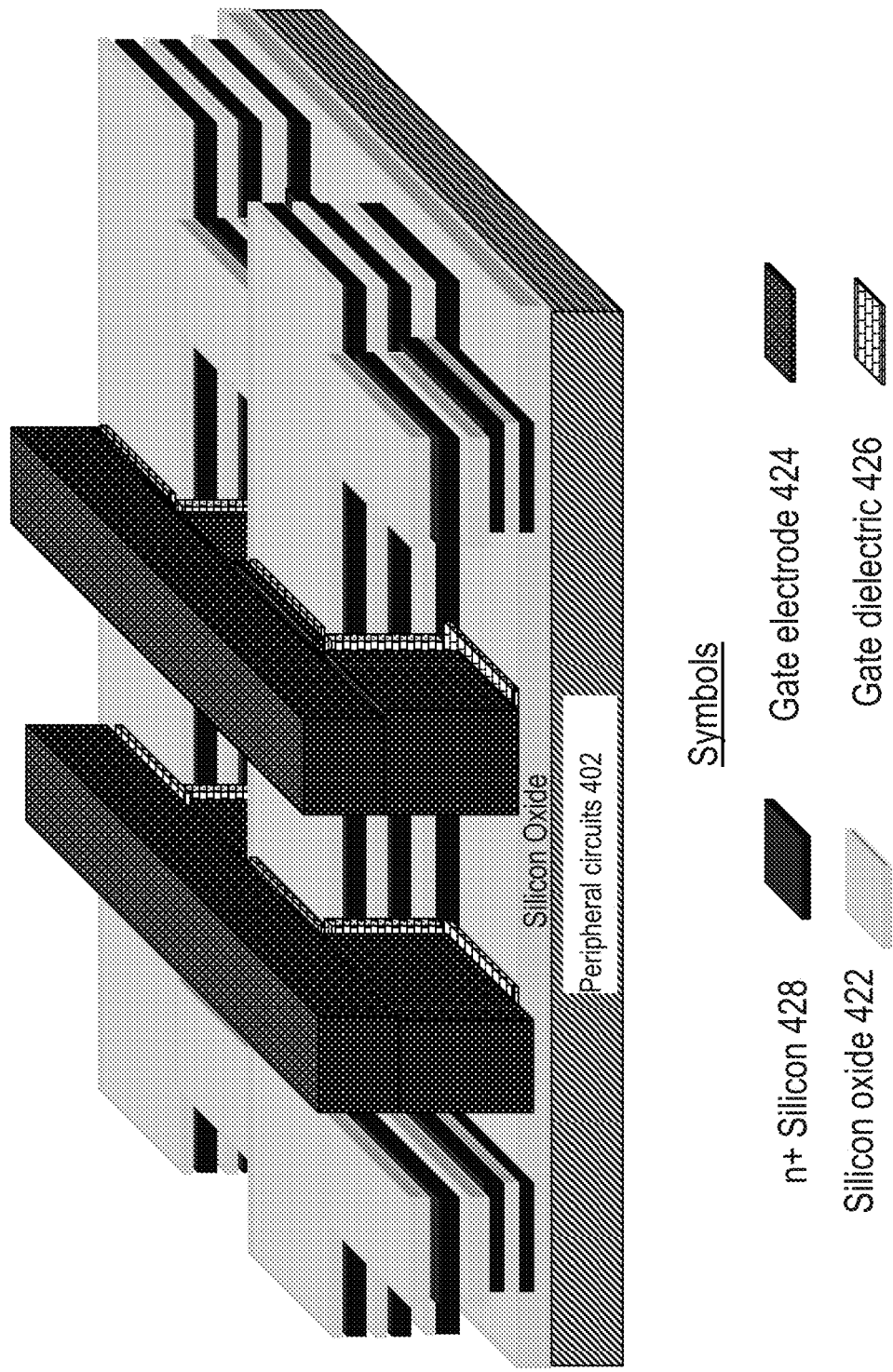

Step (G): FIG. 4G illustrates the structure after Step (G). Using the hard mask defined in Step (F), p− regions not covered by the gate are implanted to form n+ silicon regions 428. Spacers are utilized during this multi-step implantation process and layers of silicon present in different layers of the stack have different spacer widths to account for lateral straggle of buried layer implants. Bottom layers could have larger spacer widths than top layers. A thermal annealing step, such as a RTA or spike anneal or laser anneal or flash anneal, is then conducted to activate n+ doped regions.

Figure 4H:
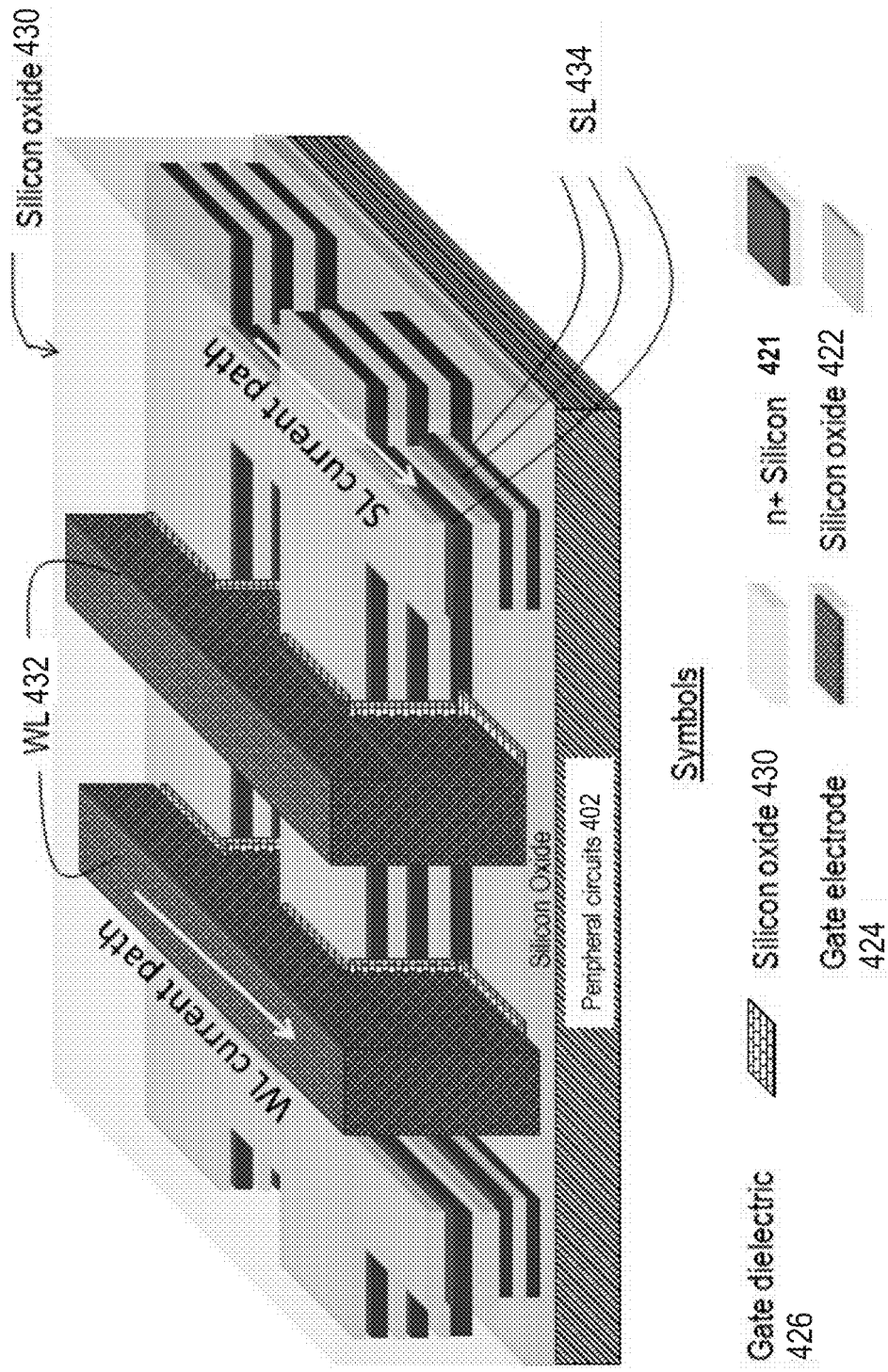
Figure 41:
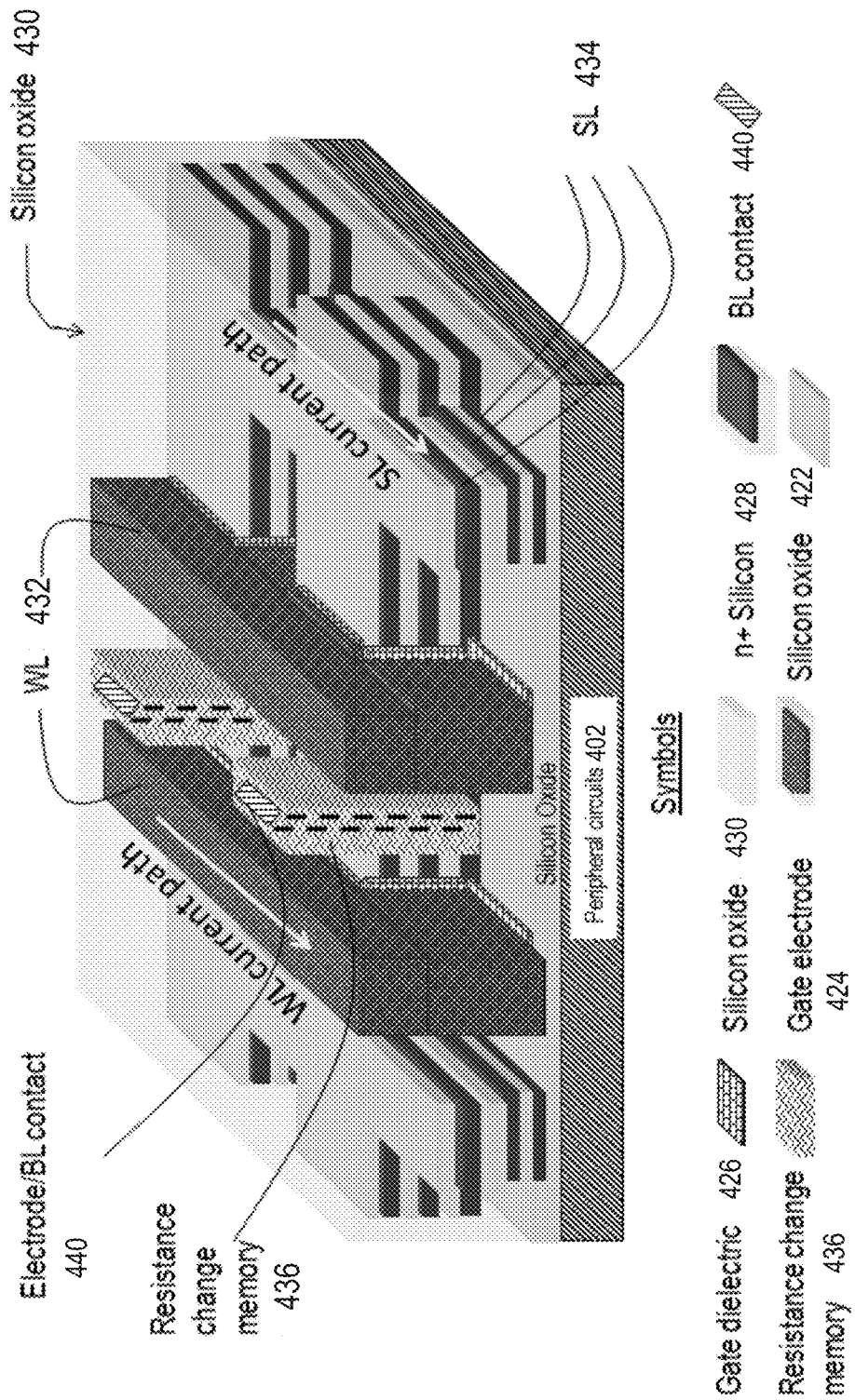

Step (H): FIG. 4H illustrates the structure after Step (H). A silicon oxide layer 430 is then deposited and planarized. The silicon oxide layer is shown transparent in the figure for clarity, along with word-line (WL) 432 and source-line (SL) 434 regions.

Step (I): FIG. 4I illustrates the structure after Step (I). Vias are etched through multiple layers of silicon and silicon dioxide as shown in the figure. A resistance change memory material 436 is then deposited (preferably with atomic layer deposition (ALD)). Examples of such a material include hafnium oxide, which is well known to change resistance by applying voltage. An electrode for the resistance change memory element is then deposited (preferably using ALD) and is shown as electrode/BL contact 440. A CMP process is then conducted to planarize the surface. It can be observed that multiple resistance change memory elements in series with transistors are created after this step.

Figure 4J:
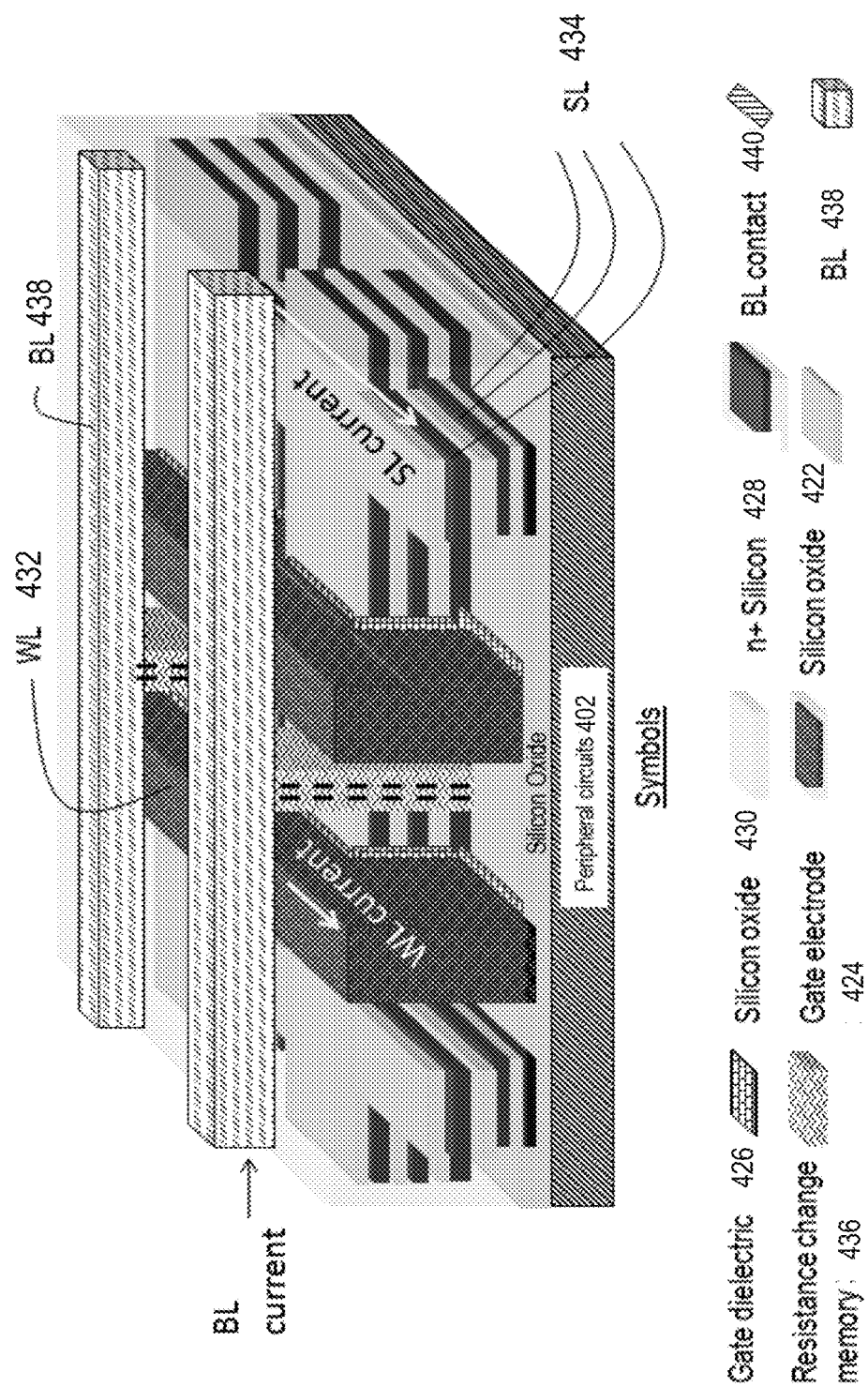

Step (J): FIG. 4J illustrates the structure after Step (J). BLs 438 are then constructed. Contacts are made to BLs, WLs and SLs of the memory array at its edges. SL contacts can be made into stair-like structures using techniques described in "Bit Cost Scalable Technology with Punch and Plug Process for Ultra High Density Flash Memory," *VLSI Technology, 2007 IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be done in steps prior to Step (I) as well.

Figure 4K:
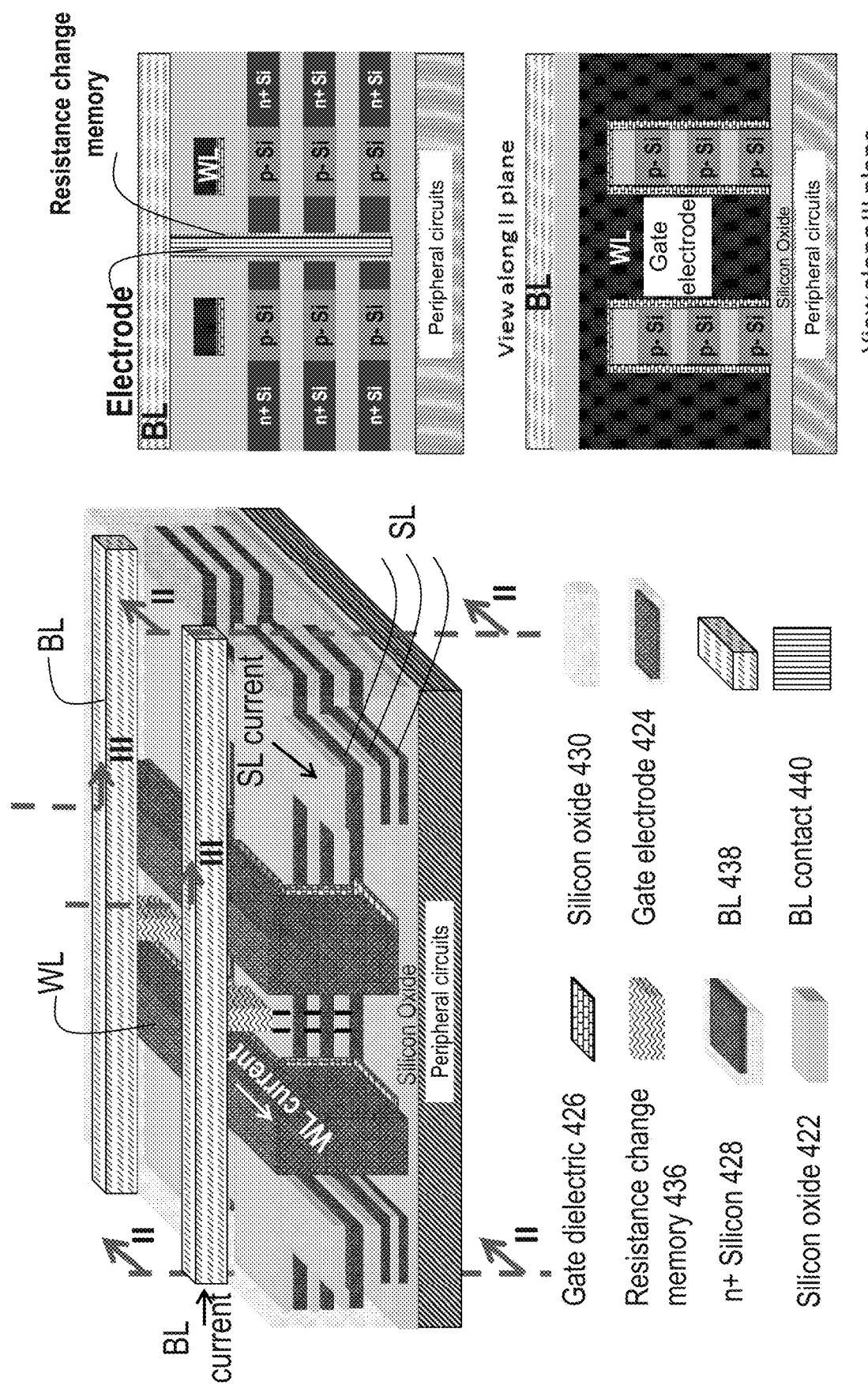

FIG. 4K shows cross-sectional views of the array for clarity. A 3D resistance change memory has thus been constructed, with (1) horizontally-oriented transistors—i.e. current flowing in substantially the horizontal direction in transistor channels, (2) some of the memory cell control lines—e.g., source-lines SL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut.

While explanations have been given for formation of monolithic 3D resistive memories with ion-cut in this section, it is clear to one skilled in the art that alternative implementations are possible. BL and SL nomenclature has been used for two terminals of the 3D resistive memory array, and this nomenclature can be interchanged. Moreover, selective epi technology or laser recrystallization technology could be utilized for implementing structures shown in FIG. 3A-3J and FIG. 4A-4K. Various other types of layer transfer schemes that have been described in Section 1.3.4 of the parent application can be utilized for construction of various 3D resistive memory structures. One could also use buried wiring, i.e. where wiring for memory arrays is below the memory layers but above the periphery. Other variations of the monolithic 3D resistive memory concepts are possible.

While resistive memories described previously form a class of non-volatile memory, others classes of non-volatile memory exist. NAND flash memory forms one of the most common non-volatile memory types. It can be constructed of two main types of devices: floating-gate devices where charge is stored in a floating gate and charge-trap devices where charge is stored in a charge-trap layer such as Silicon Nitride. Background information on charge-trap memory can be found in "*Integrated Interconnect Technologies for 3D Nanoelectronic Systems*", Artech House, 2009 by Bakir and Meindl ("Bakir") and "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. The architectures shown in FIG. 5A-5G are relevant for any type of charge-trap memory.

FIGS. 5A-5G describes a memory architecture for single-crystal 3D charge-trap memories, and a procedure for its construction. It utilizes junction-less transistors. No mask is utilized on a "per-memory-layer" basis for the monolithic 3D charge-trap memory concept shown in FIG. 5A-5G, and all other masks are shared between different layers. The process flow may include several steps as described in the following sequence.

Figure 5A:
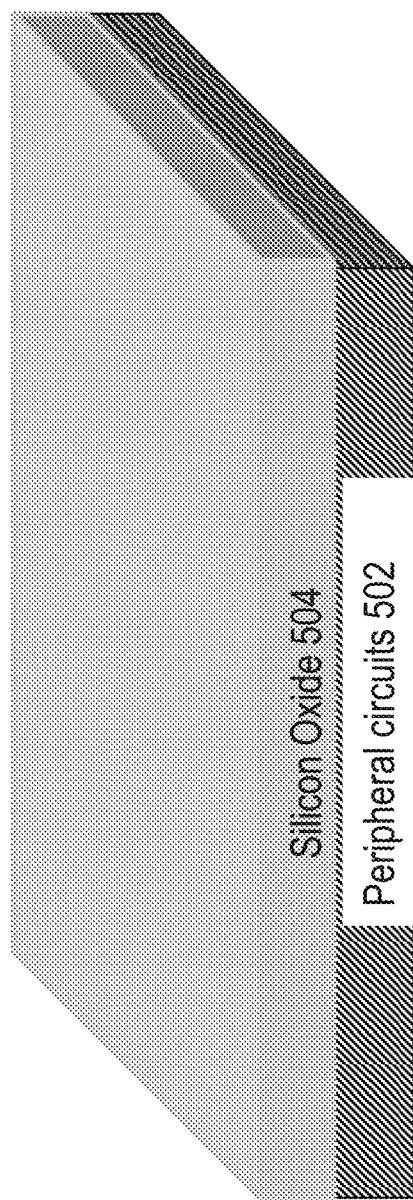
FIGS. 5A-5G show a zero-mask per layer 3D charge-trap memory.

Step (A): Peripheral circuits 502 are first constructed and above this a layer of silicon dioxide 504 is deposited. FIG. 5A shows a drawing illustration after Step (A).

Figure 5B:
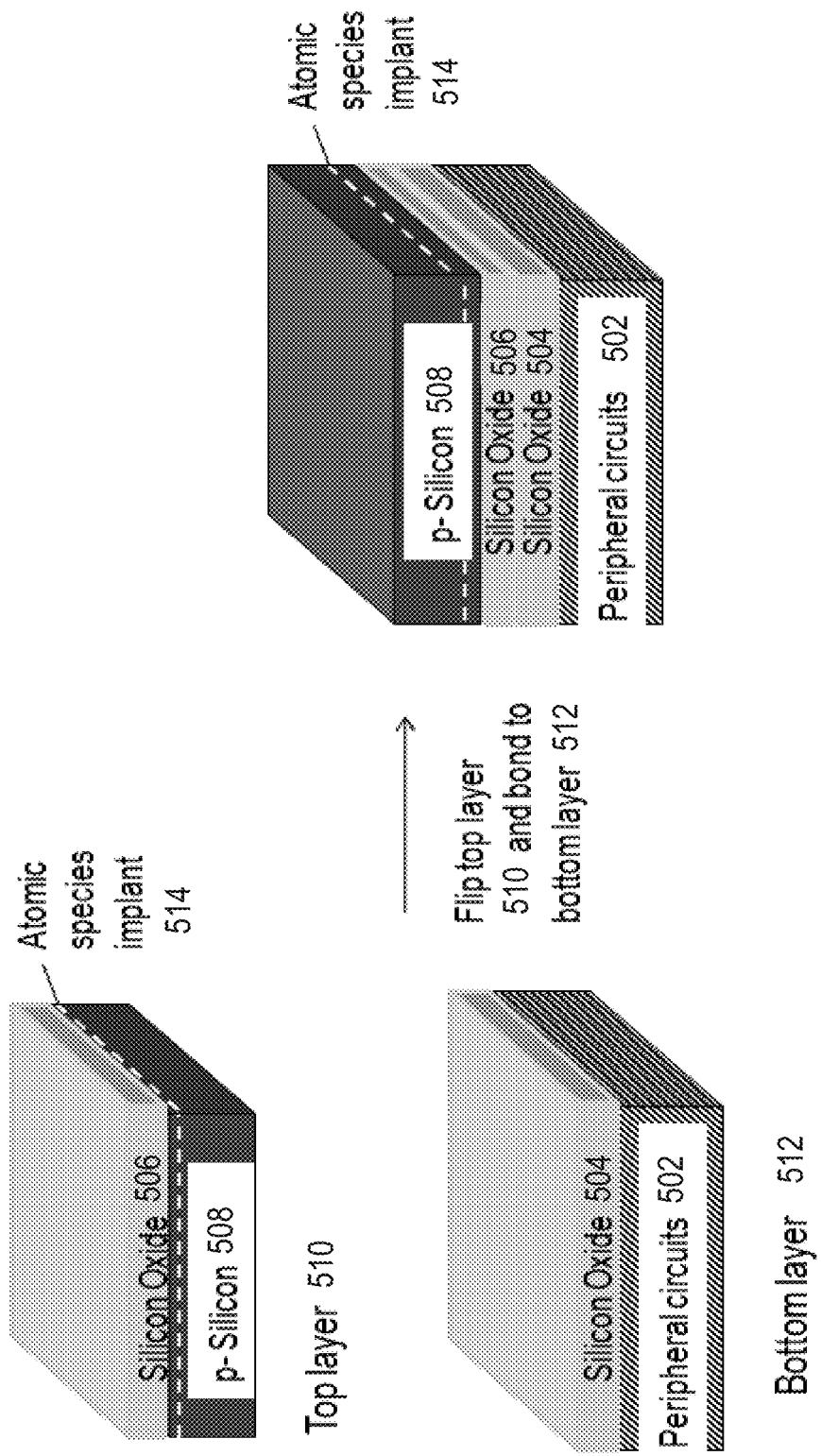

Step (B): FIG. 5B illustrates the structure after Step (B). A wafer of n+ Silicon 508 has an oxide layer 506 grown or deposited above it. Following this, hydrogen is implanted into the n+ Silicon wafer at a certain depth indicated by 514. Alternatively, some other atomic species such as Helium could be implanted. This hydrogen implanted n+ Silicon wafer 508 forms the top layer 510. The bottom layer 512 may include the peripheral circuits 502 with oxide layer 504. The top layer 510 is flipped and bonded to the bottom layer 512 using oxide-to-oxide bonding.

Figure 5C:
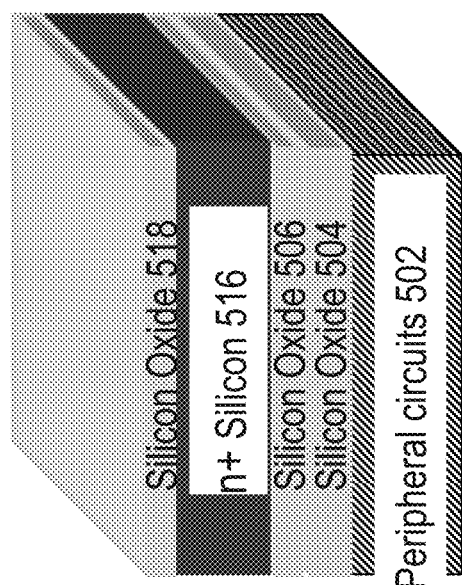

Step (C): FIG. 5C illustrates the structure after Step (C). The stack of top and bottom wafers after Step (B) is cleaved at the hydrogen plane 514 using either a anneal or a sideways mechanical force or other means. A CMP process is then conducted. A layer of silicon oxide 518 is then deposited atop the n+ Silicon layer 516. At the end of this step, a single-crystal n+ Si layer 516 exists atop the peripheral circuits, and this has been achieved using layer-transfer techniques.

Figure 5D:
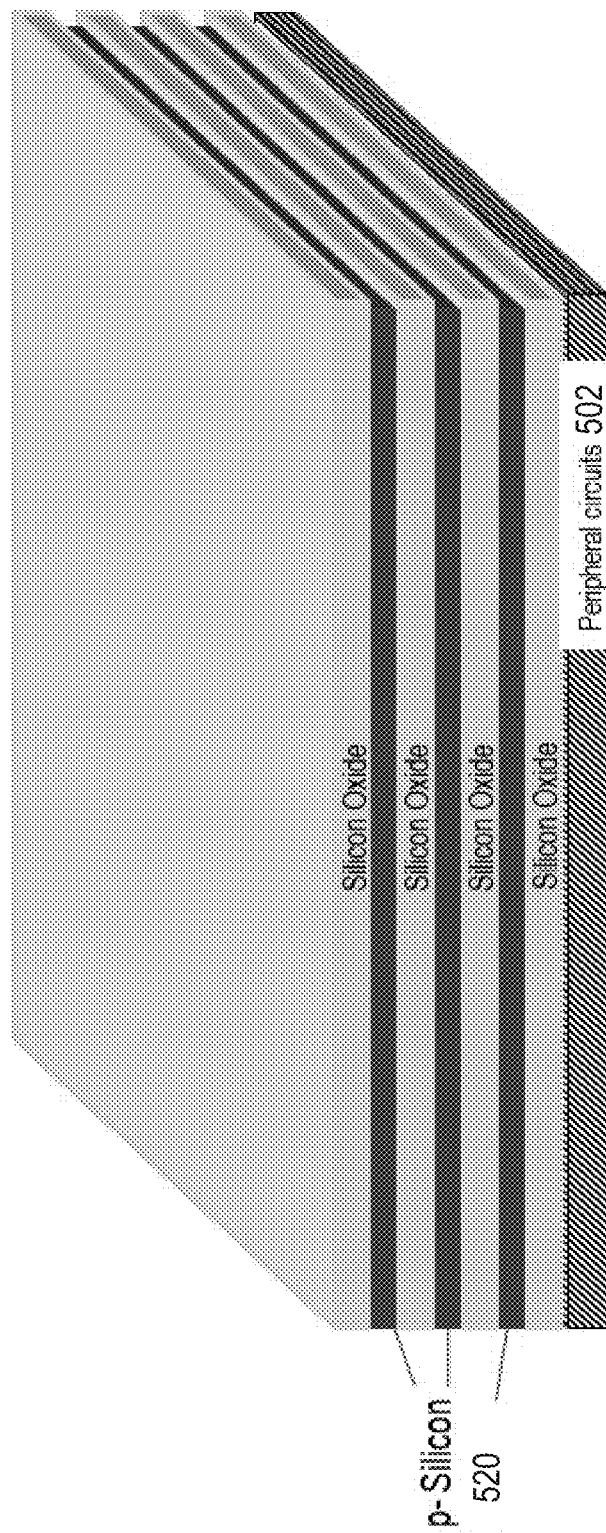

Step (D): FIG. 5D illustrates the structure after Step (D). Using methods similar to Step (B) and (C), multiple n+ silicon layers 520 are formed with silicon oxide layers in between.

Figure 5E:
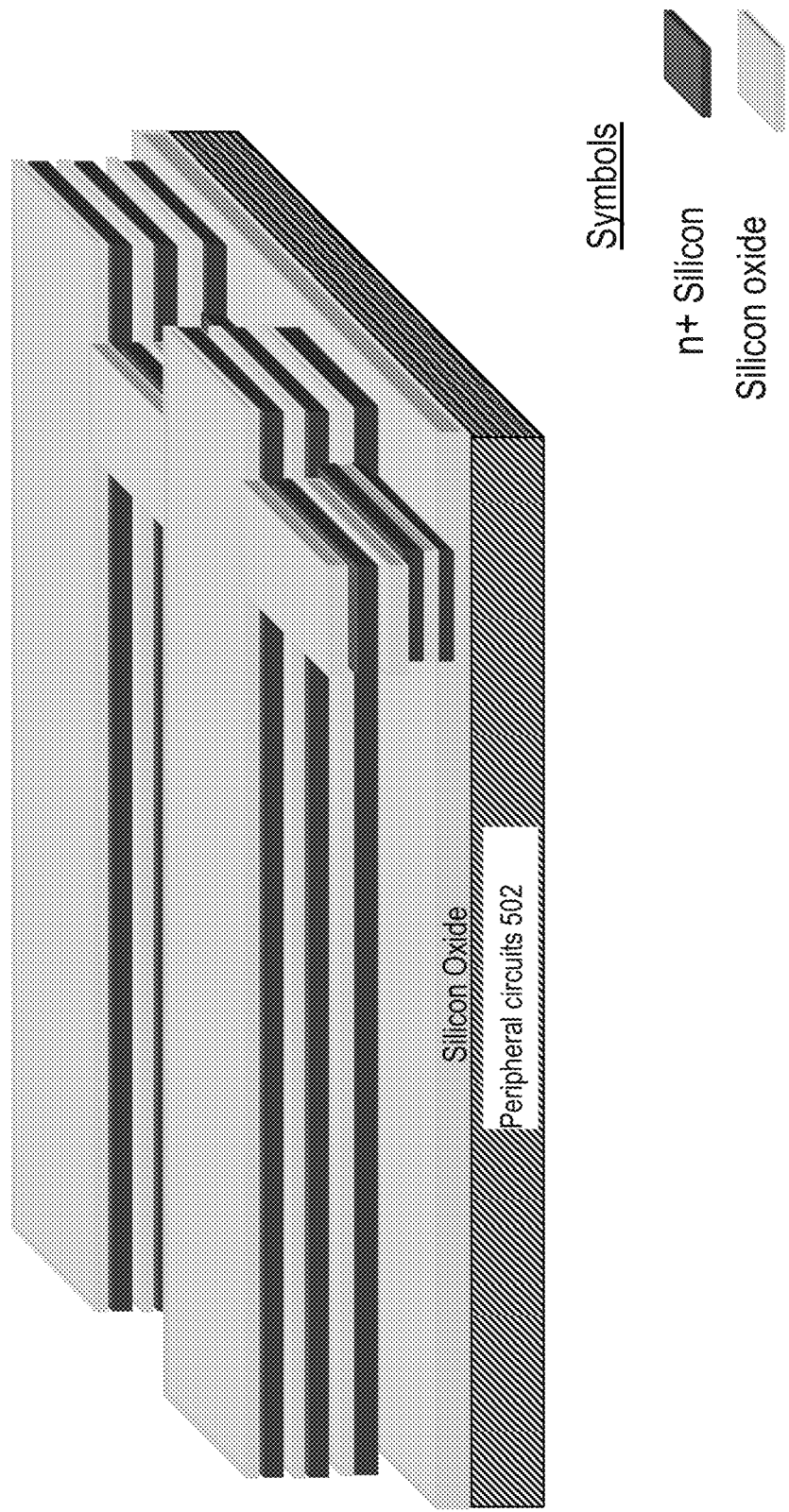

Step (E): FIG. 5E illustrates the structure after Step (E). Lithography and etch processes are then utilized to make a structure as shown in the figure.

Figure 5F:
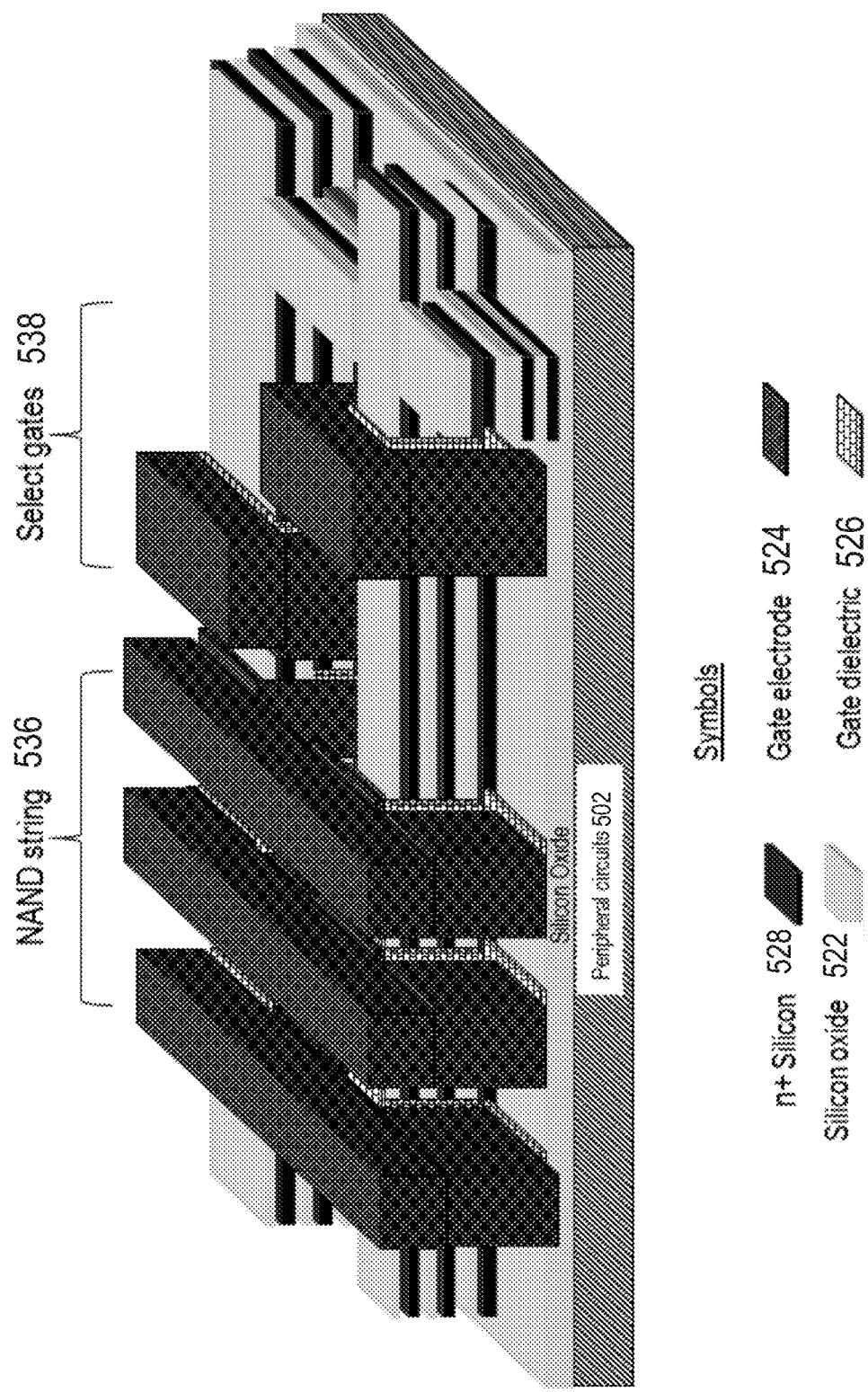

Step (F): FIG. 5F illustrates the structure after Step (F). Gate dielectric 526 and gate electrode 524 are then deposited following which a CMP is done to planarize the gate electrode 524 regions. Lithography and etch are utilized to define gate regions. Gates of the NAND string 536 as well gates of select gates of the NAND string 538 are defined.

Figure 5G:
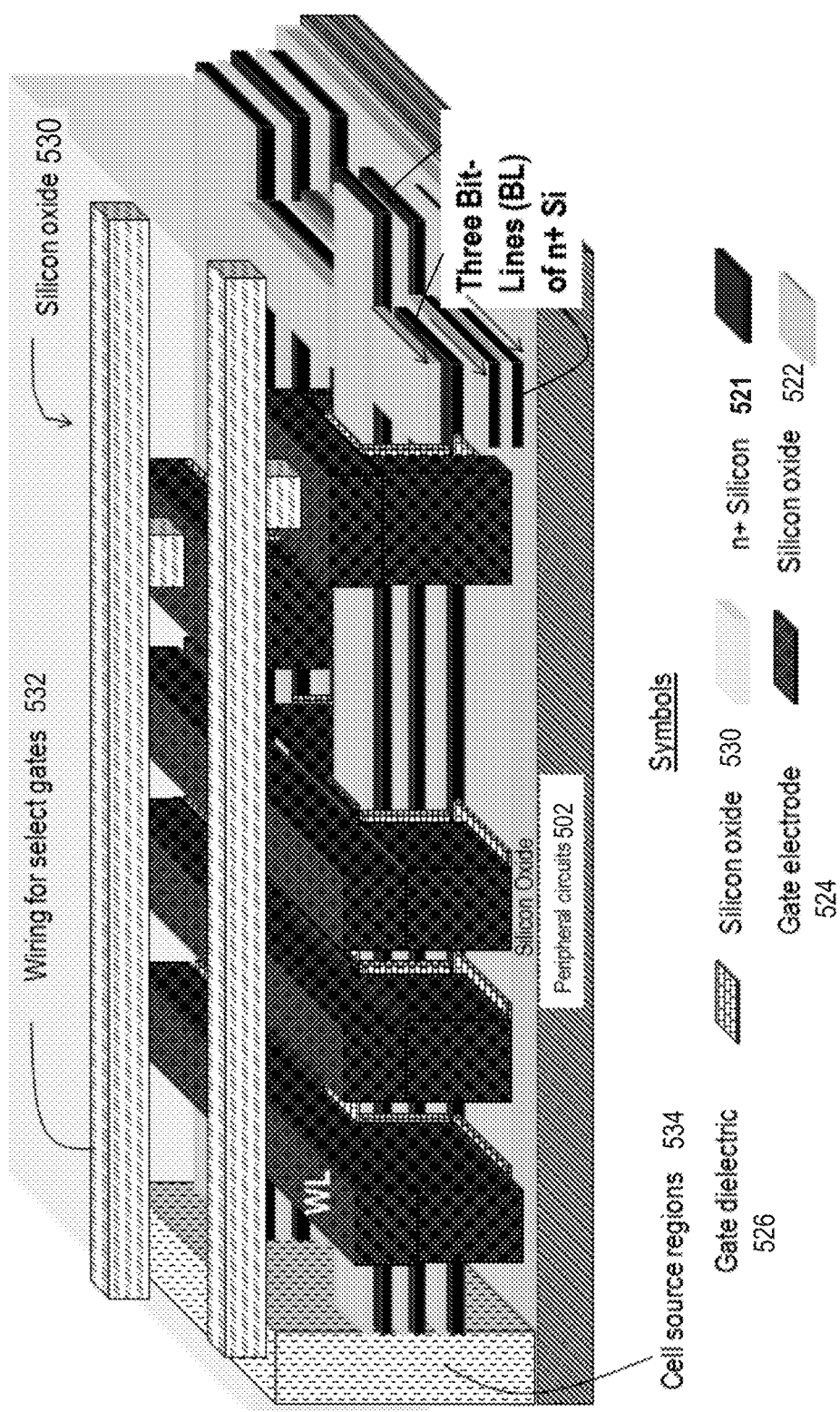

Step (G): FIG. 5G illustrates the structure after Step (G). A silicon oxide layer 530 is then deposited and planarized. It is shown transparent in the figure for clarity. Word-lines, bit-lines and source-lines are defined as shown in the figure. Contacts are formed to various regions/wires at the edges of the array as well. SL contacts can be made into stair-like structures using techniques described in "Bit Cost Scalable Technology with Punch and Plug Process for Ultra High Density Flash Memory," *VLSI Technology,* 2007 *IEEE Symposium on*, vol., no., pp. 14-15, 12-14 Jun. 2007 by Tanaka, H.; Kido, M.; Yahashi, K.; Oomura, M.; et al., following which contacts can be constructed to them. Formation of stair-like structures for SLs could be performed in steps prior to Step (G) as well.

A 3D charge-trap memory has thus been constructed, with (1) horizontally-oriented transistors—i.e. current flowing in substantially the horizontal direction in transistor channels, (2) some of the memory cell control lines—e.g., bit lines BL, constructed of heavily doped silicon and embedded in the memory cell layer, (3) side gates simultaneously deposited over multiple memory layers for transistors, and (4) monocrystalline (or single-crystal) silicon layers obtained by layer transfer techniques such as ion-cut. This use of single-crystal silicon obtained with ion-cut is a key differentiator from past work on 3D charge-trap memories such as "A Highly Scalable 8-Layer 3D Vertical-Gate (VG) TFT NAND Flash Using Junction-Free Buried Channel BE-SONOS Device," Symposium on VLSI Technology, 2010 by Hang-Ting Lue, et al. that used polysilicon.

While FIGS. 5A-5G give two examples of how single-crystal silicon layers with ion-cut can be used to produce 3D charge-trap memories, the ion-cut technique for 3D charge-trap memory is fairly general. It could be utilized to produce any horizontally-oriented 3D monocrystalline-silicon charge-trap memory.

While the 3D DRAM and 3D resistive memory implementations in Section 3 and Section 4 have been described with single crystal silicon constructed with ion-cut technology, other options exist. One could construct them with selective epi technology. Procedures for doing these will be clear to those skilled in the art.

FIGS. 6A-6B show it is not the only option for the architecture to have the peripheral transistors, such as periphery 602, below the memory layers, including, for example, memory layer 604, memory layer 606, and/or memory layer 608. Peripheral transistors, such as periphery 610, could also be constructed above the memory layers, including, for example, memory layer 604, memory layer 606, and/or memory layer 608, and substrate or memory layer 612, as shown in FIG. 6B. This periphery layer would utilize technologies described in this application, and could utilize transistors, for example, junction-less transistors or recessed channel transistors.

The monolithic 3D integration concepts described in this patent application can lead to novel embodiments of poly-silicon-based memory architectures as well. Poly silicon based architectures could potentially be cheaper than single crystal silicon based architectures when a large number of memory layers need to be constructed. While the below concepts are explained by using resistive memory architectures as an example, it will be clear to one skilled in the art that similar concepts can be applied to NAND flash memory and DRAM architectures described previously in this patent application.

Figure 7A:
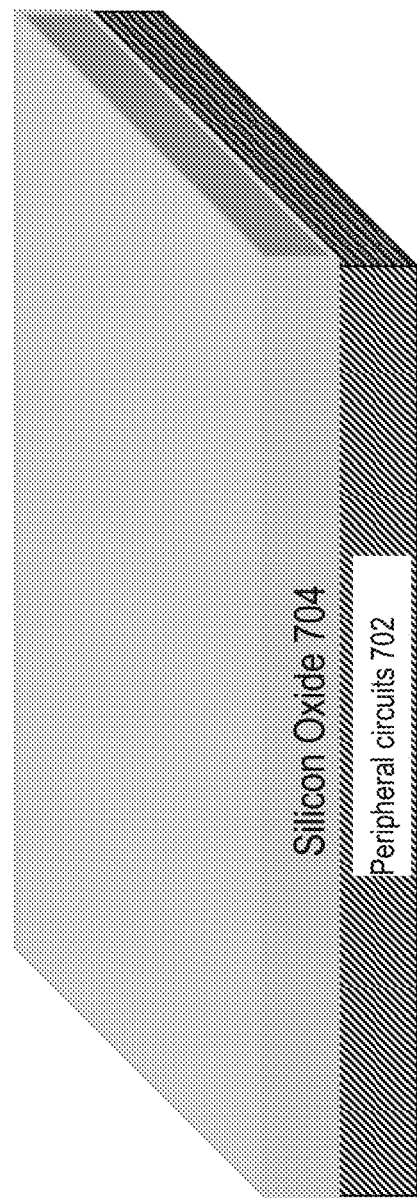
FIGS. 7A-7E show polysilicon select devices for 3D memory and peripheral circuits at the bottom according to some embodiments of the current invention.

FIGS. 7A-7E show one embodiment of the current invention, where polysilicon junction-less transistors are used to form a 3D resistance-based memory. The utilized junction-less transistors can have either positive or negative threshold voltages. The process may include the following steps as described in the following sequence:

Step (A): As illustrated in FIG. 7A, peripheral circuits 702 are constructed above which a layer of silicon dioxide 704 is made.

Figure 7B:
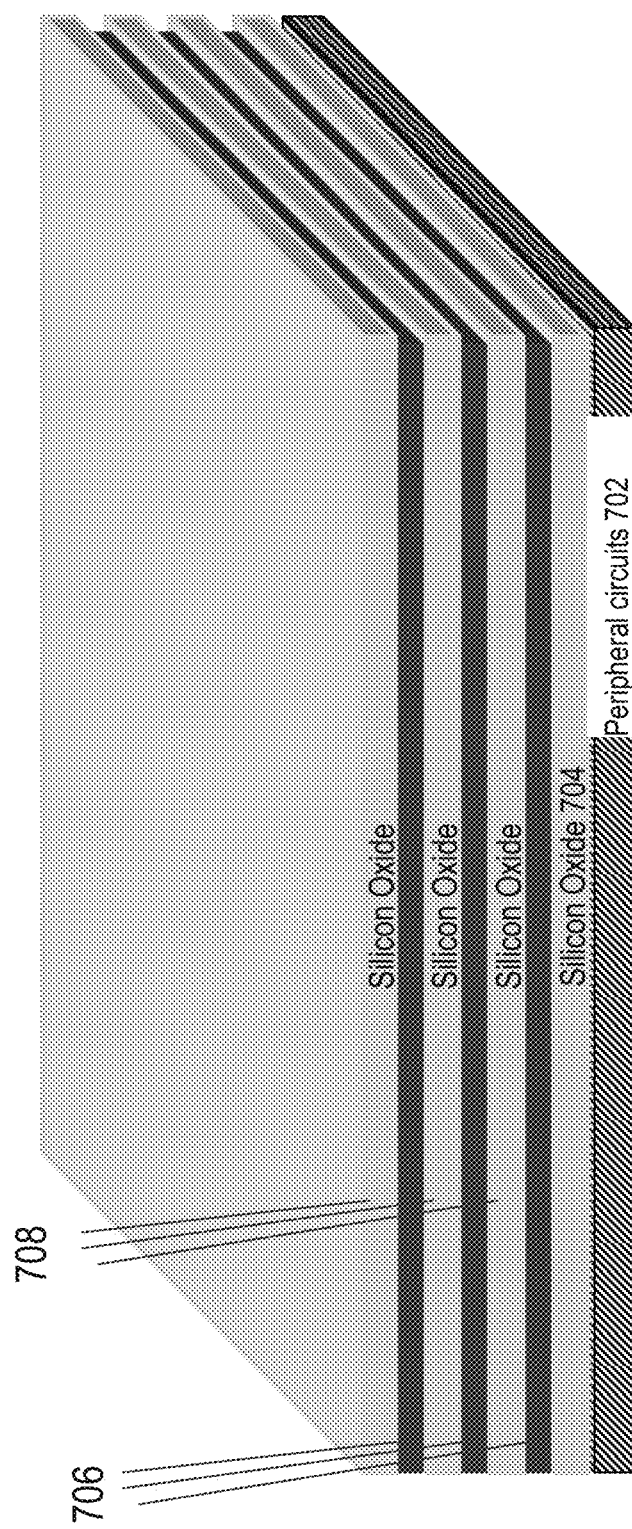

Step (B): As illustrated in FIG. 7B, multiple layers of n+ doped amorphous silicon or polysilicon 706 are deposited with layers of silicon dioxide 708 in between. The amorphous silicon or polysilicon layers 706 could be deposited using a chemical vapor deposition process, such as LPCVD or PECVD.

Figure 7C:
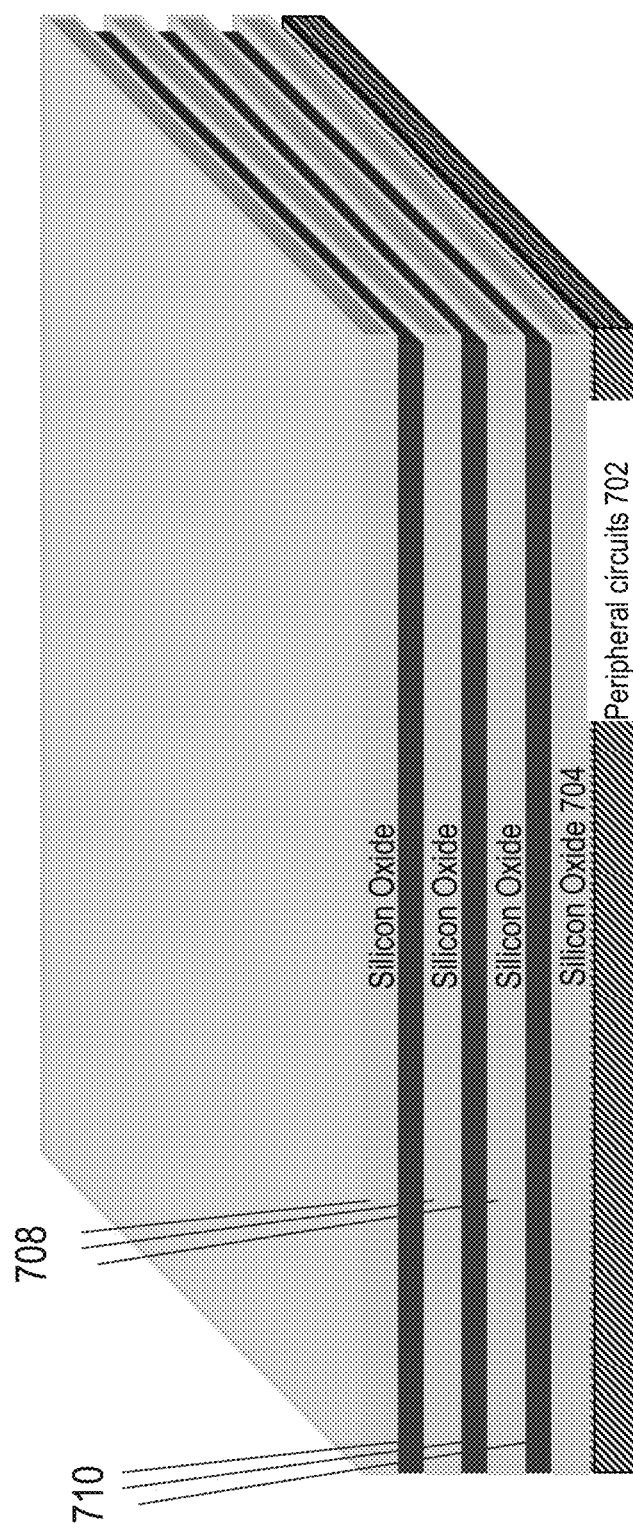

Step (C): As illustrated in FIG. 7C, a Rapid Thermal Anneal (RTA) is conducted to crystallize the layers of polysilicon or amorphous silicon deposited in Step (B). Temperatures during this RTA could be as high as 700° C. or more, and could even be as high as 800° C. The polysilicon region obtained after Step (C) is indicated as 710. Alternatively, a laser anneal could be conducted, either for all layers 706 at the same time or layer by layer. The thickness of the oxide 704 would need to be optimized if that process were conducted.

Figure 7D:
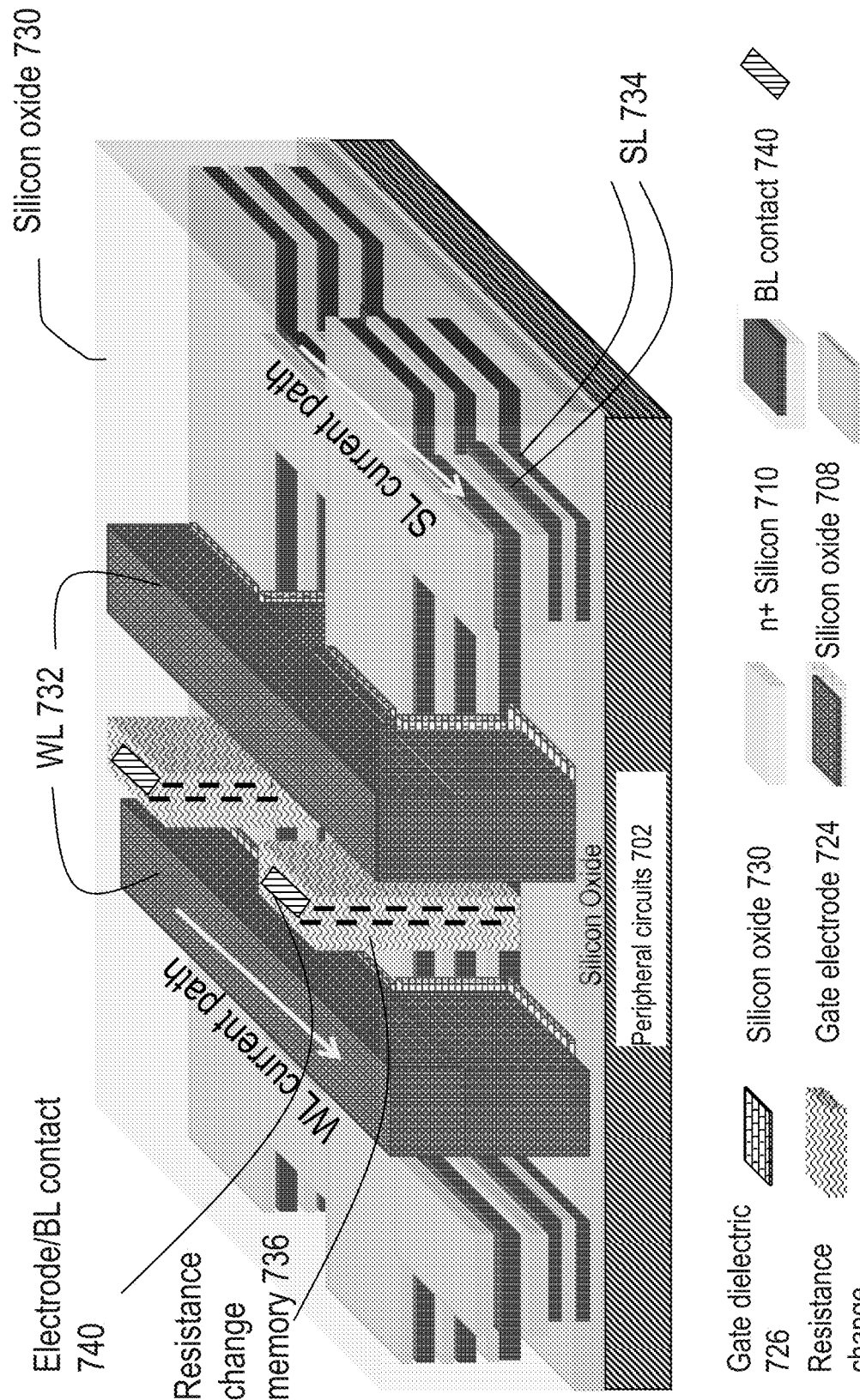

Step (D): As illustrated in FIG. 7D, procedures similar to those described in FIGS. 3E-3H are utilized to construct the structure shown. The structure in FIG. 7D has multiple levels of junction-less transistor selectors for resistive memory devices. The resistance change memory is indicated as 736 while its electrode and contact to the BL is indicated as 740. The WL is indicated as 732, while the SL is indicated as 734. Gate dielectric of the junction-less transistor is indicated as 726 while the gate electrode of the junction-less transistor is indicated as 724, this gate electrode also serves as part of the WL 732. Silicon oxide is indicated as 730.

Figure 7E:
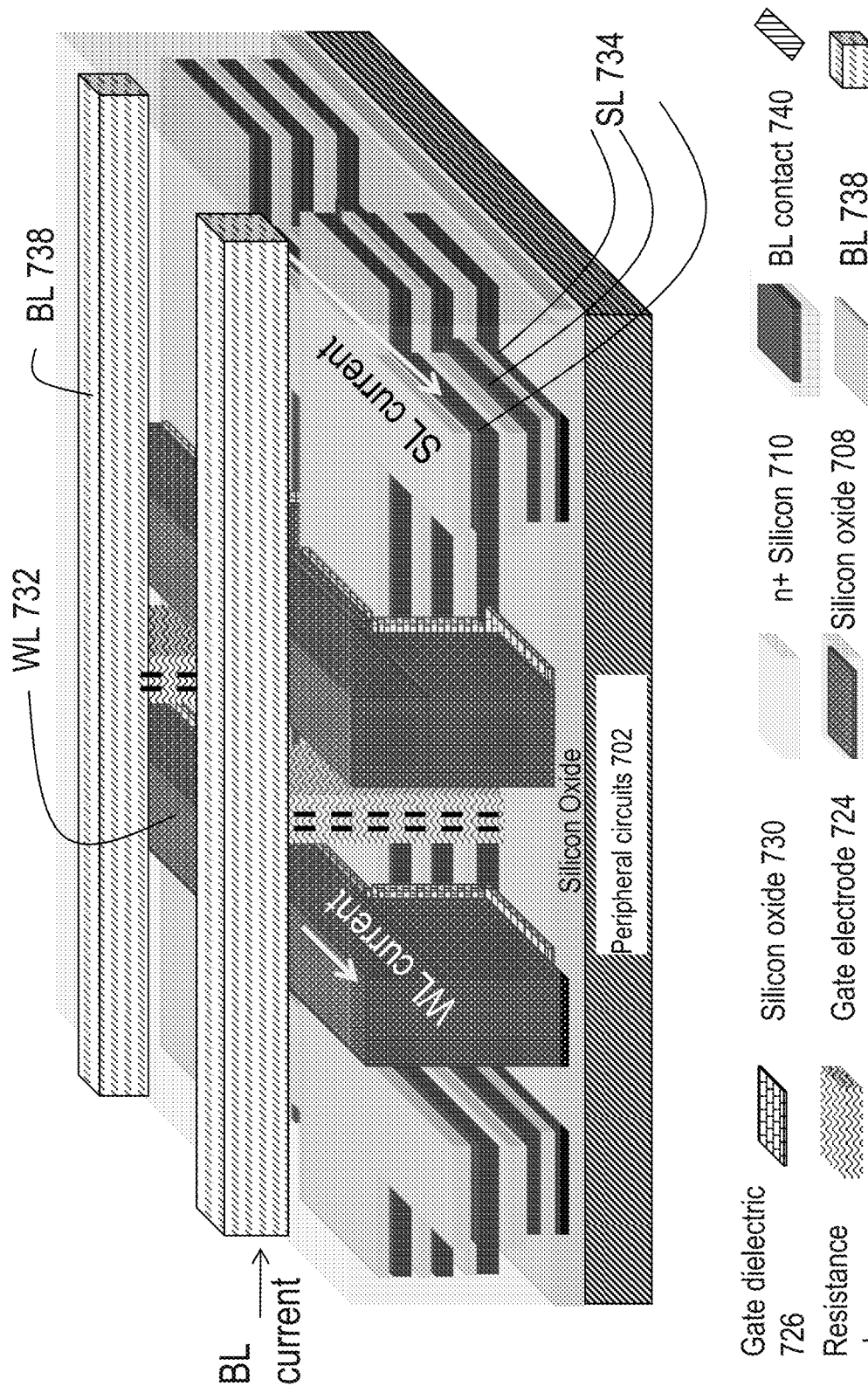

Step (E): As illustrated in FIG. 7E, bit lines (indicated as BL 738) are constructed. Contacts are then made to peripheral circuits and various parts of the memory array as described in embodiments described previously.

Figure 8A:
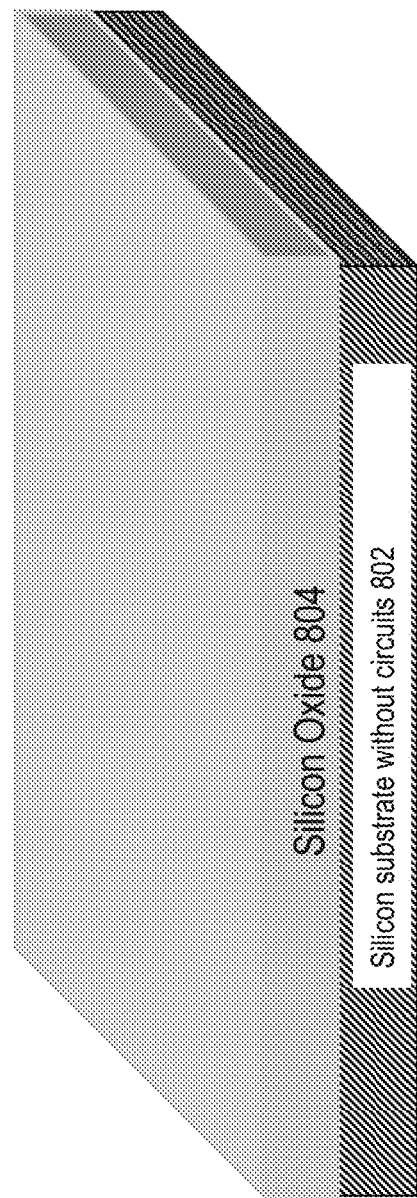
FIGS. 8A-8F show polysilicon select devices for 3D memory and peripheral circuits at the top according to some embodiments of the current invention.

FIG. 8A-F show another embodiment of the current invention, where polysilicon junction-less transistors are used to form a 3D resistance-based memory. The utilized junction-less transistors can have either positive or negative threshold voltages. The process may include the following steps occurring in sequence:

Step (A): As illustrated in FIG. 8A, a layer of silicon dioxide 804 is deposited or grown above a silicon substrate without circuits 802.

Figure 8B:
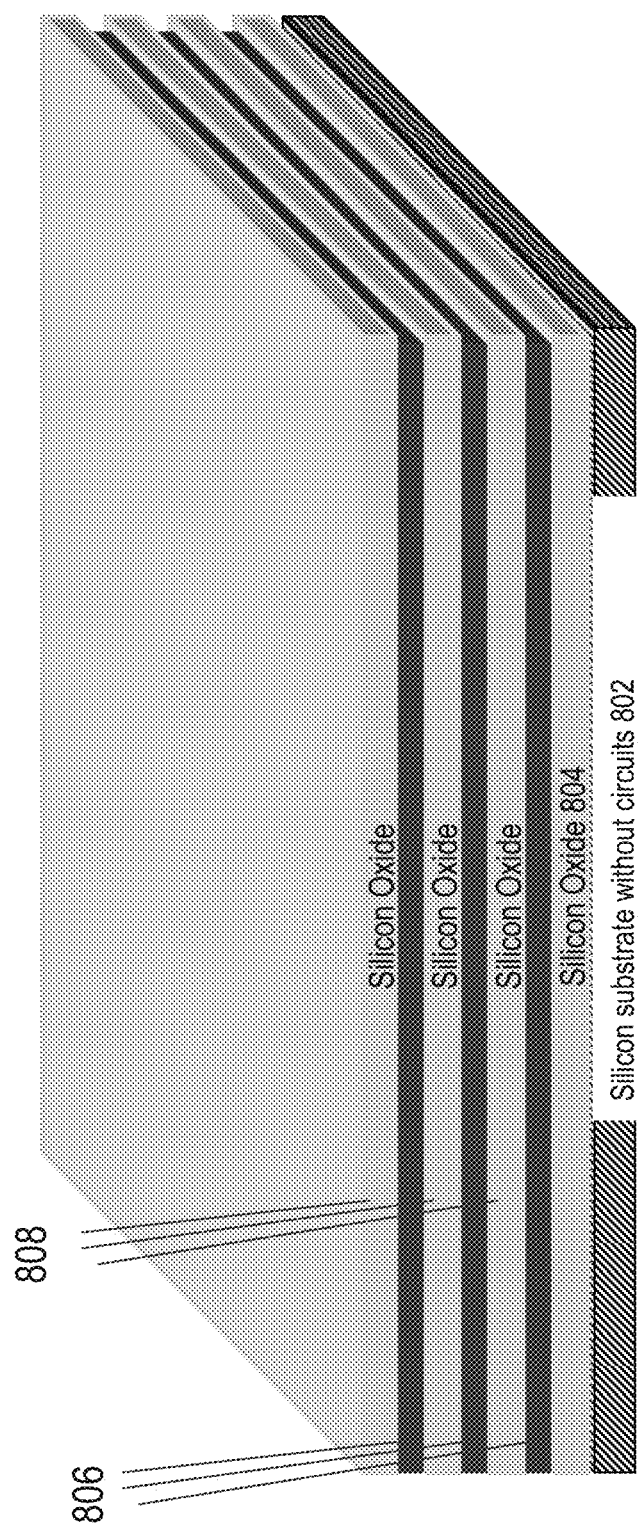

Step (B): As illustrated in FIG. 8B, multiple layers of n+ doped amorphous silicon or polysilicon 806 are deposited with layers of silicon dioxide 808 in between. The amorphous silicon or polysilicon layers 806 could be deposited using a chemical vapor deposition process, such as LPCVD or PECVD abbreviated as above.

Figure 8C:
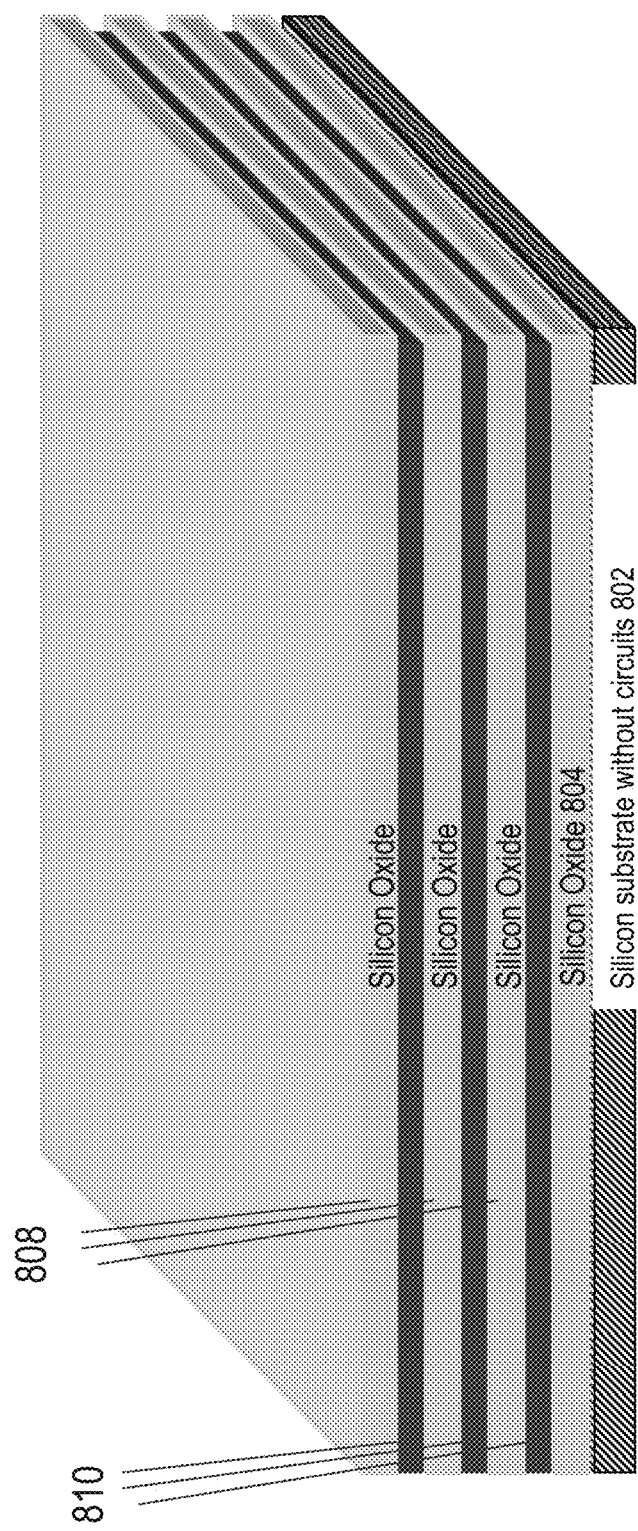

Step (C): As illustrated in FIG. 8C, a Rapid Thermal Anneal (RTA) or standard anneal is conducted to crystallize the layers of polysilicon or amorphous silicon deposited in Step (B). Temperatures during this RTA could be as high as 700° C. or more, and could even be as high as 1400° C. The polysilicon region obtained after Step (C) is indicated as 810. Since there are no circuits under these layers of polysilicon, very high temperatures (such as 1400° C.) can be used for the anneal process, leading to very good quality polysilicon with few grain boundaries and very high mobilities approaching those of single crystal silicon. Alternatively, a laser anneal could be conducted, either for all layers 806 at the same time or layer by layer at different times.

Figure 8D:
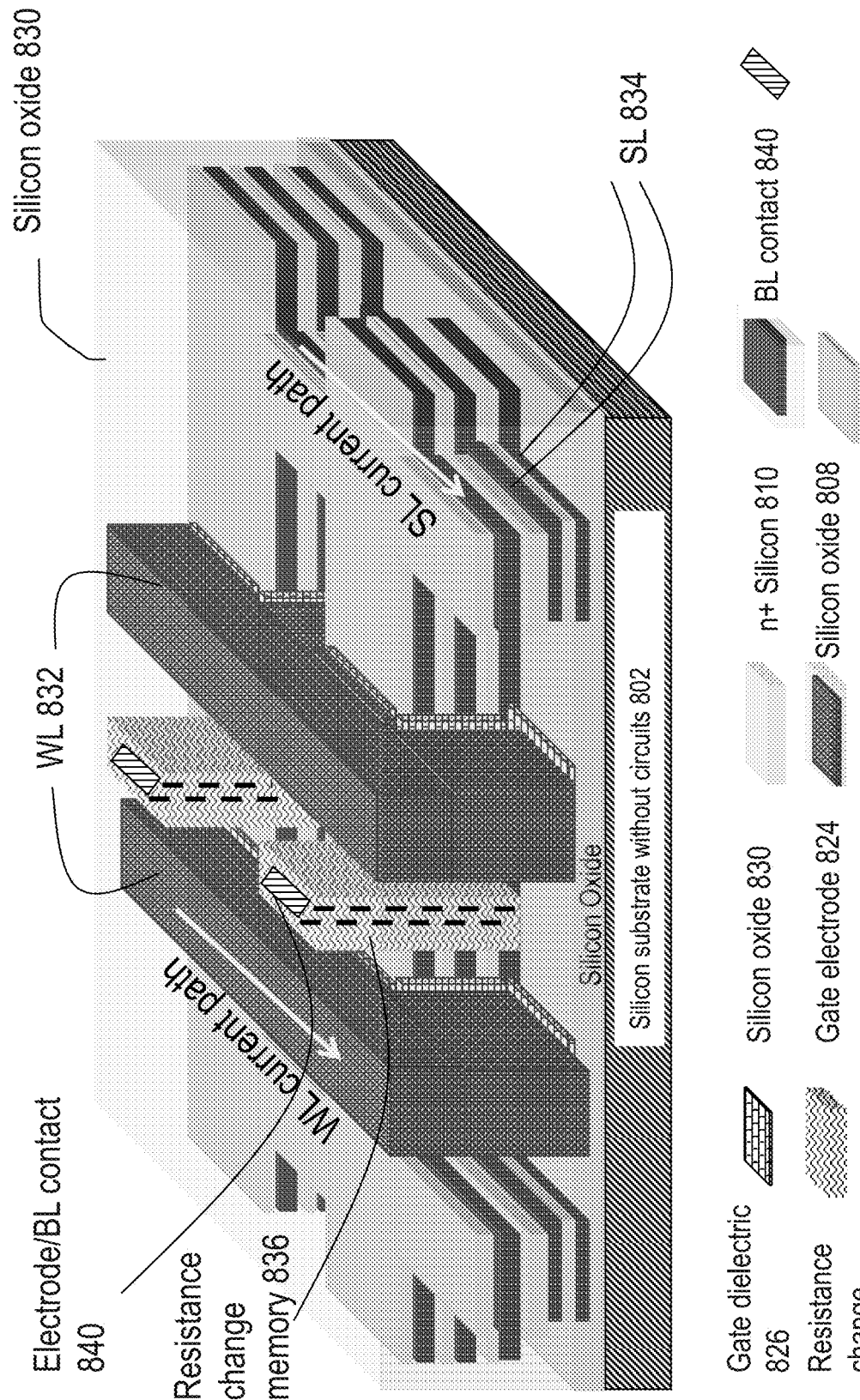

Step (D): This is illustrated in FIG. 8D. Procedures similar to those described in FIG. 32E-H of U.S. Pat. No. 8,026,521, are utilized to obtain the structure shown in FIG. 8D which has multiple levels of junctionless transistor selectors for resistive memory devices. The resistance change memory is indicated as 836 while its electrode and contact to the BL is indicated as 840. The WL is indicated as 832, while the SL is indicated as 834. Gate dielectric of the junction-less transistor is indicated as 826 while the gate electrode of the junction-less transistor is indicated as 824, this gate electrode also serves as part of the WL 832. Silicon oxide is indicated as 830

Figure 8E:
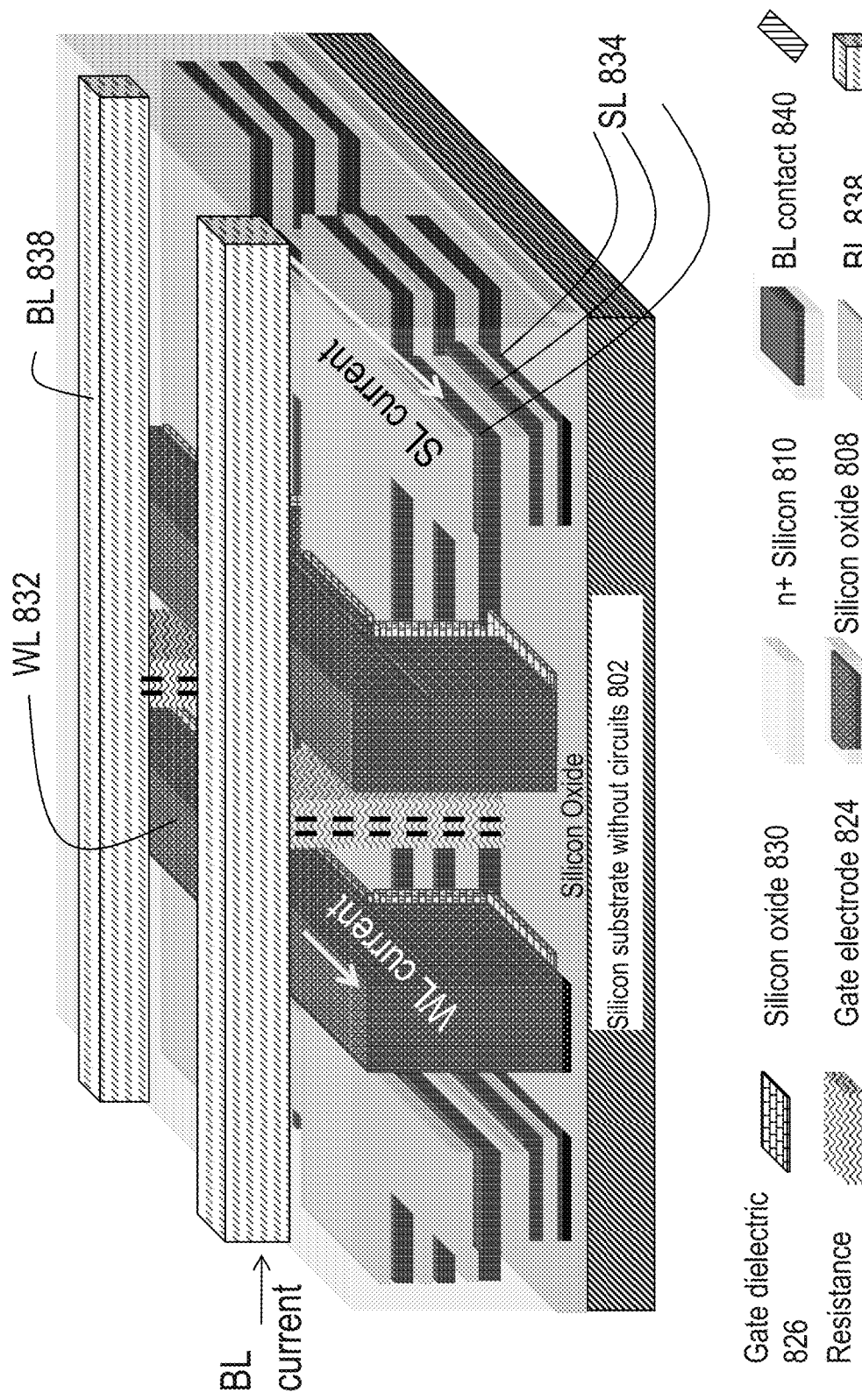
Figure 8F:
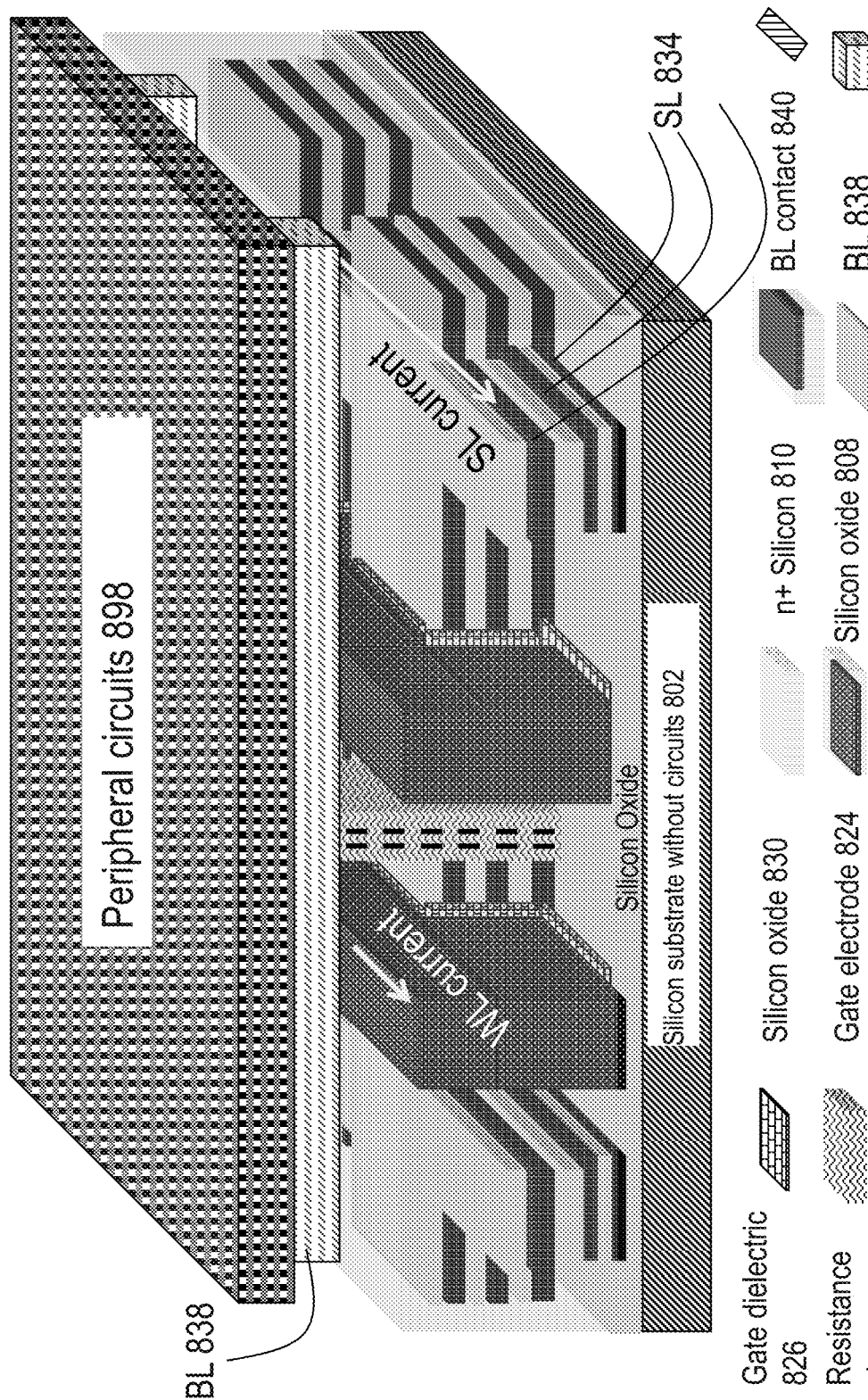

Step (E): This is illustrated in FIG. 8E. Bit lines (indicated as BL 838) are constructed. Contacts are then made to peripheral circuits and various parts of the memory array as described in embodiments described previously.

Step (F): Using procedures described in Section 1 and Section 2 of this patent application's parent, peripheral circuits 898 (with transistors and wires) could be formed well aligned to the multiple memory layers shown in Step (E). For the periphery, one could use the process flow shown in Section 2 where replacement gate processing is used, or one could use sub-400° C. processed transistors such as junction-less transistors or recessed channel transistors. Alternatively, one could use laser anneals for peripheral transistors' source-drain processing. Various other procedures described in Section 1 and Section 2 could also be used. Connections can then be formed between the multiple memory layers and peripheral circuits. By proper choice of materials for memory layer transistors and memory layer wires (e.g., by using tungsten and other materials that withstand high temperature processing for wiring), even standard transistors processed at high temperatures (>1000° C.) for the periphery could be used.

Section 1, of U.S. Pat. No. 8,026,521, described the formation of 3D stacked semiconductor circuits and chips with sub-400° C. processing temperatures to build transistors and high density of vertical connections. In this section an alternative method is explained, in which a transistor is built with any replacement gate (or gate-last) scheme that is utilized widely in the industry. This method allows for high temperatures (above 400 C) to build the transistors. This method utilizes a combination of three concepts:

Replacement gate (or gate-last) high k/metal gate fabrication

Face-up layer transfer using a carrier wafer

Misalignment tolerance techniques that utilize regular or repeating layouts. In these repeating layouts, transistors could be arranged in substantially parallel bands.

A very high density of vertical connections is possible with this method. Single crystal silicon (or monocrystalline silicon) layers that are transferred are less than 2 um thick, or could even be thinner than 0.4 um or 0.2 um.

Figure 9A:
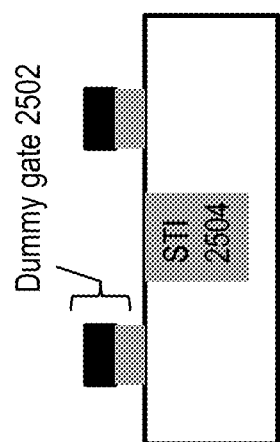
FIGS. 9A-9F illustrate a process flow for 3D integrated circuits with gate-last high-k metal gate transistors and face-up layer transfer.

The method mentioned in the previous paragraph is described in FIG. 9A-9F. The procedure may include several steps as described in the following sequence:

Step (A): After creating isolation regions using a shallow-trench-isolation (STI) process 2504, dummy gates 2502 are constructed with silicon dioxide and poly silicon. The term "dummy gates" is used since these gates will be replaced by high k gate dielectrics and metal gates later in the process flow, according to the standard replacement gate (or gate-last) process. Further details of replacement gate processes are described in "A 45 nm Logic Technology with High-k+ Metal Gate Transistors, Strained Silicon, 9 Cu Interconnect Layers, 193 nm Dry Patterning, and 100% Pb-free Packaging," IEDM Tech. Dig., pp. 247-250, 2007 by K. Mistry, et al. and "Ultralow-EOT (5 Å) Gate-First and Gate-Last High Performance CMOS Achieved by Gate-Electrode Optimization," IEDM Tech. Dig., pp. 663-666, 2009 by L. Ragnarsson, et al. FIG. 9A illustrates the structure after Step (A).

Figure 9B:
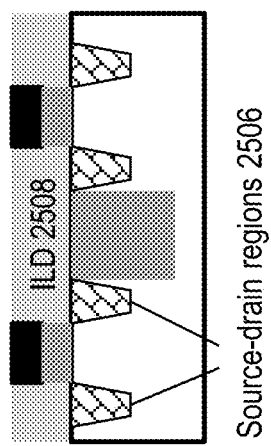

Step (B): Rest of the transistor fabrication flow proceeds with formation of source-drain regions 2506, strain enhancement layers to improve mobility, high temperature anneal to activate source-drain regions 2506, formation of inter-layer dielectric (ILD) 2508, etc. FIG. 9B illustrates the structure after Step (B).

Figure 9C:
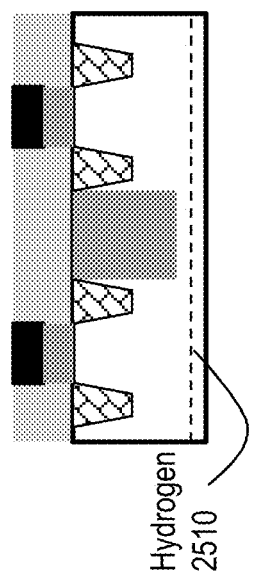

Step (C): Hydrogen is implanted into the wafer at the dotted line regions indicated by 2510. FIG. 9C illustrates the structure after Step (C).

Figure 9D:
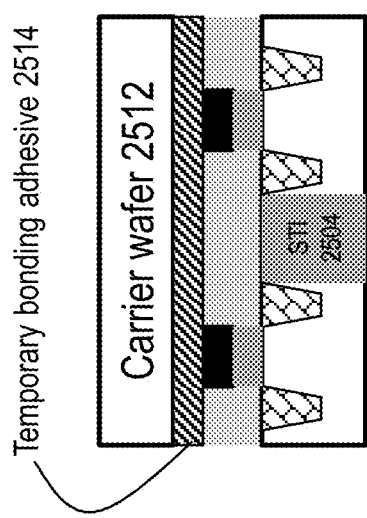

Step (D): The wafer after step (C) is bonded to a temporary carrier wafer 2512 using a temporary bonding adhesive 2514. This temporary carrier wafer 2512 could be constructed of glass. Alternatively, it could be constructed of silicon. The temporary bonding adhesive 2514 could be a polymer material, such as a polyimide. A anneal or a sideways mechanical force is utilized to cleave the wafer at the hydrogen plane 2510. A CMP process is then conducted. FIG. 9D illustrates the structure after Step (D).

Figure 9E:
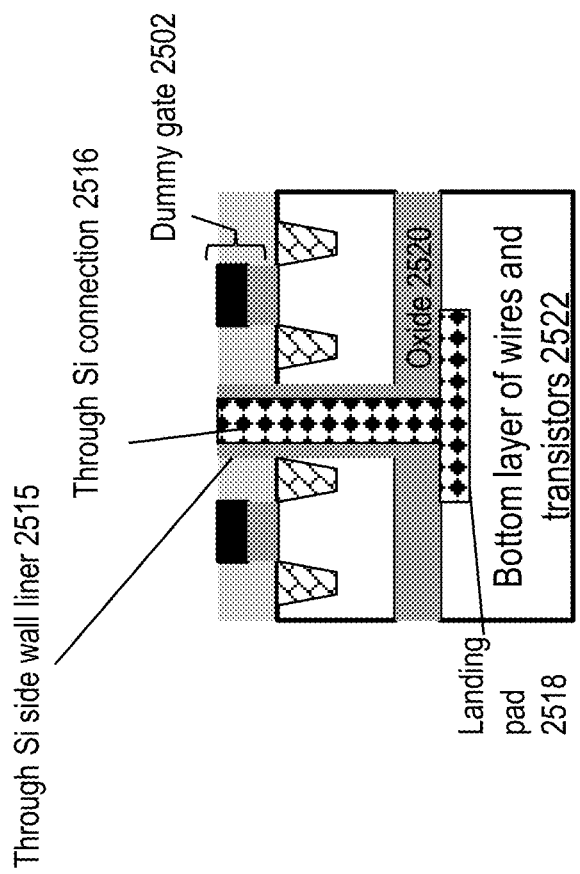

Step (E): An oxide layer 2520 is deposited onto the bottom of the wafer shown in Step (D). The wafer is then bonded to the bottom layer of wires and transistors 2522 using oxide-to-oxide bonding. The bottom layer of wires and transistors 2522 could also be called a base wafer. The temporary carrier wafer 2512 is then removed by shining a laser onto the temporary bonding adhesive 2514 through the temporary carrier wafer 2512 (which could be constructed of glass). Alternatively, an anneal could be used to remove the temporary bonding adhesive 2514. Through-silicon connections 2516 with a non-conducting (e.g. oxide) liner 2515 to the landing pads 2518 in the base wafer could be constructed at a very high density using special alignment methods described in at least FIG. 26A-D and FIG. 27A-F of U.S. Pat. No. 8,026,521. FIG. 9E illustrates the structure after Step (E).

Figure 9F:
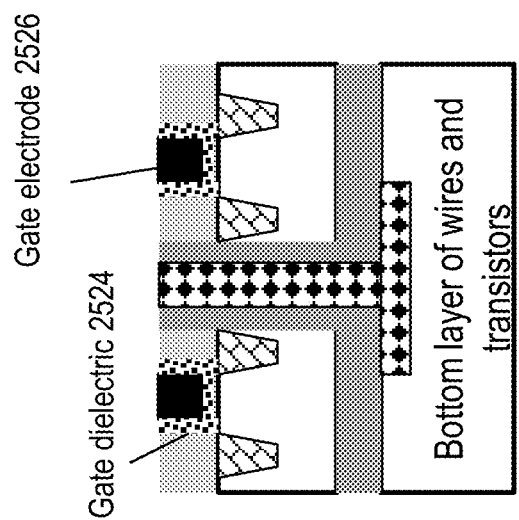

Step (F): Dummy gates 2502 are etched away, followed by the construction of a replacement with high k gate dielectrics 2524 and metal gates 2526. Essentially, partially-formed high performance transistors are layer transferred atop the base wafer (may also be called target wafer) followed by the completion of the transistor processing with a low (sub 400° C.) process. FIG. 9F illustrates the structure after Step (F). The remainder of the transistor, contact, and wiring layers are then constructed.

It will be obvious to someone skilled in the art that alternative versions of this flow are possible with various methods to attach temporary carriers and with various versions of the gate-last process flow.

Figure 10A:
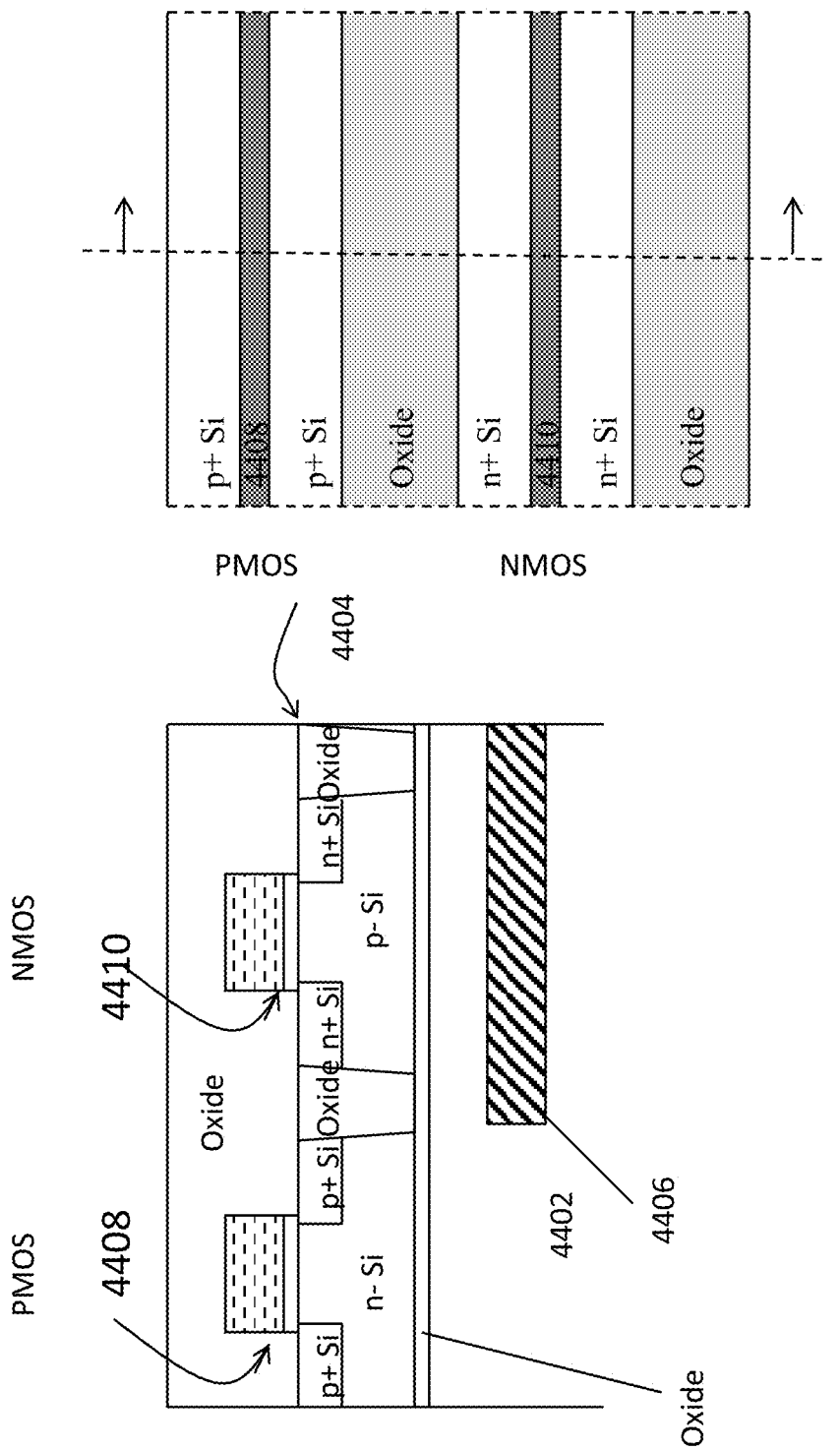
FIGS. 10A-10D depict a process flow for constructing 3D integrated chips and circuits with misalignment tolerance techniques and repeating pattern in one direction.

FIGS. 10A-10D (and FIG. 45A-D of U.S. Pat. No. 8,026,521) show an alternative procedure for forming CMOS circuits with a high density of connections between stacked layers. The process utilizes a repeating pattern in one direction for the top layer of transistors. The procedure may include several steps in the following sequence:

Step (A): Using procedures similar to FIG. 9A-F, a top layer of transistors 4404 is transferred atop a bottom layer of transistors and wires 4402. Landing pads 4406 are utilized on the bottom layer of transistors and wires 4402. Dummy gates 4408 and 4410 are utilized for nMOS and pMOS. The key difference between the structures shown in FIG. 9A-F and this structure is the layout of oxide isolation regions between transistors. FIG. 10A illustrates the structure after Step (A).

Figure 10B:
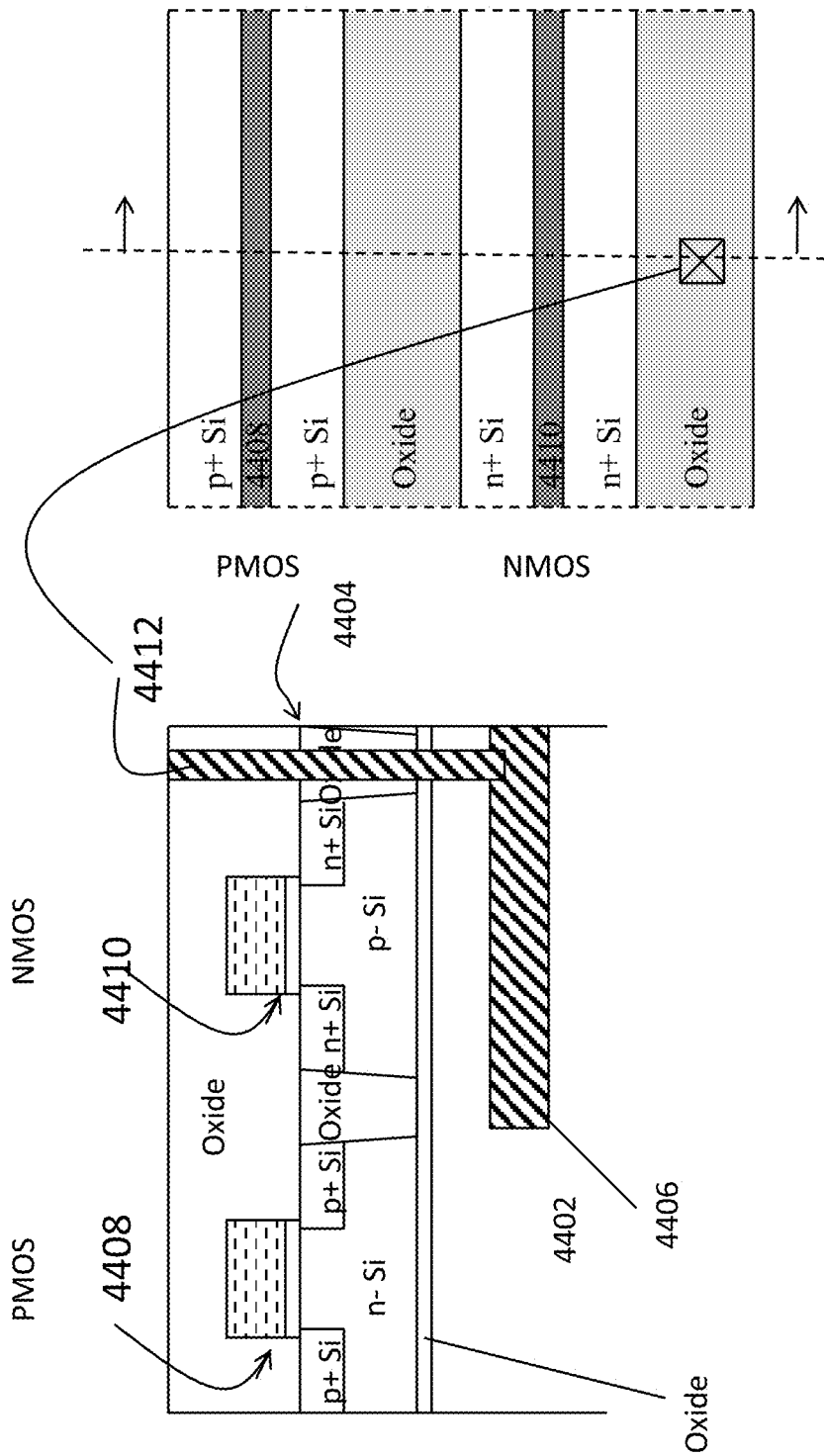

Step (B): Through-silicon connections 4412 are formed well-aligned to the bottom layer of transistors and wires 4402. Alignment schemes to be described in FIG. 45A-D of U.S. Pat. No. 8,026,521 are utilized for this purpose. All features constructed in future steps are also formed well-aligned to the bottom layer of transistors and wires 4402. FIG. 10B illustrates the structure after Step (B).

Figure 10C:
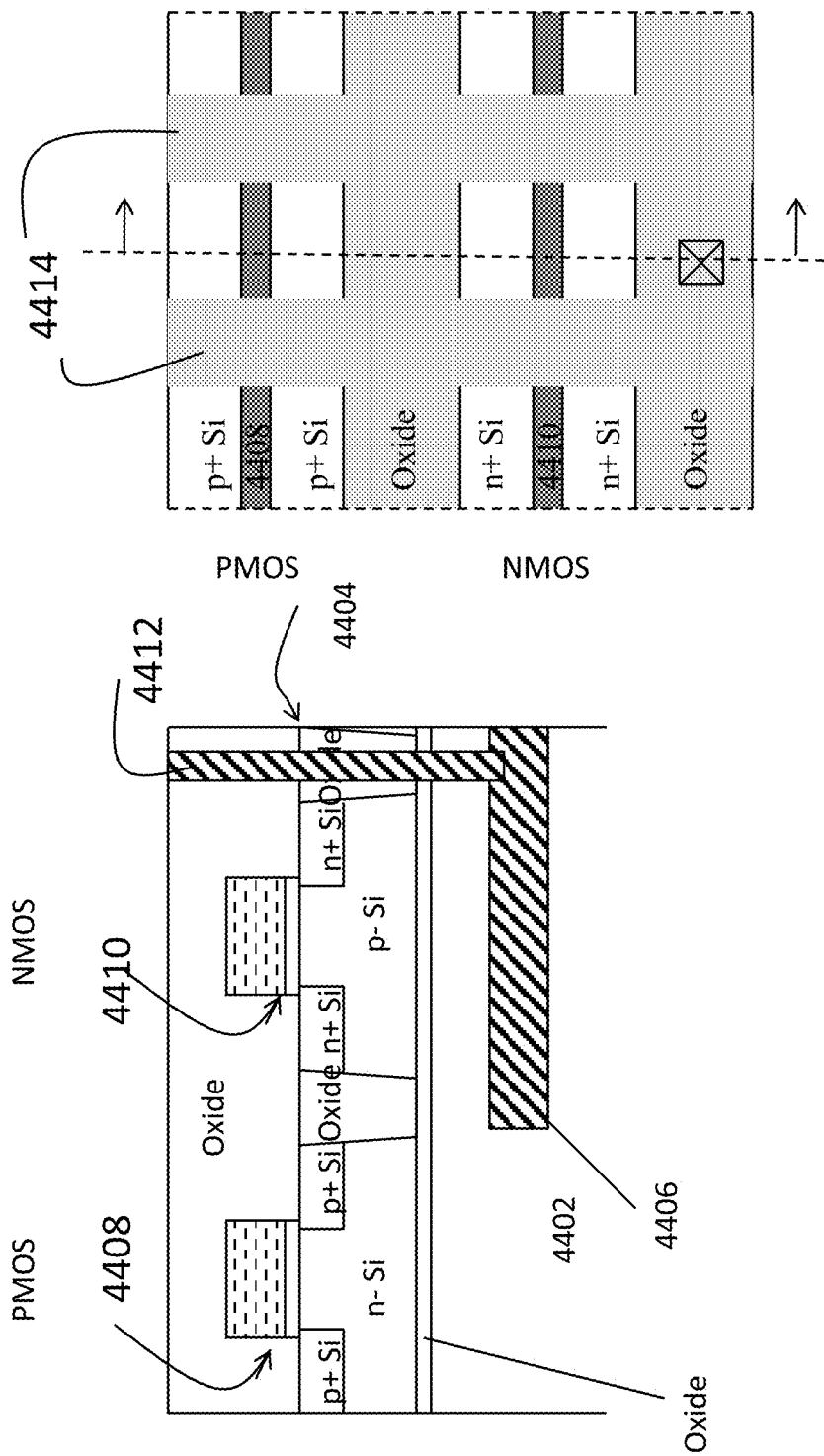

Step (C): Oxide isolation regions 4414 are formed between adjacent transistors to be defined. These isolation regions are formed by lithography and etch of gate and silicon regions and then fill with oxide. FIG. 10C illustrates the structure after Step (C).

Figure 10D:
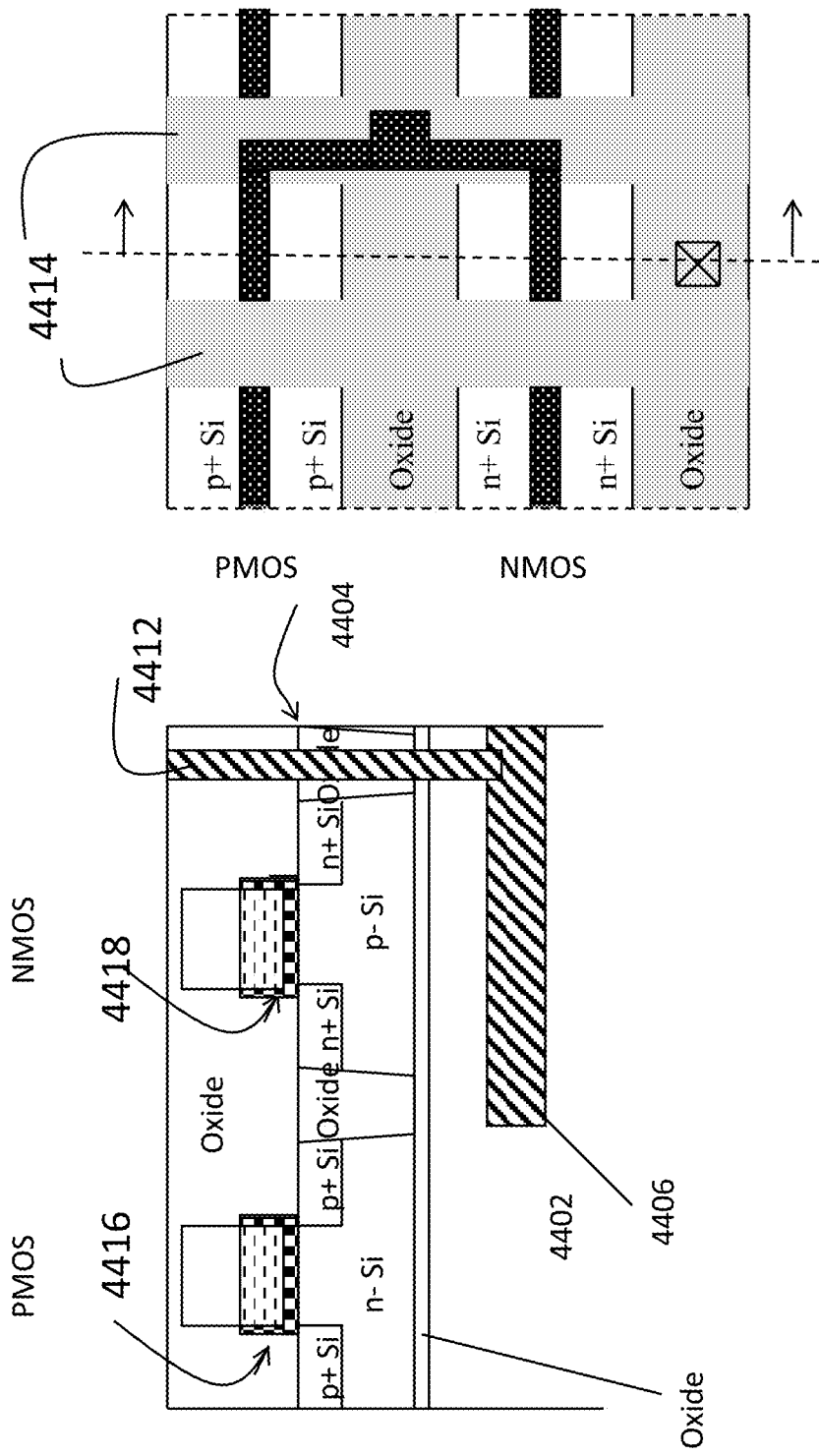

Step (D): The dummy gates 4408 and 4410 are etched away and replaced with replacement gates 4416 and 4418. These replacement gates are patterned and defined to form gate contacts as well. FIG. 10D illustrates the structure after Step (D). Following this, other process steps in the fabrication flow proceed as usual.

FIGS. 11A-11G illustrate using a carrier wafer for layer transfer. FIG. 11A illustrates the first step of preparing transistors with dummy gates 4602 on first donor wafer (or top wafer) 4606. This completes the first phase of transistor formation.

FIG. 11B illustrates forming a cleave line 4608 by implant 4616 of atomic particles such as H+. FIG. 11C illustrates permanently bonding the first donor wafer 4606 to a second donor wafer 4626. The permanent bonding may be oxide to oxide wafer bonding as described previously.

FIG. 11D illustrates the second donor wafer 4626 acting as a carrier wafer after cleaving the first donor wafer off potentially at face 4632; leaving a thin layer 4606 with the now buried dummy gate transistors 4602. FIG. 11E illustrates forming a second cleave line 4618 in the second donor wafer 4626 by implant 4646 of atomic species such as H+.

FIG. 11F illustrates the second layer transfer step to bring the dummy gate transistors 4602 ready to be permanently bonded on top of the bottom layer of transistors and wires 4601. For the simplicity of the explanation we left out the now obvious steps of surface layer preparation done for each of these bonding steps.

FIG. 11G illustrates the bottom layer of transistors and wires 4601 with the dummy gate transistor 4602 on top after cleaving off the second donor wafer and removing the layers on top of the dummy gate transistors. Now we can proceed and replace the dummy gates with the final gates, form the metal interconnection layers, and continue the 3D fabrication process.

Figure 12A:
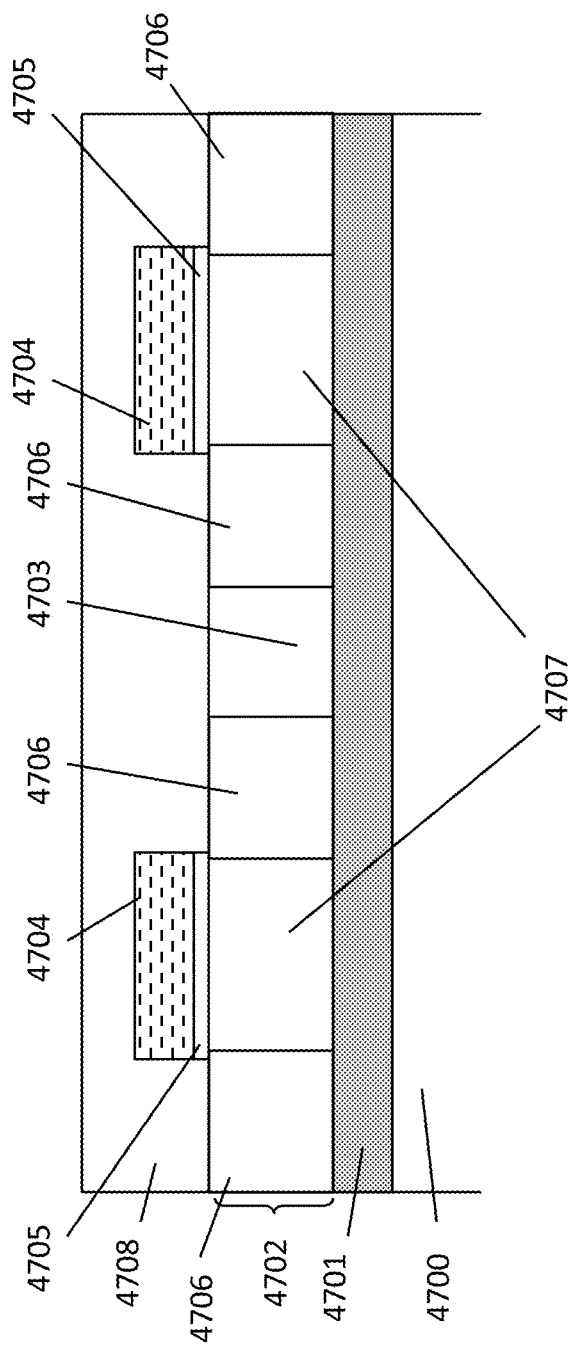

An interesting alternative is available when using the carrier wafer flow described in FIG. 11A-11G. In this flow we can use the two sides of the transferred layer to build NMOS on one side and PMOS on the other side. Timing properly the replacement gate step such flow could enable full performance transistors properly aligned to each other. As illustrated in FIG. 12A, an SOI (Silicon On Insulator) donor (or top) wafer 4700 may be processed in the normal state of the art high k metal gate gate-last manner with adjusted thermal cycles to compensate for later thermal processing up to the step prior to where CMP exposure of the polysilicon dummy gates 4704 takes place. FIG. 12A illustrates a cross section of the SOI donor wafer substrate 4700, the buried oxide (BOX) 4701, the thin silicon layer 4702 of the SOI wafer, the isolation 4703 between transistors, the polysilicon 4704 and gate oxide 4705 of n-type CMOS transistors with dummy gates, their associated source and drains 4706 for NMOS, NMOS transistor channel regions 4707, and the NMOS interlayer dielectric (ILD) 4708. Alternatively, the PMOS device may be constructed at this stage. This completes the first phase of transistor formation.

At this step, or alternatively just after a CMP of layer 4708 to expose the polysilicon dummy gates 4704 or to planarize the oxide layer 4708 and not expose the dummy gates 4704, an implant of an atomic species 4710, such as H+, is done to prepare the cleaving plane 4712 in the bulk of the donor substrate, as illustrated in FIG. 12B.

The SOI donor wafer 4700 is now permanently bonded to a carrier wafer 4720 that has been prepared with an oxide layer 4716 for oxide to oxide bonding to the donor wafer surface 4714 as illustrated in FIG. 12C. The details have been described previously. The donor wafer 4700 may then be cleaved at the cleaving plane 4712 and may be thinned by chemical mechanical polishing (CMP) and surface 4722 may be prepared for transistor formation. The donor wafer layer 4700 at surface 4722 may be processed in the normal state of the art gate last processing to form the PMOS transistors with dummy gates. During processing the wafer is flipped so that surface 4722 is on top, but for illustrative purposes this is not shown in the subsequent FIGS. 12E-12G.

Figure 12E:
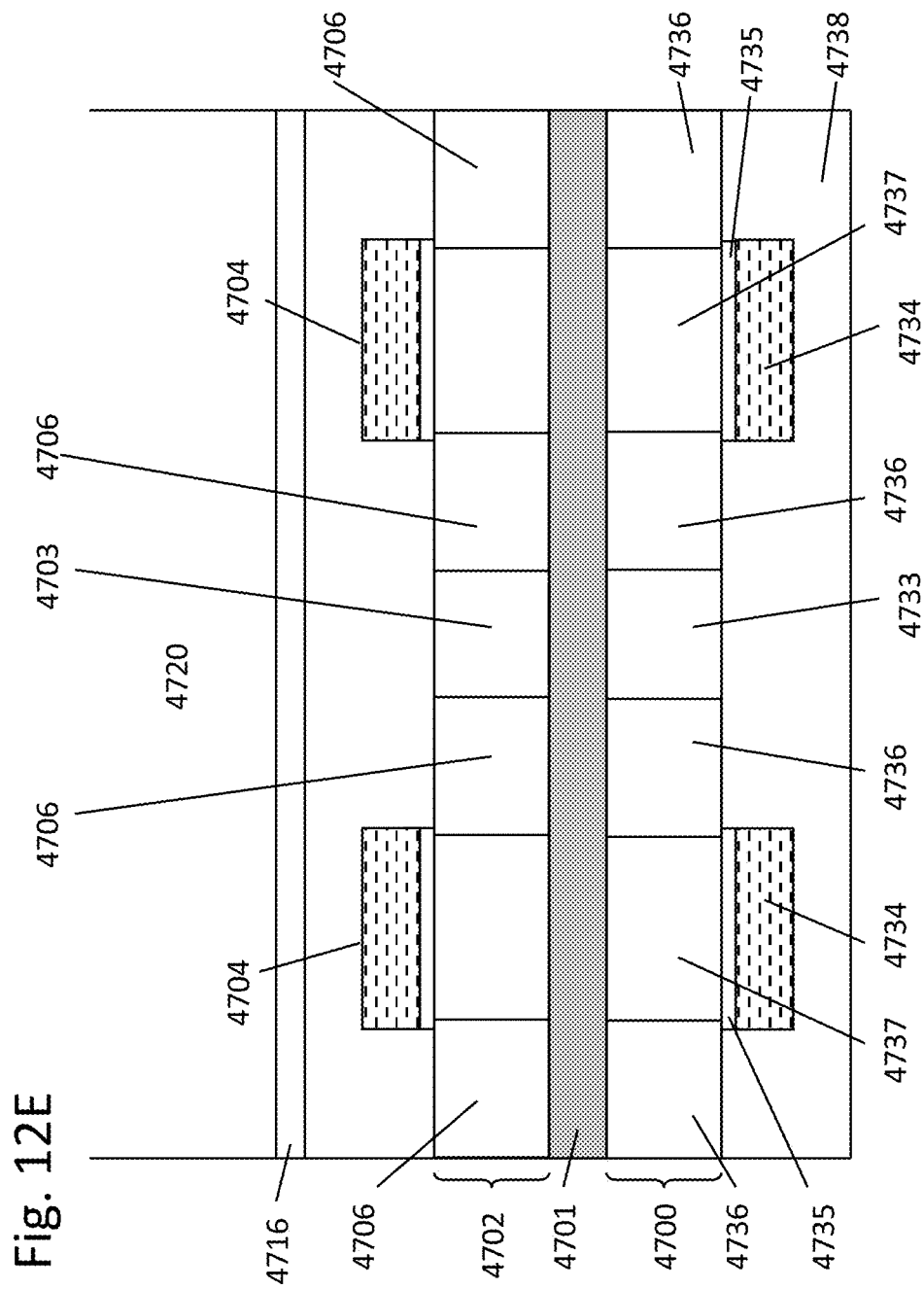

FIG. 12E illustrates the cross section with the buried oxide (BOX) 4701, the now thin silicon layer 4700 of the SOI substrate, the isolation 4733 between transistors, the polysilicon 4734 and gate oxide 4735 of p-type CMOS dummy gates, their associated source and drains 4736 for PMOS, PMOS transistor channel regions 4737 and the PMOS interlayer dielectric (ILD) 4738. The PMOS transistors may be precisely aligned at state of the art tolerances to the NMOS transistors due to the shared substrate 4700 possessing the same alignment marks. At this step, or alternatively just after a CMP of layer 4738 to expose the PMOS polysilicon dummy gates or to planarize the oxide layer 4738 and not expose the dummy gates, the wafer could be put into high temperature cycle to activate both the dopants in the NMOS and the PMOS source drain regions.

Then an implant of an atomic species 4740, such as H+, may prepare the cleaving plane 4721 in the bulk of the carrier wafer substrate 4720 for layer transfer suitability, as illustrated in FIG. 12F. The PMOS transistors are now ready for normal state of the art gate-last transistor formation completion.

Figure 12G:
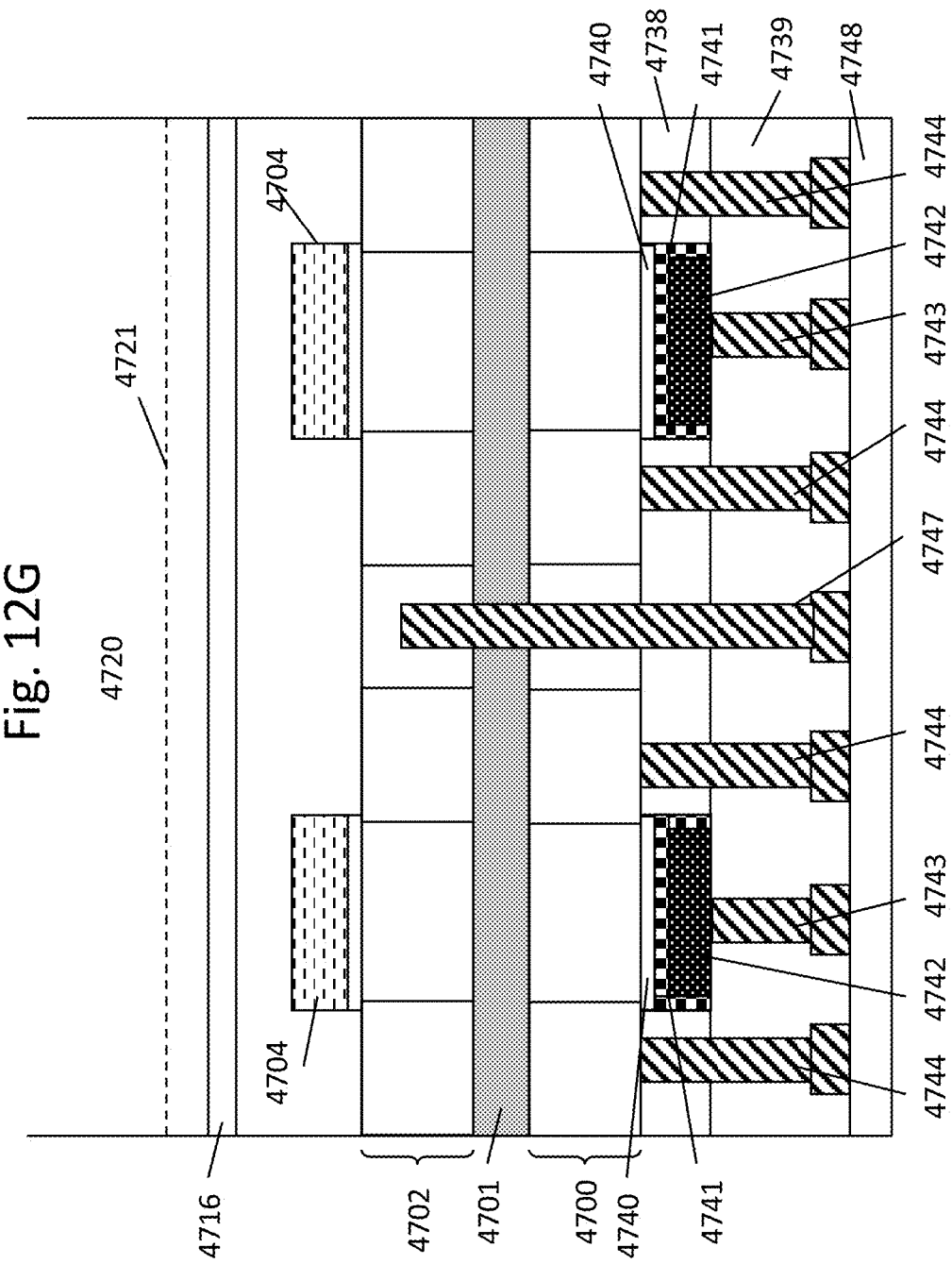

As illustrated in FIG. 12G, the inter layer dielectric 4738 may be chemical mechanically polished to expose the top of the polysilicon dummy gates 4734. The dummy polysilicon gates 4734 may then be removed by etch and the PMOS hi-k gate dielectric 4740 and the PMOS specific work function metal gate 4741 may be deposited. An aluminum fill 4742 may be performed on the PMOS gates and the metal CMP'ed. A dielectric layer 4739 may be deposited and the normal gate 4743 and source/drain 4744 contact formation and metallization.

The PMOS layer to NMOS layer via 4747 and metallization may be partially formed as illustrated in FIG. 12G and an oxide layer 4748 is deposited to prepare for bonding.

Figure 12H:
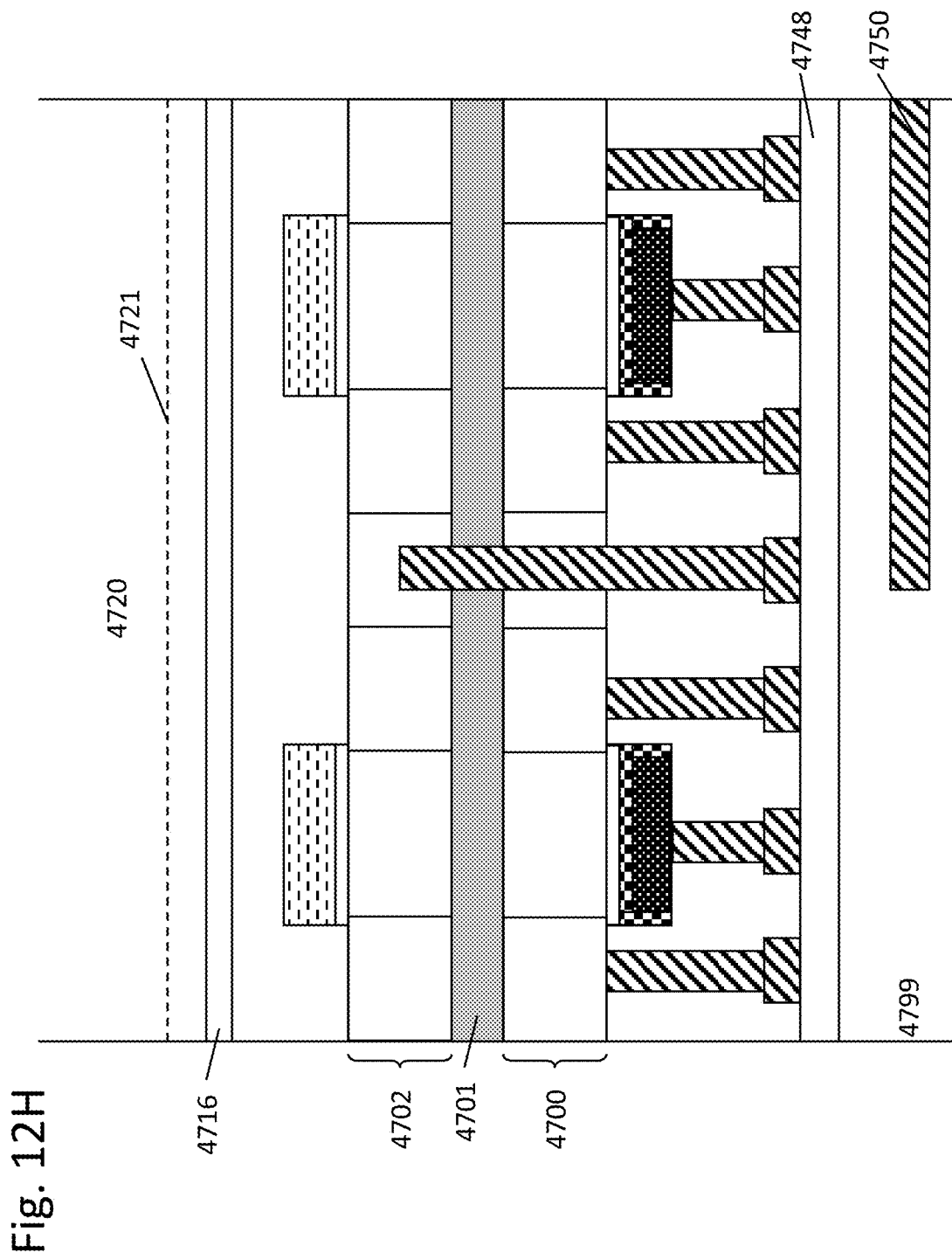

The carrier wafer and two sided n/p layer is then permanently bonded to bottom wafer having transistors and wires 4799 with associated metal landing strip 4750 as illustrated in FIG. 12H.

Figure 12I:
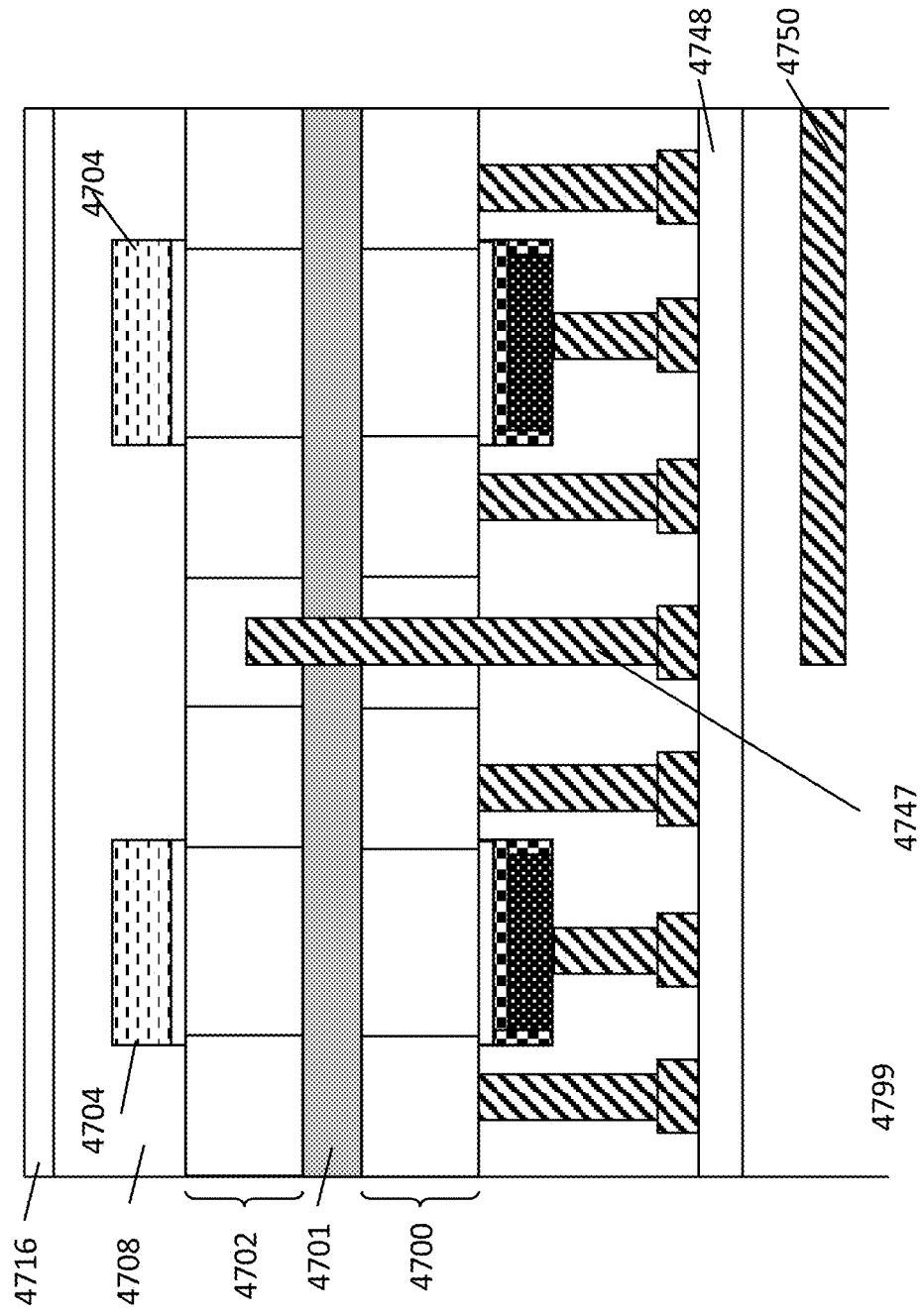

The carrier wafer 4720 may then be cleaved at the cleaving plane 4721 and may be thinned by chemical mechanical polishing (CMP) to oxide layer 4716 as illustrated in FIG. 12I.

Figure 12J:
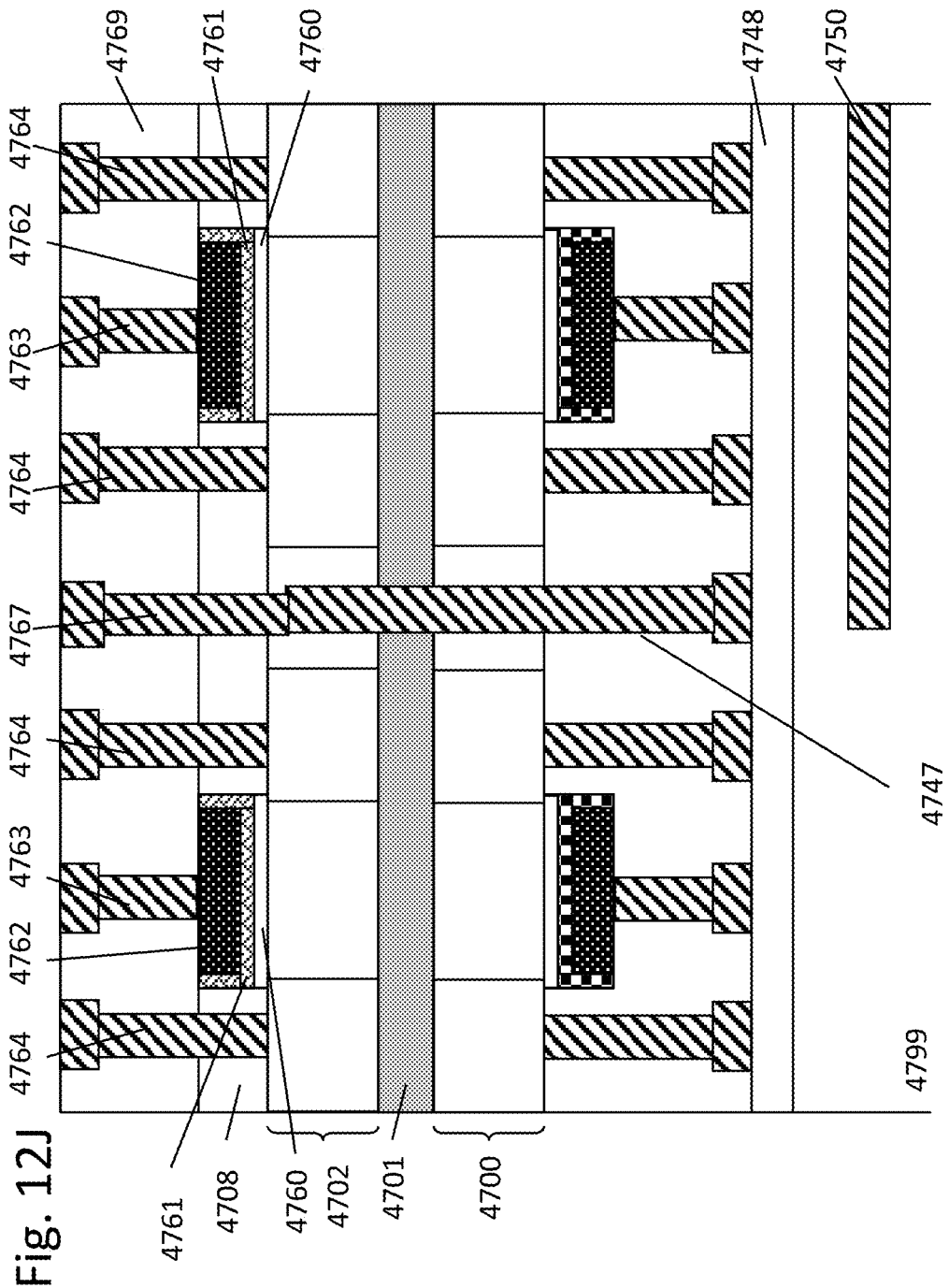

The NMOS transistors are now ready for normal state of the art gate-last transistor formation completion. As illustrated in FIG. 12J, the oxide layer 4716 and the NMOS inter layer dielectric 4708 may be chemical mechanically polished to expose the top of the NMOS polysilicon dummy gates 4704. The dummy polysilicon gates 4704 may then be removed by etch and the NMOS hi-k gate dielectric 4760 and the NMOS specific work function metal gate 4761 may be deposited. An aluminum fill 4762 may be performed on the NMOS gates and the metal CMP'ed. A dielectric layer 4769 may be deposited and the normal gate 4763 and source/drain 4764 contact formation and metallization. The NMOS layer to PMOS layer via 4767 to connect to 4747 and metallization may be formed.

Figure 12K:
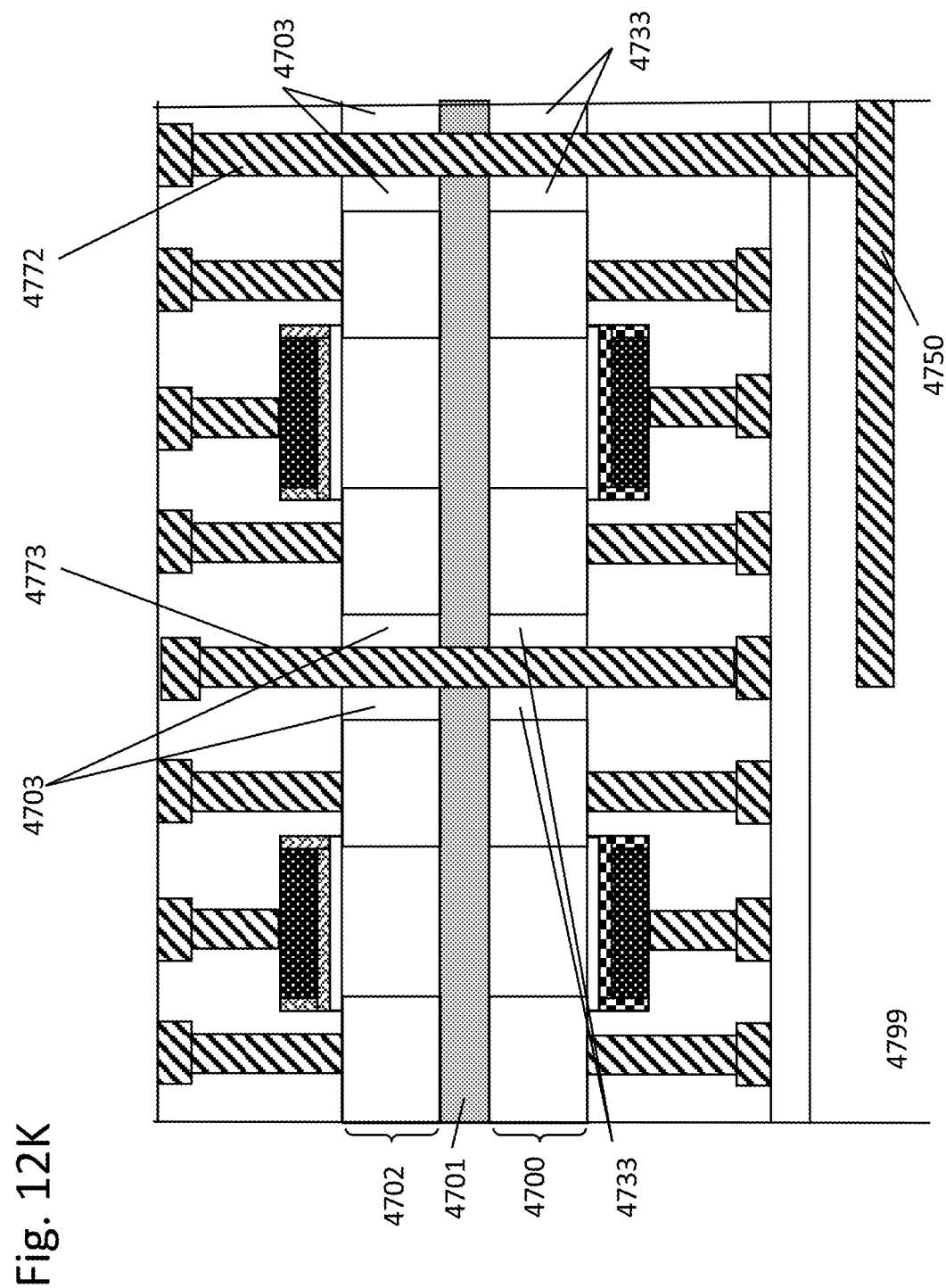

As illustrated in FIG. 12K, the layer-to-layer contacts 4772 to the landing pads in the base wafer are now made. This same contact etch could be used to make the connections 4773 between the NMOS and PMOS layer as well, instead of using the two step (4747 and 4767) method in FIG. 12H.

Figure 13:
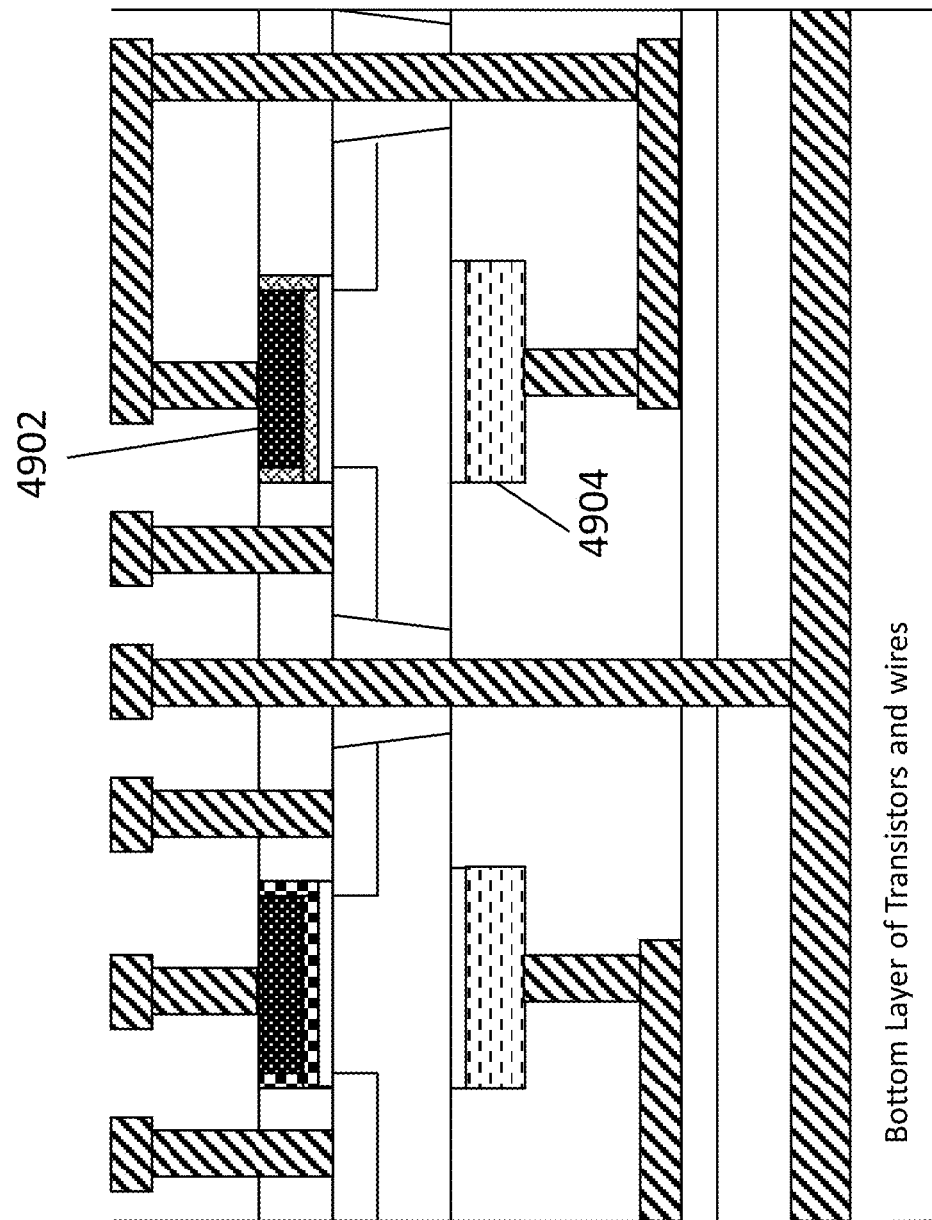
FIG. 13 illustrates constructing transistors with front gates and back gates on either side of the semiconductor layer.

Using procedures similar to FIG. 12A-K, it is possible to construct structures such as FIG. 13 where a transistor is constructed with front gate 4902 and back gate 4904. The back gate could be utilized for many purposes such as threshold voltage control, reduction of variability, increase of drive current and other purposes.

It will also be appreciated by persons of ordinary skill in the art that the invention is not limited to what has been particularly shown and described hereinabove. For example, drawings or illustrations may not show n or p wells for clarity in illustration. Further, combinations and sub-combinations of the various features described hereinabove may be utilized to form a 3D IC based system. Rather, the scope of the invention includes both combinations and sub-combinations of the various features described hereinabove as well as modifications and variations which would occur to such skilled persons upon reading the foregoing description. Thus the invention is to be limited only by the appended claims.

We claim:

1. A method for producing a 3D memory device, the method comprising:
   providing a first level comprising a single crystal layer;
   forming at least one second level above said first level;
   performing a first etch step comprising etching holes within said second level;
   forming at least one third level above said at least one second level;
   performing a second etch step comprising etching holes within said third level;
   performing additional processing steps to form a plurality of first memory cells within said second level and a plurality of second memory cells within said third level,
   wherein each of said first memory cells comprise one first transistor,
   wherein each of said second memory cells comprise one second transistor,
   wherein at least one of said first or second transistors has a channel, a source and a drain having a same doping type, wherein said first memory cells, said second memory cells, and said memory device comprise a NAND nonvolatile type memory, wherein said first etch step is directly followed by a deposition of tunneling dielectric and then a deposition comprising polysilicon, wherein said forming at least one third level comprises forming a window within said third level to allow lithography alignment through said third level to an alignment mark underneath, wherein said first level comprises memory peripheral circuits, and wherein at least one of said first memory cells is at least partially atop a portion of said memory peripheral circuits.

2. The method according to claim 1,
wherein said method of processing said memory peripheral circuits accounts for a temperature-time associated with processing said first transistors and said second transistors by adjusting an annealing of said first transistors accordingly.

3. The method according to claim 1,
wherein said third level comprises at least two overlying layers comprising different materials.

4. The method according to claim 1,
wherein said second level comprises at least two overlying layers comprising different materials.

5. The method according to claim 1, further comprising:
an etch step comprising formation of said first transistor and said second transistor,
wherein said second transistor is atop said first transistor.

6. The method according to claim 1,
wherein said deposition comprises use of Atomic Layer Deposition ("ALD").

7. The method according to claim 1,
wherein said first etch step comprises use of a Reactive Ion Etching ("RIE") process.

8. A method for producing a 3D memory device, the method comprising:
providing a first level comprising a single crystal layer;
forming at least one second level above said first level;
performing a first etch step comprising etching holes within said second level;
forming at least one third level above said at least one second level;
performing a second etch step comprising etching holes within said third level;
performing additional processing steps to form a plurality of first memory cells within said second level and a plurality of second memory cells within said third level,
wherein each of said first memory cells comprise one first transistor,
wherein each of said second memory cells comprise one second transistor,
wherein at least one of said first or second transistors has a channel, a source and a drain having a same doping type,
wherein said forming at least one third level comprises forming a window within said third level to allow lithography alignment through said third level to an alignment mark underneath, and
wherein said first memory cells, said second memory cells, and said memory device comprise a NAND nonvolatile type memory.

9. The method according to claim 8,
wherein said first level comprises memory peripheral circuits, and
wherein at least one of said first memory cells is at least partially atop a portion of said memory peripheral circuits.

10. The method according to claim 8,
wherein said third level comprises at least two overlying layers comprising different materials so one of said different materials could be selectively etched with respect to an other of said different materials.

11. The method according to claim 8,
wherein said second level comprises at least two overlying layers comprising different materials.

12. The method according to claim 8, further comprising:
an etch step comprising formation of said first transistor and said second transistor,
wherein said second transistor is atop said first transistor.

13. The method according to claim 8,
wherein said first etch step is directly followed by a deposition of tunneling dielectric and then a deposition comprising polysilicon.

14. The method according to claim 8,
wherein said first etch step comprises use of a Reactive Ion Etching (RIE) process.

15. A method for producing a 3D memory device, the method comprising:
providing a first level comprising a single crystal layer;
forming at least one second level above said first level;
performing a first etch step comprising etching holes within said second level;
forming at least one third level above said at least one second level;
performing a second etch step comprising etching holes within said third level;
performing additional processing steps to form a plurality of first memory cells within said second level and a plurality of second memory cells within said third level,
wherein each of said first memory cells comprise one first transistor,
wherein each of said second memory cells comprise one second transistor,
wherein at least one of said first or second transistors has a channel, a source and a drain having a same doping type, and
wherein said forming at least one third level comprises forming a window within said third level to allow lithography alignment through said third level to an alignment mark underneath.

16. The method according to claim 15,
wherein said first level comprises memory peripheral circuits, and
wherein at least one of said first memory cells is at least partially atop a portion of said memory peripheral circuits.

17. The method according to claim 15,
wherein said first etch step comprises use of a Reactive Ion Etching (RIE) process.

18. The method according to claim 15,
wherein said second level comprises at least two overlying layers comprising different materials so one of said different materials could be selectively etched with respect to an other of said different materials.

19. The method according to claim 15, further comprising:

an etch step comprising formation of said first transistor and said second transistor,
wherein said second transistor is atop said first transistor.

20. The method according to claim 15,
wherein said first etch step is directly followed by a deposition of tunneling dielectric and then a deposition comprising polysilicon.

* * * * *